United States Patent [19]
Onozawa

[11] Patent Number: 5,847,434
[45] Date of Patent: Dec. 8, 1998

[54] SEMICONDUCTOR INTEGRATED CIRCUIT DEVICE AND PROCESS FOR MANUFACTURING THE SAME

[75] Inventor: Kazunori Onozawa, Takasaki, Japan

[73] Assignee: Hitachi, Ltd., Tokyo, Japan

[21] Appl. No.: 642,699

[22] Filed: May 3, 1996

[30] Foreign Application Priority Data

May 25, 1995 [JP] Japan .................................. 7-126681
Jan. 12, 1996 [JP] Japan .................................. 8-003683

[51] Int. Cl.[6] ............................................. H01L 21/225
[52] U.S. Cl. .......................... 257/381; 257/385; 257/903
[58] Field of Search ........................... 257/67, 370, 379, 257/380, 381, 385, 903

[56] References Cited

U.S. PATENT DOCUMENTS

| | | | |
|---|---|---|---|
| 4,841,481 | 6/1989 | Ikeda et al. ............................. | 257/379 |
| 5,194,749 | 3/1993 | Meguro et al. .......................... | 257/69 |
| 5,321,650 | 6/1994 | Kikuchi et al. ......................... | 365/177 |
| 5,717,240 | 2/1998 | Kuriyama et al. ....................... | 257/370 |
| 5,731,232 | 3/1998 | Wuu et al. .............................. | 438/135 |

OTHER PUBLICATIONS

"A Split Wordline Cell For 16Mb SRAM Using Polysilicon Sidewall Contacts" by Kazuo Itabashi, et al, (1991) pp. 477–480.

"A Stacked Emitter Polysilicon (STEP) Bipolar Technology for 16 Mbit BiCMOS SRAMs" by Hisamitsu Suzuki, et al., vol. 34, (1993) pp. 57–62.

Primary Examiner—Donald Monin
Attorney, Agent, or Firm—Antonelli, Terry, Stout & Kraus, LLP

[57] ABSTRACT

A semiconductor integrated circuit device is provided which includes a memory cell M, in which a capacitance element C is added to the storage node portion of an inverter circuit composed of a drive MOSFET and a load TFT Qf. The device also includes and a bipolar transistor Tr provided as a peripheral element. A reference power supply line to be connected with the source region of the drive MOSFET Qd and an emitter electrode to be connected with the emitter region of the bipolar transistor Tr are formed of an uppermost thick polycrystal silicon film. Moreover, an intermediate thin polycrystal silicon film between the uppermost polycrystal silicon film and a first polycrystal silicon film (or polycide film) is covered in a memory cell forming region with the uppermost polycrystal silicon film. Still moreover, the uppermost polycrystal silicon film is partially silicified.

21 Claims, 45 Drawing Sheets

SEMICONDUCTOR INTEGRATED CIRCUIT DEVICE AND PROCESS FOR MANUFACTURING THE SAME

BACKGROUND OF THE INVENTION

The present invention relates to a semiconductor integrated circuit device and, more particularly, to a technique effective if applied to a semiconductor integrated circuit device in which an SRAM memory cell and a bipolar transistor are mounted on a common semiconductor substrate. Such an SRAM is described in U.S. Pat. No. 5,194,749 or on pp. 477 to 480 of Tech. Digest 1991 of IEDM (International Electron Device Meeting).

In the semiconductor integrated circuit device we are developing, the memory cell, the bipolar transistor, an n-channel MOSFET (Metal Oxide Semiconductor Field Effect Transistor) and a p-channel MOSFET are mounted on a common semiconductor substrate. The memory cell is constructed of an SRAM (Static Random Access Memory) for storing data of 1 [bit]. The bipolar transistor, the n-channel MOSFET and the p-channel MOSFET are used as the elements composing a peripheral circuit. In short, the semiconductor integrated circuit device being developed by us is constructed to have the Bi-CMOS (Bipolar-Complementary MOS)-SRAM structure.

The aforementioned bipolar transistor is constructed, for example, to have the npn type in which an n-type emitter region, a p-type base region and an n-type collector region are arrayed sequentially in the depthwise direction from the principal face of an epitaxial layer.

The aforementioned n-type collector region is formed of an intrinsic collector region, a heavily doped collector region and a collector contact region. The intrinsic collector region is formed of an n-type well region. The heavily doped collector region is formed of a buried n+-type semiconductor region which is formed between a semiconductor substrate and the n-type well region. The collector contact region is formed of an $n^+$-type semiconductor region which is formed in the principal face of the n-type well region.

The aforementioned p-type base region is formed of an intrinsic base region and a heavily doped base region. The intrinsic base region is formed of a p-type semiconductor region which is formed in the principal face of the n-type well region, and the heavily doped base region is formed of a $p^+$-type semiconductor region which is formed in the principal face of the n-type well region.

The aforementioned n-type emitter region is formed of an $n^+$-type semiconductor region which is formed in the principal face of the p-type semiconductor region. With this $n^+$-type semiconductor region, there is electrically connected an emitter electrode. This emitter electrode (of n-type) is formed of a second layer polycrystal silicon film.

The aforementioned n-channel MOSFET is formed in the principal face of a p-type well region. This n-channel MOSFET is constructed mainly of a channel forming region (or p-type well region), a gate insulating film, a gate electrode, a pair of $n^+$-type. semiconductor regions for the source region and the drain region, and a pair of n-type semiconductor regions.

The aforementioned p-channel MOSFET is formed in the principal face of the n-type well region. This p-channel MOSFET is constructed mainly of a channel forming region (or n-type well region), a gate insulating film, a gate electrode, a pair of $p^+$-type semiconductor regions for the source region and the drain region, and a pair of p-type semiconductor regions.

The individual gate electrodes of the aforementioned n-channel MOSFET and p-channel MOSFET are formed of a second layer polycrystal silicon film and a refractory metal film formed over the principal face of the former. The refractory metal film is formed of a tungsten silicide (WSix) film. The upper faces of these gate electrodes are covered with a cap insulating film (or silicon oxide film).

The aforementioned memory cell is constructed of a flip-flop circuit composed of two inverter circuits, and two transfer MOSFETs. Each of the inverter circuits is composed of a drive MOSFET and a load TFT (Thin Film Transistor).

One of the aforementioned transfer MOSFETs is arranged between one storage node portion (or input/output terminal) of the flip-flop circuit and one data line (or bit line) and is controlled in operation by a word line. On the other hand, the other transfer MOSFET is arranged between the other storage node portion (or input/output terminal) of the flip-flop circuit and the other data line (or bit line) and is controlled in operation by the word line. The gate electrodes of those two transfer MOSFETs are formed of a second layer polycrystal silicon film and a refractory metal film formed over the principal face of the former.

The two drive MOSFETs are individually constructed in the principal face of the p-type well region. Each of these two drive MOSFETs is formed mainly of a channel forming region (or p-type well region), a gate insulating film, a gate electrode, and a pair of n-type semiconductor regions for the source region and the drain region. The individual gate electrodes of the two drive MOSFETs are formed in the first layer polycrystal silicon film prior to the individual gate electrodes of the n-channel MOSFET and p-channel MOSFET constructing the peripheral circuit, and the transfer MOSFET of the memory cell.

The individual gate electrodes of the aforementioned two load TFTs are formed of a third layer polycrystal silicon film. Moreover, the individual channel forming regions, source regions and drain regions of the two load TFTs are formed of a fourth layer polycrystal silicon film. Still moreover, the individual gate insulating films of the two load TFTs are formed of an inter-layer insulating film which is formed between the third layer polycrystal silicon film and the fourth layer polycrystal silicon film. This inter-layer insulating film is formed of a silicon oxide film, for example.

With the individual source regions of the aforementioned two drive MOSFETs, there is electrically connected a reference power supply line (or ground plate) which is fixed at a reference potential (e.g., 0 [V]) Vss. With the individual source regions of the aforementioned two load TFTs, there are electrically connected an operating power supply line which is fixed at an operating potential (e.g., 3.3 [V]) Vcc. This reference power supply line is formed of the second layer polycrystal silicon film, and the operating power supply line is formed of the fourth layer polycrystal silicon film.

In the flip-flop circuit of the aforementioned memory cell, a capacity element is added to each of the storage nodes of the two inverter circuits. The capacity element is constructed to have the stacked structure in which a lower electrode, a dielectric film and an upper electrode are sequentially stacked. The lower electrode is formed of the second layer polycrystal silicon film and also acts as the reference power supply line. The upper electrode is formed of the third layer polycrystal silicon film and also acts as the gate electrode of the load TFT. The dielectric film is formed of an inter-layer insulating film which is formed between the second layer polycrystal silicon film and the third layer polycrystal silicon film. This inter-layer insulating film is formed of a silicon oxide film, for example.

For the semiconductor integrated circuit device thus constructed, it is important to select the emitter electrode (of n-type), as connected with the emitter region (of n-type) of the bipolar transistor, and to set the film thickness of the emitter electrode. The base current (IB) of the bipolar transistor is determined by the density gradient of the positive holes in the emitter region, as injected from the base region (of p-type). Since the diffusion length of the positive holes in the emitter region is about 0.1 [μm], in order to establish the base current stably, the total emitter depth of the depth of the emitter region (or heavily doped n$^+$-type semiconductor region) and the film thickness of the emitter electrode has to be about two times (about 0.2 [μm]) or more than the diffusion length of the positive holes. Specifically, by setting the total emitter depth about two times or more than the diffusion length of the positive holes in the emitter region, the base current (IB) can be reduced to increase the emitter ground current gain ($h_{FE}=I_C/I_B$).

Incidentally, the semiconductor integrated circuit device including the SRAM memory cell, the bipolar transistor, the n-channel MOSFET and the p-channel MOSFET is described on pp. 57 to 62, NEC Res. & Develop., Vol. 34, No. 1, 1993.

SUMMARY OF THE INVENTION

We have made the following investigations upon the aforementioned semiconductor integrated circuit device of the 0.4 [μm] generation or later.

In the device of the 0.4 [μm] generation, because the emitter region has a depth of about 0.05 [μm], the film thickness of the emitter electrode, i.e., the thickness of the second layer polycrystal silicon film has to be about 0.15 [μm]. The film thickness of the emitter electrode will disperse due to the dispersion of the thickness of the polycrystal silicon film itself and the overetching at the time when connection holes are to be formed in the overlying inter-layer insulating film. As a result, the density gradient of the positive holes in the emitter region increases or disperses, if the polycrystal silicon film is set to a thickness of 0.15 [μm] or less, so that the characteristics of the bipolar transistor become unstable.

The gate electrode of the bulk MOSFET such as the aforementioned n-channel MOSFET, p-channel MOSFET, drive MOSFET or transfer MOSFET is constructed to have the stacked structure of a first layer polycrystal silicon film, which is doped with an n-type impurity so as to adjust a flat band voltage Vfb, and a tungsten silicide film which is given a lower specific resistance so as to reduce the delay of a word line, and the upper face of the stacked structure is covered with a cap insulating film. The first layer polycrystal silicon film is set to a thickness of about 80 [nm]; the tungsten silicide film is set to a thickness of about 80 [nm]; and the cap insulating film is set to a thickness of about 80 [nm]. The cap insulating film has to be set to such a thickness that arsenic (As) ions may not migrate into the tungsten silicide film of the gate electrode, when the source region and the drain region of an n-channel conduction type bulk MOSFET are to be formed. Because the arsenic ions have a large molecular weight, the tungsten silicide crystals are made amorphous when the arsenic ions are injected into the tungsten silicide film. At a subsequent heat treatment, an internal stress is established in the tungsten silicide film to cause disadvantages that the tungsten silicide film peels or disappears.

The third layer polycrystal silicon film to be used as the gate electrode of the aforementioned load TFT is set to a thickness of about 50 [nm], and the fourth layer polycrystal silicon film to be used as the channel forming region of the aforementioned load TFT and the operating power supply line is set to a thickness of about 40 [nm].

We have found out the following problems in the semiconductor integrated circuit device described above.

The first problem is that the polycrystal silicon film of the memory cell is extremely hard to work so that the production yield in the manufacture process drops.

When the total film thickness of the gate electrode of the bulk MOSFET and the cap insulating film covering the upper face of the former is set to 240 [nm] whereas the film thickness of the second layer polycrystal silicon film is set to 150 [nm], and when the second layer polycrystal silicon film is patterned by the anisotropic dry etching method, an overetching of at least 160 [%] is required. If the etching ratio of Si/SiO$_2$ at this time is set to 10, the inter-layer insulating film (or silicon oxide film) underlying the second layer polycrystal silicon film is over-etched by 24 [nm]. As a result, there exists at the substrate of the third layer polycrystal silicon film a total step of 414 [nm] of the total film thickness of 240 [nm] of the gate electrode of the bulk MOSFET and the cap insulating film covering the upper face of the former, the thickness of 150 [nm] of the second layer polycrystal silicon film, and the peel of 24 [nm] of the inter-layer insulating film. As a result, an overetching of at least 830 [%] is required when the third polycrystal silicon film is set to a thickness of 50 [nm] and patterned by the anisotropic dry etching method. Because of the underlying step of eight times or more than the film thickness, moreover, the etching in the side faces of the underlying step advances even after the etching corresponding to the film thickness has ended (i.e., at the end of the just etching) so that the change in the etching waveform is ambiguous. As a result, the in-line monitor of the just etching is unstable while the third layer polycrystal silicon film is being worked.

This situation becomes far more serious at the time of working the fourth layer polycrystal silicon film. First of all, the underlying inter-layer insulating film is scraped by 41 [nm] when the third layer polycrystal silicon film is over-etched by 830 [%]. As a result, at the time of working the fourth layer polycrystal silicon film, there exists a step of 505 [nm] of the thickness of 50 [nm] of the third layer polycrystal silicon film and the scrape of 41 [nm] of the inter-layer insulating film by the overetching of the third layer polycrystal silicon film. Because the fourth layer polycrystal silicon film has a thickness of 40 [nm], an overetching of at least 1,280 [%] is required for working the substrate of 510 [nm]. Because of the present of the underlying step of about twelve times or more than the film thickness, moreover, the in-line monitor of the just etching becomes far more unstable than that for working the third layer polycrystal silicon film, when the fourth layer polycrystal silicon film is worked.

Thus, at the time of working the polycrystal silicon film on the memory cell, an overetching of 800 [%] or more is required for the film to be etched, and the in-line monitor of the just etching is unstable so that the stable mass production process conditions cannot be found out.

In the case of the CMOS-SRAM, the second layer polycrystal silicon film is not used for the emitter electrode but is replaced by a tungsten silicide film having a thickness of about 50 [nm] so that the step of the memory cell may be lowered to reduce the load upon the working process.

The second problem is that it is impossible to obtain a load TFT and a capacity element of high performances.

The performance of the load TFT can be enhanced by thinning the inter-layer insulating film or the gate insulating film. On the other hand, the performance of the capacity element can be enhanced by thinning the inter-layer insulating film or the dielectric film. The lower limit of the film thickness is restricted by the supply voltage and the quality of the inter-layer insulating film, as used. The inter-layer insulating film can be made as thin as about 15 [nm] if the supply voltage is at 3.3 [V] and if the inter-layer insulating film is not damaged by the dry etching treatment or the like.

When the thickness of the inter-layer insulating film is to be actually set, however, this setting has to add the peel resulting from the dry etching. The inter-layer insulating film such as the dielectric film of the capacity element has to be set to a thickness of 56 [nm] or more by considering the peel of 41 [nm] resulting from the overetching of the third layer polycrystal silicon film. Likewise, the inter-layer insulating film or the gate insulating film of the load TFT has to be set to a thickness of 67 [nm] or more by considering the peel of 52 [nm] resulting from the overetching of the fourth layer polycrystal silicon film (that is, the overetching of 1,300 [%] of the fourth layer polycrystal silicon film having a thickness of 40 [nm] at a selection ratio of 10). Thus, the actual thickness of the inter-layer insulating film has to be set about three times as large as the film thickness to be controlled by the intrinsic film quality of the inter-layer insulating film, so that the load TFT and the capacity element of high performances cannot be obtained.

In the case of the CMOS-SRAM, the second layer polycrystal silicon film is replaced by a tungsten silicide film having a thickness of about 50 [nm] to lower the step of the memory cell thereby to reduce the overetching of the third layer polycrystal silicon film or the fourth layer polycrystal silicon film, so that the inter-layer insulating film or the gate insulating film of the load TFT or the inter-layer insulating film for the dielectric film of the capacity element may be accordingly thinned to enhance the performances of the load TFT and the capacity element.

The third problem is that the reference potential (or ground potential) to be taken is so insufficient as to make the writing operation and reading operation of the memory cell unstable.

When the emitter electrode of a bipolar transistor and the reference power supply line of a memory cell are to be formed of the second layer polycrystal silicon film having a thickness of about 150 [nm], for example, it is seriously difficult to work the memory cell, as described above, so that the reference power supply line can be neither thickened nor stacked with the tungsten silicide film. In order to eliminate this difficulty, there is a method by which a metal line, as fixed at the reference potential, is provided and connected for each cell with the reference power supply line through connection holes. This method makes it necessary to lay out the pattern to be formed by the third layer polycrystal silicon film and the pattern to be formed by the fourth layer polycrystal silicon film such that the patterns may be kept out of the connection holes. This impractically enlarges the area to be occupied by the memory cell. As compared with the CMOS-SRAM memory cell capable of the tungsten silicide film as the reference power supply line, therefore, the parasitic resistance of the reference power supply line is increased to raise the lower potential node at the writing or reading time of the memory cell.

Generally speaking the main memory of a computer or a work station is not accessed to at a high rate but is additionally given an error correcting function so that it can be exemplified by a slow CMOS-SRAM having a soft error rate of about 1,000 [fit]. On the other hand, the cache memory of the computer or the work station is accessed to at a high rate but is not given the error correcting function so that it can require a fast memory cell having a soft error rate of about 100 [fit]. When this memory cell is used, the supply voltage using the storage capacity as a parameter and the soft error rate have a correlation, as shown in FIG. 55 (presenting a correlation between the voltage and the soft error rate). In FIG. 55, curve A corresponds to the case in which the node capacity is at 10 fF whereas curve B corresponds to the case in which the node capacity is at 5.8 fF. A cache memory of a supply voltage of 3.3 [V] requires a storage capacity of 10 [fF/node] for the soft error rate of 100 [fit]. A memory cell having a cell size of 13 [$\mu m^2$] according to the working rule of 0.4 [$\mu m$], for example, requires a capacity element of 6 [fF/node] because the storage capacity excepting the capacity element is at about 4 [fF/node].

Since nothing other than at most 3 [$\mu m^2$/node] can be retained as the area of the capacity element according to the working rule of 0.4 [$\mu m$] and under the restriction of the cell size of 13 [$\mu m^2$], the thickness of the dielectric film of the capacity element, i.e., the inter-layer insulating film has to be set to no more than 17 [nm] in the conversion of a silicon oxide film ($SiO_2$) so that the capacity element of 6 [fF/node] may be achieved. However, the Bi-CMOS ·SRAM cannot be used as the cache memory because the thickness of the dielectric film (or inter-layer insulating film) of the capacity element cannot be set to 55 [$\mu m$] or less in the conversion of the silicon oxide film.

An object of the present invention is to provide a technique capable of the working margin of a memory cell, in which a capacity element is added to the storage node portion of an inverter circuit composed of a drive MISFET and a load TFT, in a semiconductor integrated circuit device which includes the memory cell and a bipolar transistor.

Another object of the present invention is to provide a technique capable of enhancing the performances of the load TFT and the capacity element, as mounted on the semiconductor integrated circuit device.

Still another object of the present invention is to provide a technique capable of stabilizing the writing operation and the reading operation of the memory cell to be mounted on the semiconductor integrated circuit device.

The foregoing and other objects and novel features of the present invention will become apparent from the following description to be made with reference to the accompanying drawings.

A representative of the invention to be disclosed herein will be briefly summarized in the following.

(1) In a semiconductor integrated circuit device including a memory cell, in which a capacity element is added to the storage node of an inverter circuit composed of a drive MISFET and a load TFT, and a bipolar transistor, both a reference power supply line to be connected with the source region of the drive MISFET and an emitter electrode to be connected with the emitter region of the bipolar transistor are formed of an uppermost polycrystal silicon film.

(2) The thickness of an intermediate polycrystal silicon film between the uppermost polycrystal silicon film and a first layer polycrystal silicon film is set to one half or less than that of the uppermost polycrystal silicon film.

(3) The intermediate polycrystal silicon film is covered in a memory cell forming region with the uppermost polycrystal silicon film.

(4) The reference power supply line is backed for each memory cell with a metal line which is formed thereover.

(5) The capacity element is constructed to have a structure in which the uppermost polycrystal silicon film is used as an upper electrode, in which the first layer polycrystal silicon film from the uppermost one is used as a lower electrode and in which the inter-layer insulating film between the uppermost polycrystal silicon film and the first polycrystal silicon film from the uppermost one is used as a dielectric film, and the upper electrode of the capacity element is also used as the reference power supply line.

(6) The load TFT is constructed to have a structure in which the first layer polycrystal silicon film from the uppermost one is used as a gate electrode, in which a second layer polycrystal silicon film from the uppermost one is used as a channel forming region, a source region and a drain region, and in which the inter-layer insulating films between those polycrystal silicon films are used as gate insulating films, and the gate electrode of the load TFT is also used as the lower electrode of the capacity element.

(7) The total emitter depth of the depth of the emitter region formed in the semiconductor substrate and the film thickness of the emitter electrode formed of the uppermost polycrystal silicon film is set to about two times (about 0.2 [$\mu$m]) or more than the diffusion length of positive holes in the emitter region or the emitter electrode. In short, the total emitter depth is set to about two times or more than the diffusion length of the minority carriers in the emitter region or the emitter electrode.

(8) The surface of the reference power supply line is selectively silicified, but the emitter electrode is not silicified.

Since the channel forming region of the load TFT and the second layer polycrystal silicon film to be used as an operating power supply line need not be thickened according to the means described above, the underlying step of the first layer polycrystal silicon film from the uppermost one can be drastically lowered to reduce the overetching at the time of working the first layer polycrystal silicon film. As a result, an inter-layer insulating film between the first layer polycrystal silicon film and the second layer polycrystal silicon film can be thinned to enhance the performance of the load TFT using the inter-layer insulating film as its gate insulating film.

Moreover, since the intermediate polycrystal silicon film is covered with the uppermost polycrystal silicon film, the inter-layer insulating film between the uppermost polycrystal silicon film and the first layer polycrystal silicon film is not peeled by the overetching for working the uppermost polycrystal silicon film. As a result, the inter-layer insulating film between the uppermost polycrystal silicon film and the first layer polycrystal silicon film can be thinned to enhance the performance of the capacity element using the inter-layer insulating film as its dielectric film.

Still moreover, the underlying step of the portion to be etched of the uppermost polycrystal silicon film can be stably worked because of the presence of only the step by the gate electrode of a bulk MOSFET such as the drive MOSFET and the step by the field insulating film, so that the working margin of the memory cell can be retained.

Furthermore, the reference power supply line is formed of the uppermost polycrystal silicon film so that the connection holes for connecting the reference power supply line and the overlying metal line can be arranged in arbitrary positions independently of the arrangement of the polysilicon pattern of the intermediate polycrystal silicon film or the active region pattern. As a result, the ground parasitic resistance of the memory cell can be reduced without any increase in the area to be occupied by the memory cell, to stabilize the writing operation and the reading operation of the memory cell. Moreover, the emitter ground current gain ($h_{FE}$) of the bipolar transistor can be improved to improve the performance of the bipolar transistor. In addition, the wiring resistance of the reference power supply line can be reduced to raise the operating rate of the memory cell.

DESCRIPTION OF THE PREFERRED EMBODIMENTS

Figure 1:
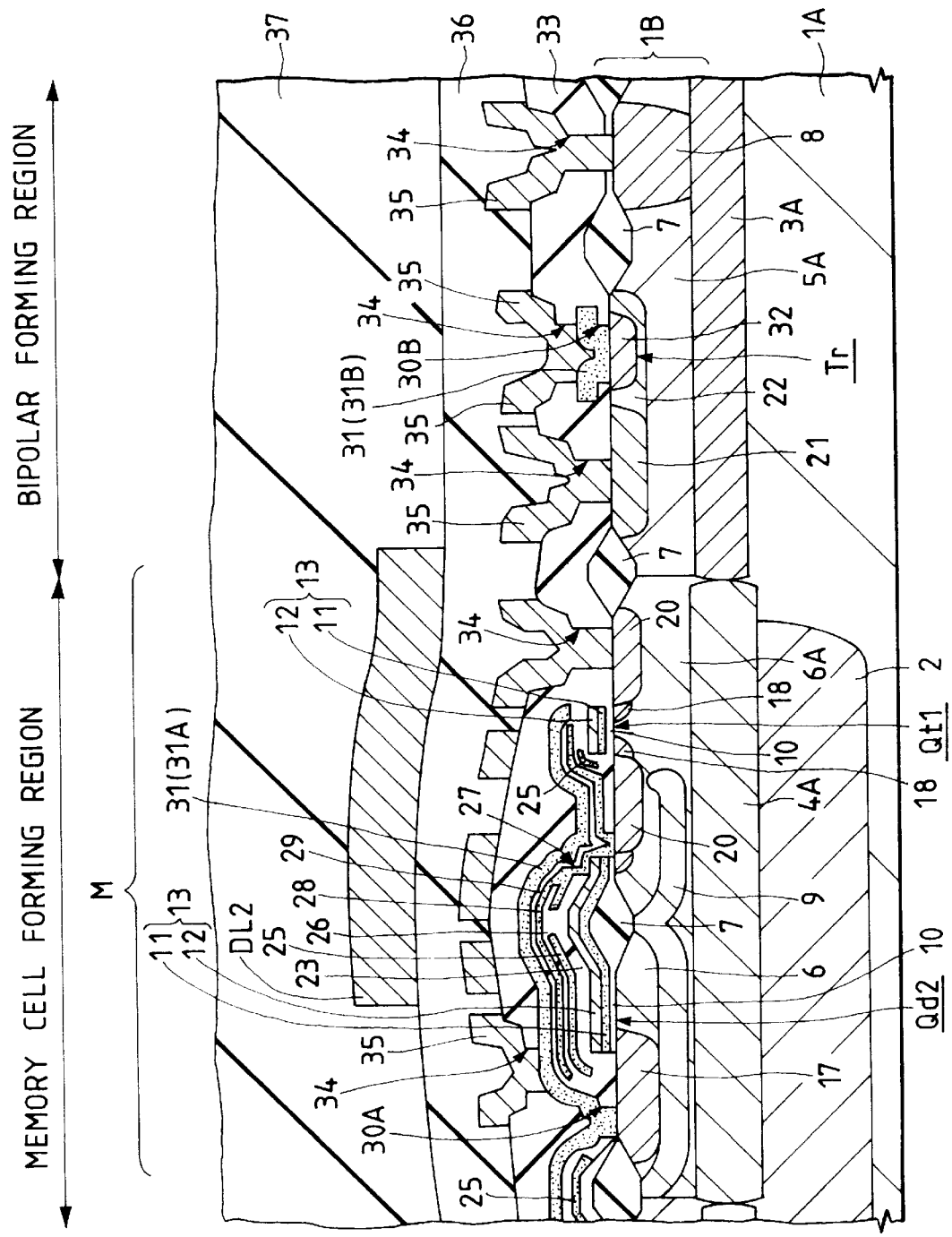
FIG. 1 is a section showing an essential portion of a semiconductor integrated circuit device according to Embodiment 1 of the present invention.

The construction of the present invention will be described in connection with its modes of embodiment, in which the present invention is applied to a semiconductor integrated circuit device.

Incidentally, throughout the drawings for describing the embodiments, the portions or parts having identical functions will not be repeatedly described by designating them by identical reference characters.

[Embodiment 1]

Figure 2:
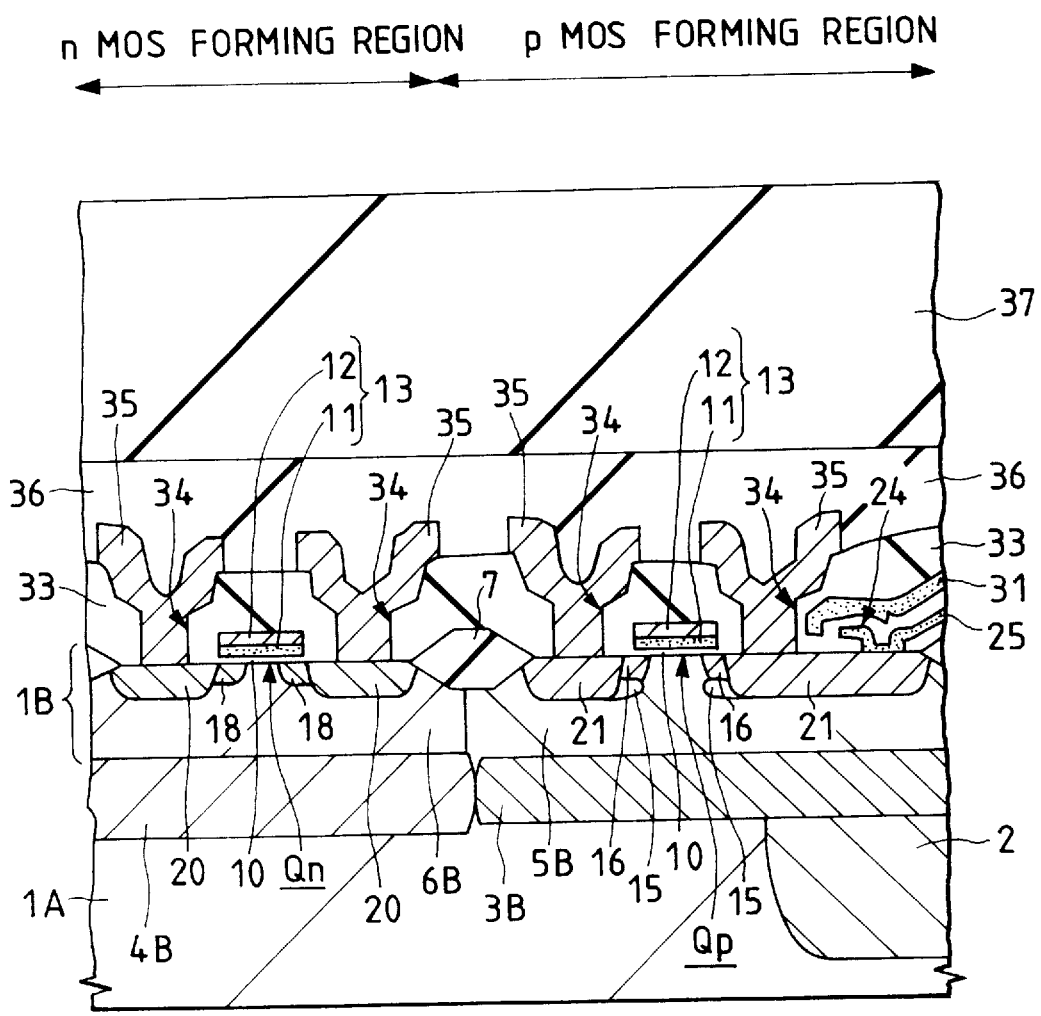
FIG. 2 is a section showing an essential portion of the semiconductor integrated circuit device.

A schematic construction of the semiconductor integrated circuit device according to Embodiment of the present invention is shown in FIG. 1 (presenting an essential portion in section) and FIG. 2 (presenting an essential portion in section).

As shown in FIGS. 1 and 2, the semiconductor integrated circuit device is constructed mainly of a $p^-$-type semiconductor substrate 1A and an epitaxial layer 1B formed over the principal face of the former, for example. In a memory cell forming region of this $p^-$-type semiconductor substrate 1A, a p-type well region 6A is formed in the principal face of the epitaxial layer 1B. In a bipolar forming region of the $p^-$-type semiconductor substrate 1A, on the other hand, an n-type well region 6A is formed in the principal face of the epitaxial layer 1B. In an nMOS forming region of the $p^-$-type semiconductor substrate 1A, on the other hand, a p-type well region 6B is formed in the principal face of the epitaxial layer 1B. In a pMOS forming region of the $p^-$-type semiconductor substrate 1A, on the other hand, an n-type well region 5B is formed in the principal face of the epitaxial layer 1B. A p-type semiconductor substrate (i.e., Burred-p) 9 is formed in the aforementioned p-type well region 6A.

A shallow buried p-type semiconductor region 4A is formed between the p-type well region 6A and the $p^-$-type semiconductor substrate 1A, and a deep buried n-type semiconductor region 2 is formed in the principal face of the $p^-$-type semiconductor substrate 1A below that shallow buried p-type semiconductor region 4A. A shallow buried $n^+$-type semiconductor region 3A is formed between the n-type well region 5A and the p-type semiconductor substrate 1A. A shallow buried p-type semiconductor region 4B is formed between the p-type well region 6B and the $p^-$-type semiconductor substrate 1A. A shallow buried $n^+$-type semiconductor substrate 3B is formed between the n-type well region 5B and the $p^-$-type semiconductor substrate 1.

In the $p^-$-type semiconductor substrate 1A: a memory cell M is mounted on a memory cell forming region; a bipolar transistor Tr is mounted on a bipolar forming region; an n-channel MOSFET Qn is mounted on an nMOS forming region; and a p-channel MOSFET Qp is mounted on a pMOS forming region. The memory cell M is constructed of a SRAM for storing data of 1 [bit]. The bipolar transistor Tn, the n-channel MOSFET Qn and the p-channel MOSFET Qp are individually used as the elements composing the peripheral circuit. In short, the semiconductor integrated circuit device of the present embodiment is constructed of the Bi-CMOS-SRAM. Incidentally, the following description will be made by using the MOSFET, but the present invention should not be limited thereto but can naturally employ the MISFET (Metal Insulator Semiconductor FET).

The aforementioned n-channel MOSFET Qn is constructed, as shown in FIG. 2, in the principal face of the p-type well region 6B which is defined by a field insulating film 7. This n-channel MOSFET Qn is composed mainly of a channel forming region (or p-type well region 6B), a gate insulating film 10, a gate electrode 13, and a pair of n-type semiconductor regions 18 and a pair of $n^+$-type semiconductor regions 20 acting as a source region and a drain region. In short, the n-channel MOSFET Qn is constructed to have the LDD (Lightly Doped Drain) structure.

With the individual paired $n^+$-type semiconductor regions 20 for the source region and the drain region of the aforementioned n-channel MOSFET Qn, there is electrically connected a first layer metal line 35 through connection holes 34 formed in an inter-layer insulating film 33. This inter-layer insulating film 33 is made of a silicon oxide film. The first layer metal line 35 is made of an aluminum film or an aluminum alloy film, for example.

The aforementioned p-channel MOSFET Qp is constructed, as shown in FIG. 2, in the principal face of the n-type well region 5B which is defined by the field insulating film 7.This p-channel MOSFET Qp is composed mainly of the channel forming region (or n-type well region 5B), the gate insulating film 10, the gate electrode 13, and a pair of p-type semiconductor regions 16 and a pair of $p^+$-type semiconductor regions 21 acting as a source region and a drain region. In short, the p-channel MOSFET Qp is constructed to have the LDD structure. A pair of $n^-$-type semiconductor regions (or n-pocket regions) 15 are individually formed below the paired p-type semiconductor regions 16 for the source region and the drain region of the p-channel MOSFET Qp.

With the individual paired $p^+$-type semiconductor regions 21 for the source region and the drain region of the aforementioned p-channel MOSFET Qp, there is electrically connected the first layer metal line 35 through the connection holes 34 which are formed in the inter-layer insulating film 33. With the $p^+$-type semiconductor region 21 at the source side of the p-channel MOSFET Qp adjacent to the memory cell array, on the other hand, there is electrically connected through connection holes 24 a polysilicon pattern 25 which is made of a second layer polycrystalline silicon to effect the power supply of Vcc to the memory cell, as will be described hereinafter.

The individual gate electrodes 13 of the aforementioned n-channel MOSFET Qn and p-channel MOSFET Qp are formed of a first layer polycrystal silicon film 11 and a refractory metal film 12 formed over the principal face of the former. The refractory metal film 12 is made of a tungsten silicide (WSix) film, for example. The upper faces of those gate electrodes 13 are coated with a cap insulating film. This cap insulating film is made of a silicon oxide film, for example.

The aforementioned bipolar transistor Tr is formed in the principal face of the n-type well region 5A which is defined by the field insulating film 7. This bipolar transistor Tr is constructed of the npn type, in which the n-type emitter region, the p-type base region and the n-type collector region are arrayed sequentially in the recited order in the depthwise direction from the principal face of the n-type well region 5A (or epitaxial layer 1B).

The n-type collector region is composed of an intrinsic collector region, a heavily doped collector region and a collector contact region. The intrinsic collector region is formed of the n-type well region 5A; the heavily doped collector region is formed of a buried $n^+$-type semiconductor region 3; and the collector contact region is formed of an $n^+$-type semiconductor region 8. With this $n^+$-type semiconductor region 8 or the collector contact region, there is electrically connected the first layer metal line 35 through the connection holes 34 which are formed in the inter-layer insulating film 33.

The aforementioned p-type base region is composed of an intrinsic base region and a heavily doped base region. The intrinsic base region is formed of a p-type semiconductor region 22, and the heavily doped base region is formed of the $p^+$-type semiconductor region 21. With this $p^+$-type semiconductor region 21 or the heavily doped base region, there is electrically connected the first layer metal line 35 through the connection holes 34 which are formed in the inter-layer insulating film 33.

The aforementioned n-type emitter region is composed of an $n^+$-type semiconductor region 32. With this $n^+$-type semiconductor region 32 or the emitter region, there is electrically connected an emitter electrode (31B) through an emitter opening (30B). The emitter electrode (31B) is made of a fourth layer polycrystal silicon film 31. This fourth polycrystal silicon film 31 is doped with an n-type impurity (e.g., phosphor (P)) during the deposition or with an n-type impurity (e.g., As) after the deposition with a view to reducing the resistance or forming the $n^+$-type semiconductor region 32. In short, the $n^+$-type semiconductor region 32 or the emitter region is formed by diffusing the n-type impurity, as introduced into the emitter electrode 31B, into the principal face of the p-type semiconductor region 22. With the emitter electrode 31B, there is electrically connected the first layer metal line 35 through the connection holes which are formed in the inter-layer insulating film 33. The total emitter depth of the depth of the $n^+$-type semiconductor region 32 or the emitter region, as formed in the semiconductor substrate 1, and the film thickness of the emitter electrode 31B, as formed of the fourth layer polycrystalline silicon film 31 or the uppermost polycrystal silicon film, is at least 0.2 [$\mu$m], as will be described hereinafter.

Figure 3:
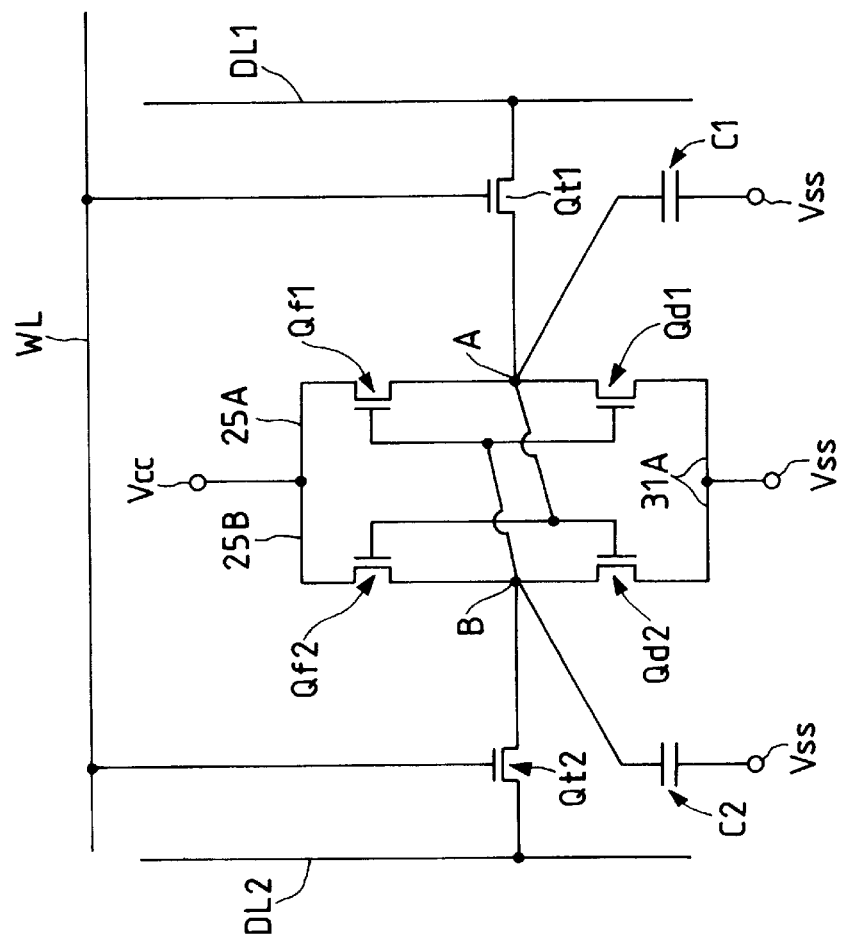
FIG. 3 is a diagram showing an equivalent circuit of a memory cell to be mounted in the semiconductor integrated circuit device.

The aforementioned memory cell M is composed, as shown in FIG. 3 (presenting an equivalent circuit diagram), of a flip-flop circuit formed of two inverter circuits, and two transfer MOSFETs Qt1 and Qt2. One of the inverter circuits is composed of a drive MOSFET Qd1 and a load TFT Qf1. The other inverter circuit is composed of a drive MOSFET Qd2 and a load TFT Qf2. The individual drain regions of the drive MOSFET Qd1 and the load TFT Qf1 construct the storage node portion (or memory node portion) A of the flip-flop circuit. The individual drain regions of the drive MOSFET Qd2 and the load TFT Qf2 construct the storage node portion (or memory node portion) B of the flip-flop circuit.

The aforementioned transfer MOSFET Qt1 is arranged between the storage node (or memory node) portion A of the flip-flop circuit and a data line DL1, and its operation is controlled by a word line WL. On the other hand, the aforementioned transfer MOSFET Qt2 is arranged between the storage node (or memory node) portion B of the flip-flop circuit and a data line DL2, and its operation is controlled by the word line WL. One semiconductor region of the transfer MOSFET Qt1 is electrically connected with the storage node portion A whereas the other semiconductor region is electrically connected with the data line DL1, and the gate electrode of the transfer MOSFET Qt1 is electrically connected with the word line WL. One semiconductor region of the transfer MOSFET Qt2 is electrically connected with the storage node portion B whereas the other semiconductor region is electrically connected with the data line DL2, and the gate electrode of the transfer MOSFET Qt2 is electrically connected with the word line WL.

The individual gate electrodes of the aforementioned drive MOSFET Qd1 and the load TFT Qf1 are electrically connected with the storage node portion B of the flip-flop circuit, and the individual gate electrodes of the drive MOSFET Qd2 and the load TFT Qf2 are electrically connected with the storage node portion A of the flip-flop circuit.

With the source region of the aforementioned load TFT Qf1, there is electrically connected an operating power supply line 25A which is fixed at an operating potential (e.g., 3.3 [V]) Vcc. With the source region of the load TFT Qf2, on the other hand, there is electrically connected an operating power supply line 25B which is fixed at the operating potential Vcc.

With the individual source regions of the aforementioned drive MOSFETs Qd1 and Qd2, there is electrically connected a reference power supply line 31A which is fixed at a reference potential (e.g., 0 [V]) Vss.

To the storage node portion A of the aforementioned flip-flop circuit, there is attached a capacity element C1. To the storage node portion B of the aforementioned flip-flop circuit, on the other hand, there is attached a capacity element C2.

The aforementioned transfer MOSFET Qt1 is formed, as shown in FIG. 1, in the principal face of the p-type well region 6A which is defined by the field insulating film 7. This transfer MOSFET Qt1 is composed mainly of the channel forming region (or p-type well region 6A), the gate insulating film 10, the gate electrode 13, and the paired n-type semiconductor regions 18 and the paired n$^+$-type semiconductor regions 20 for the source region and the drain region. In short, the transfer MOSFET Qt1 is constructed to have the n-channel conduction type and the LDD structure. The gate electrode 13 of the transfer MOSFET Qt1 is formed at the same step of that of the gate electrode 13 of the aforementioned n-channel MOSFET Qn. With the other n$^+$-type semiconductor region 20 of the transfer MOSFET Qt1, there is electrically connected the first layer metal line 35 through the connection holes 34 which are formed in the inter-layer insulating film 33.

The aforementioned MOSFET Qt2 is constructed like the transfer MOSFET Qt1, although not shown.

The aforementioned drive MOSFET Qd2 is formed in the principal face of the p-type well region 6A which is defined by the field insulating film 7, although not specifically shown. This drive MOSFET Qd2 is composed mainly of the channel forming region (or p-type well region 6A), the gate insulating film 10, the gate electrode 13, and a pair of n-type semiconductor regions 17 for the source region and the drain region. In short, the drive MOSFET Qd2 is constructed to have the n-channel conduction type and the single drain structure. The gate electrode 13 of the drive MOSFET Qt2 is formed at the same step as that of the gate electrode 13 of the aforementioned transfer MOSFET Qt1.

The aforementioned drive MOSFET Qd1 is constructed like the drive MOSFET Qd2, although not shown.

The aforementioned load TFT Qf1 is composed of the channel forming region, the gate insulating film, the gate electrode, the source region and the drain region. The gate electrode is formed of a polysilicon pattern 28 of a third layer polycrystalline silicon film. The channel forming region, the source region and the drain region are formed in the polysilicon pattern 25 which is made of the second layer polycrystal silicon film. The gate insulating film is formed of an inter-layer insulating film 26 which is formed between the second layer polysilicon pattern 25 and the third layer polysilicon pattern 28. Incidentally, the second layer polysilicon pattern 25 is electrically isolated from the gate electrode 24 by an inter-layer insulating film 23.

The aforementioned load TFT Qf2 is constructed like the load TFT Qf1, although not shown.

The aforementioned operating power supply line 25A is formed of the second layer polysilicon pattern 25. This operating power supply line 25A is electrically connected with the source region of the load TFT Qf1 which is formed in the second layer polysilicon pattern 25. On the other hand, the aforementioned operating power supply line 25B is formed of the second layer polysilicon pattern 25. This operating power supply line 25B is electrically connected with the source region of the load TFT Qf2 which is formed in the second layer polysilicon pattern 25.

The aforementioned capacity element C1 is constructed to have an STC (Stacked Capacitor) structure in which a lower electrode, a dielectric film and an upper electrode are sequentially stacked. The lower electrode is formed of the polysilicon pattern 28 made of the third layer polycrystal silicon film and acts as the gate electrode of the load TFT Qf2, too. The upper electrode is formed of the polysilicon pattern 31 made of the fourth layer polycrystal silicon film and acts as the reference power supply line (31A), too. The dielectric film is formed of an inter-layer insulating film 29 between the third layer polysilicon pattern 28 and the fourth layer polysilicon pattern 31. The inter-layer insulating film 29 is formed of a silicon oxide film, for example.

The aforementioned capacity element C2 is constructed to have an STC (Stacked Capacitor) structure in which a lower electrode, a dielectric film and an upper electrode are sequentially stacked. The lower electrode is formed of the polysilicon pattern 28 of the third layer and acts as the gate electrode of the load TFT Qf1, too. The upper electrode is formed of the polysilicon pattern 31 of the fourth layer and acts as the reference power supply line (31A), too. The dielectric film is formed of the inter-layer insulating film 29 between the third layer polysilicon pattern 28 and the fourth layer polysilicon pattern 31.

The aforementioned second layer polycrystal silicon film (or polysilicon pattern 25) is set to have a thickness of about 40 [nm], for example. The aforementioned third layer polycrystal silicon film (or polysilicon pattern 28) is set to have a thickness of about 50 [nm], for example. The aforementioned fourth layer polycrystal silicon film (or polysilicon pattern 31) is set to have a thickness of about 150 [nm] (i.e., 0.15 [μm]), for example. In short, the semiconductor integrated circuit device of the present embodiment is constructed of the four-layer polysilicon structure in which the intermediate layers, i.e., the second layer polycrystal silicon film 25 and the third layer polycrystal silicon film 28 between the uppermost layer or the fourth layer polycrystal silicon film 31 and the first layer polycrystal silicon film 11 have their individual thicknesses set to one half of less of the thickness of the uppermost or fourth layer polycrystal silicon film 31. Moreover, the depth of the emitter region or the n$^+$-type semiconductor region 32 is set to about 0.05 [μm], and the total emitter depth of the depth of the emitter region (32) and the thickness of an emitter electrode 31S is set to 0.2 [μm] or more. As a result, the base current ($I_B$) of the bipolar transistor Tr can be reduced to improve the emitter ground current gain ($h_{FE}=I_C/I_B$) of the bipolar transistor Tr. In short, the performance of the bipolar transistor Tr can be improved.

Figure 4:
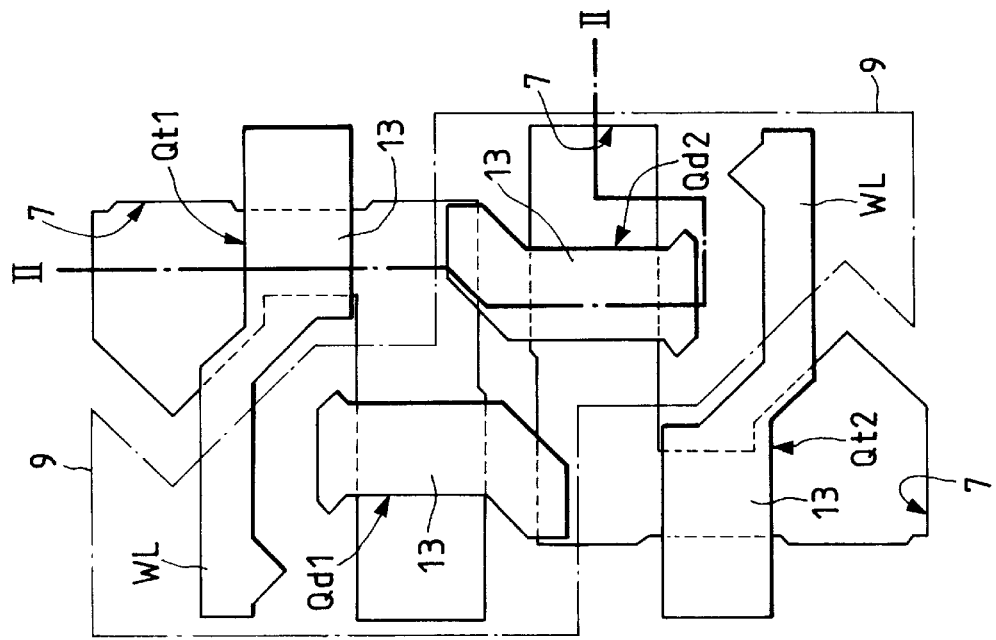
FIG. 4 is a top plan view showing a layout of the memory cell.
Figure 6:
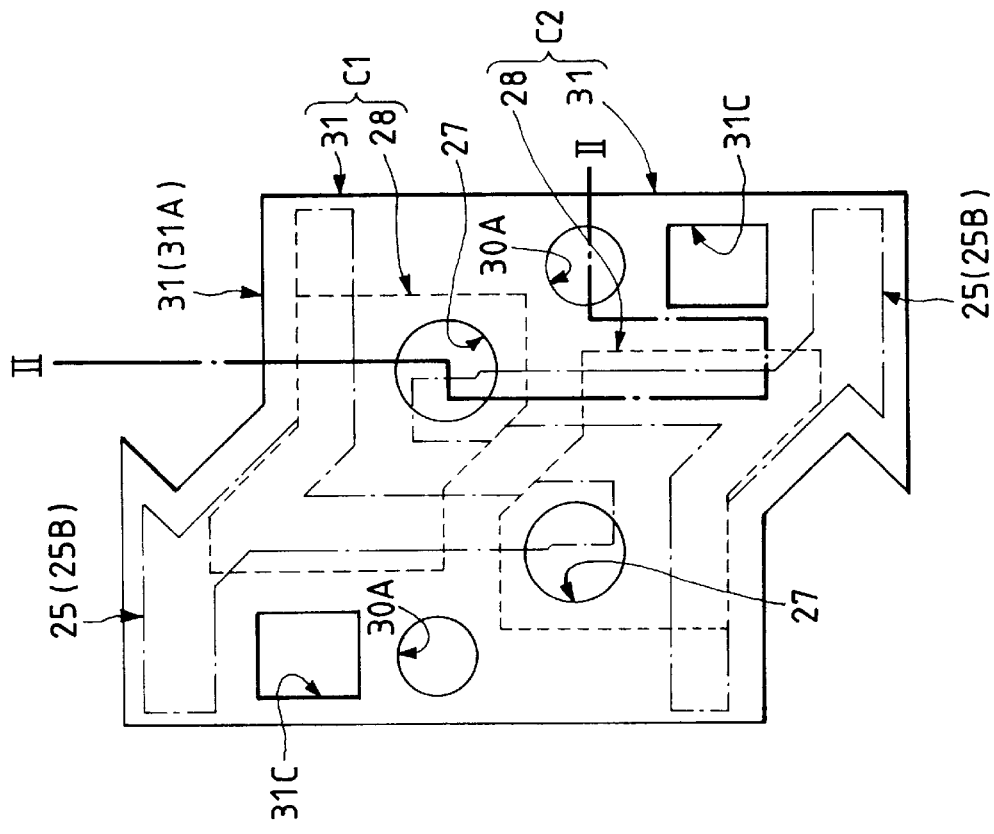
FIG. 6 is a top plan view showing a layout of the memory cell.
Figure 5:
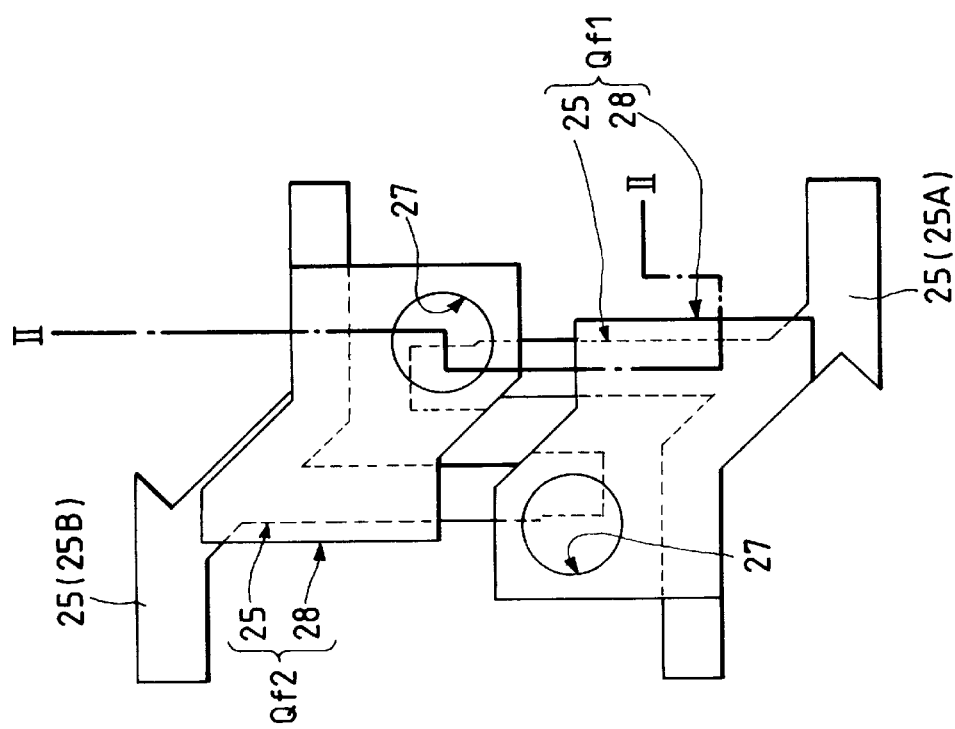
FIG. 5 is a top plan view showing a layout of the memory cell.

With these constructions, the transfer MOSFETs Qt1 and Qt2 and the drive MOSFETs Qd1 and Qd2 are individually arranged as shown in FIG. 4 (presenting a top plan layout diagram), and the load TFTs Qf1 and Qf2 and the operating power supply lines 25A and 25B are individually arranged as shown in FIG. 5 (presenting a top plan layout diagram). The capacity elements C1 and C2 and the reference power supply line 31A are individually arranged as shown in FIG. 6 (presenting a top plan layout diagram). Incidentally, lines II—II appearing in FIGS. 4 to 6 correspond to the section of FIG. 1 in the memory cell forming region.

Figure 7:
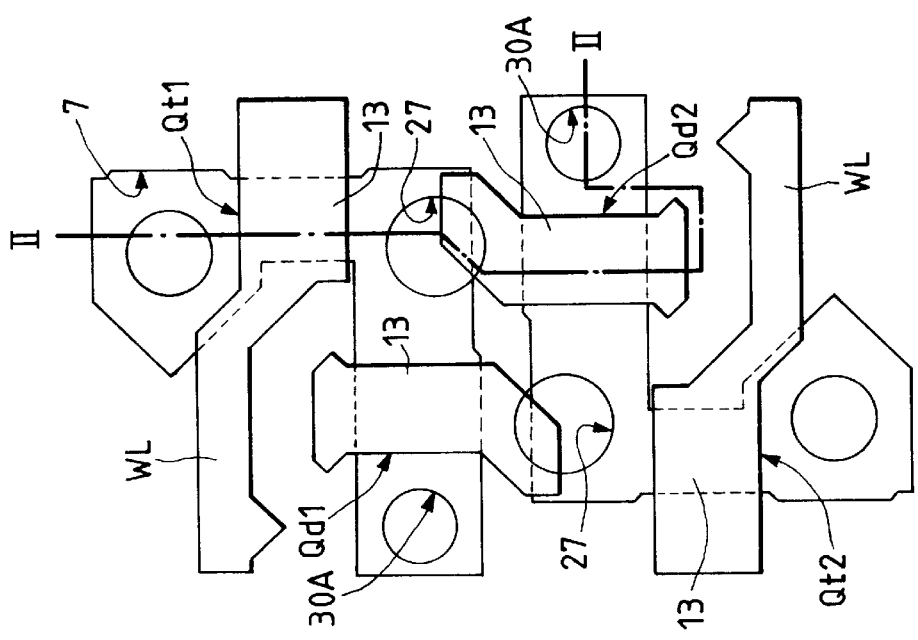
FIG. 7 is a top plan view showing a layout of the memory cell.

The aforementioned third-layer one polysilicon pattern 28 is electrically connected through connection holes 27, as shown in FIG. 1, FIG. 5 and FIG. 7 (presenting a top plan layout diagram), with the second-layer one polysilicon pattern 25 for the drain region of the load TFT Qf1, the n$^+$-type semiconductor region 17 for the gate electrode 13 of the drive MOSFET Qd2 and the drain region of the drive MOSFET Qd1, and one n$^+$-type semiconductor region 20 of the transfer MOSFET Qt1. In other words, the lower electrode (or polysilicon pattern 28) of the capacity element C1, the gate electrode (or polysilicon pattern 28) of the load TFT Qf2, the gate electrode 13 of the drive MOSFET Qd2, the drain region (or polysilicon pattern 25) of the load TFT Qf1, the drain region of the drive MOSFET Qd1 and one n$^+$-type semiconductor region 20 of the transfer MOSFET Qt1 are electrically connected with one another through one connection hole 27.

The aforementioned third-layer one polysilicon pattern 28 is electrically connected through the connection holes 27, as shown in FIG. 5 and FIG. 7, with the second-layer other polysilicon pattern 25 for the drain region of the load TFT Qf2, the n$^+$-type semiconductor region 17 for the gate electrode 13 of the drive MOSFET Qd1 and the drain region of the drive MOSFET Qd2, and one n$^+$-type semiconductor region 20 of the transfer MOSFET Qt2. In other words, the lower electrode (or polysilicon pattern 28) of the capacity element C2, the gate electrode (or polysilicon pattern 28) of the load TFT Qf1, the gate electrode 13 of the drive MOSFET Qd1, the drain region (or polysilicon pattern 25) of the load TFT Qf2, the drain region of the drive MOSFET Qd2 and one n$^+$-type semiconductor region 20 of the transfer MOSFET Qt2 are electrically connected with one another through one connection hole 27. Incidentally, line II—II appearing in FIG. 7 correspond to the section of FIG. 1 in the memory cell forming region.

The fourth layer polysilicon pattern 31 covers the second layer polysilicon pattern 25 and the third layer polysilicon pattern 28, as shown in FIG. 6. In other words, the second layer polycrystal silicon film 25 and the third layer polycrystal silicon film 28 are covered in the memory cell forming region with the fourth layer polycrystal silicon film 31.

With this fourth layer polysilicon pattern 31, as shown in FIGS. 1 and 6, there is electrically connected the first layer metal line 35 through the connection holes 34 which are formed in the inter-layer insulating film 33. In other words, the reference power supply line (or polysilicon pattern 31) 31A is backed for each memory cell with the metal line 35 which is formed thereover.

Over this first layer metal line 35, as shown in FIGS. 1 and 2, there is formed an inter-layer insulating film 36. This inter-layer insulating film 36 is formed of a silicon oxide film which is deposited by the CVD (Chemical Vapor Deposition) method, for example.

Figure 8:
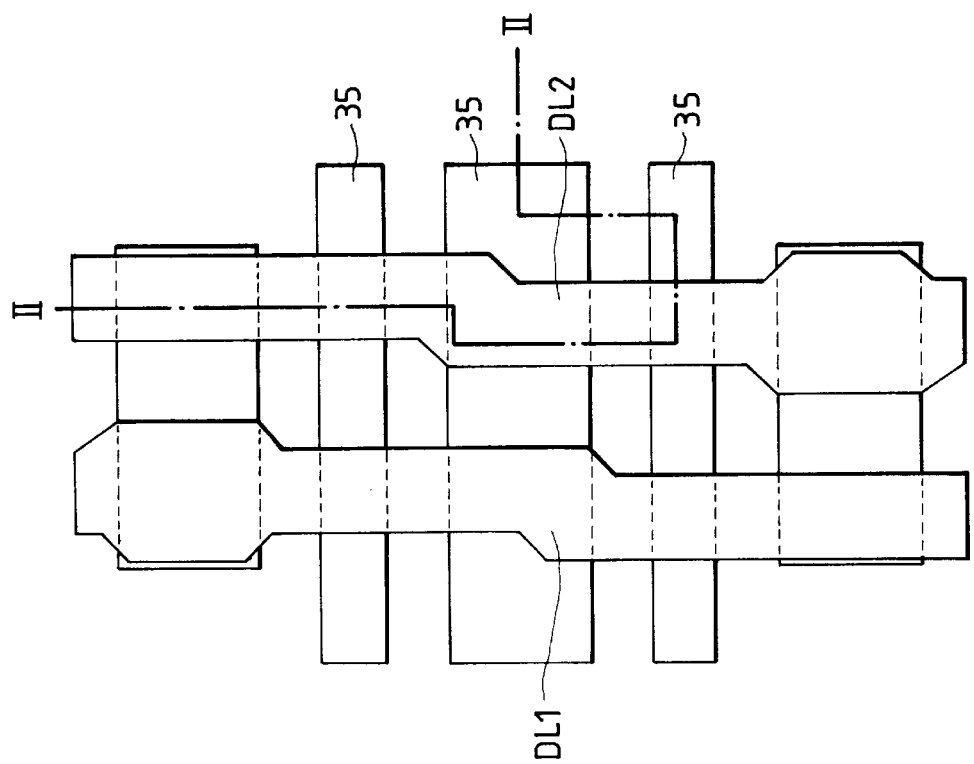
FIG. 8 is a top plan view showing a layout of the memory cell.

Over the inter-layer insulating film 36, as shown in FIG. 1 and FIG. 8 (presenting a top plan layout diagram), there are individual formed the data lines DL1 and DL2 for the second layer metal line. These data lines DL1 and DL2 are individually formed of an aluminum film or an aluminum alloy film, for example. Incidentally, line II—II appearing in FIG. 8 correspond to the section of FIG. 1 in the memory cell forming region.

The data lines DL1 and DL2 are individually covered with a final passivation film 37. This final passivation film 37 is formed of a silicon nitride film, for example.

The aforementioned fourth layer polysilicon pattern 31 is provided, as shown in FIG. 6, with through holes 31C for allowing the hydrogen released from the silicon nitride film (or final passivation film 37) formed thereover to penetrate into the underlying layer. These through holes 31C are formed over the load TFTs Qf1 and Qf2.

Incidentally, the aforementioned polysilicon pattern 31 is electrically connected, as shown in FIGS. 1 and 7, with the n$^+$-type semiconductor region 17 for the source region of the drive MOSFET Qd1 through connection holes 30A and with the n$^+$-type semiconductor region 17 for the source region of the drive MOSFET Qd2 through the connection holes 30A.

Here will be described the process for manufacturing the semiconductor integrated circuit device thus far described, with reference to the accompanying drawings.

First of all, the p$^-$-type semiconductor substrate 1A is prepared.

Next: the deep n$^-$-type semiconductor region 2 and the shallow p-type semiconductor region 4A are formed in the memory cell forming region of the p$^-$-type semiconductor substrate 1A; the shallow n$^+$-type semiconductor region 3A is formed in the principal face of the bipolar forming region; the shallow p-type semiconductor region 4B is formed in the principal face of the nMOS forming region; and the shallow n$^+$-type semiconductor region 3B is formed in the principal face of the pMOS forming region.

Next, the epitaxial layer 1B is grown by the epitaxial growth method over the principal face of the aforementioned p$^-$-type semiconductor substrate 1A. At this step, there are individually formed the deep buried n$^-$-type semiconductor region 2, the shallow buried p-type semiconductor regions 4A and 4B, and the shallow buried n$^+$-type semiconductor regions 3A and 3B.

Next: the n-type well region 5A is formed over the principal face of the buried n$^+$-type semiconductor region 3A; the p-type well region 6A is formed over the principal face of the buried p-type semiconductor region 4A; the n-type well region 5B is formed over the principal face of the buried n$^+$-type semiconductor region 3B; and p-type well region 6B is formed over the principal face of the buried p-type semiconductor region 4B.

Next, the thermal oxidation method is used to form the field insulating film 7 over the principal face of the aforementioned epitaxial layer 1B.

Next, the n$^+$-type semiconductor region 8 for the collector contact region is formed in the principal face of the aforementioned n-type well region 5A. After this, the p-type semiconductor region (Burred-p) 9 is formed in the aforementioned p-type well region 6A.

Figure 9:
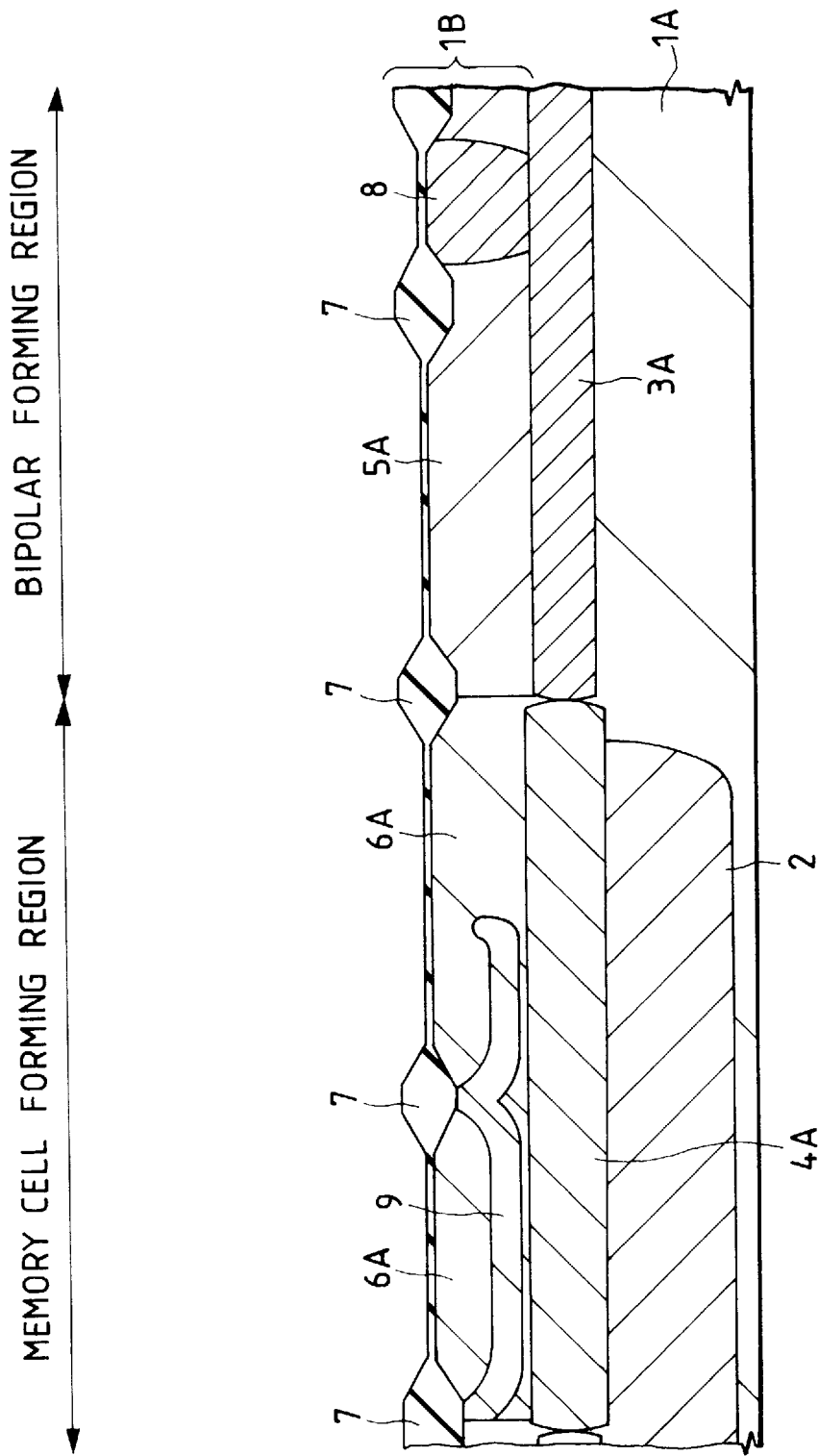
FIG. 9 is a section showing an essential portion for explaining a process for manufacturing the semiconductor integrated circuit device.
Figure 10:
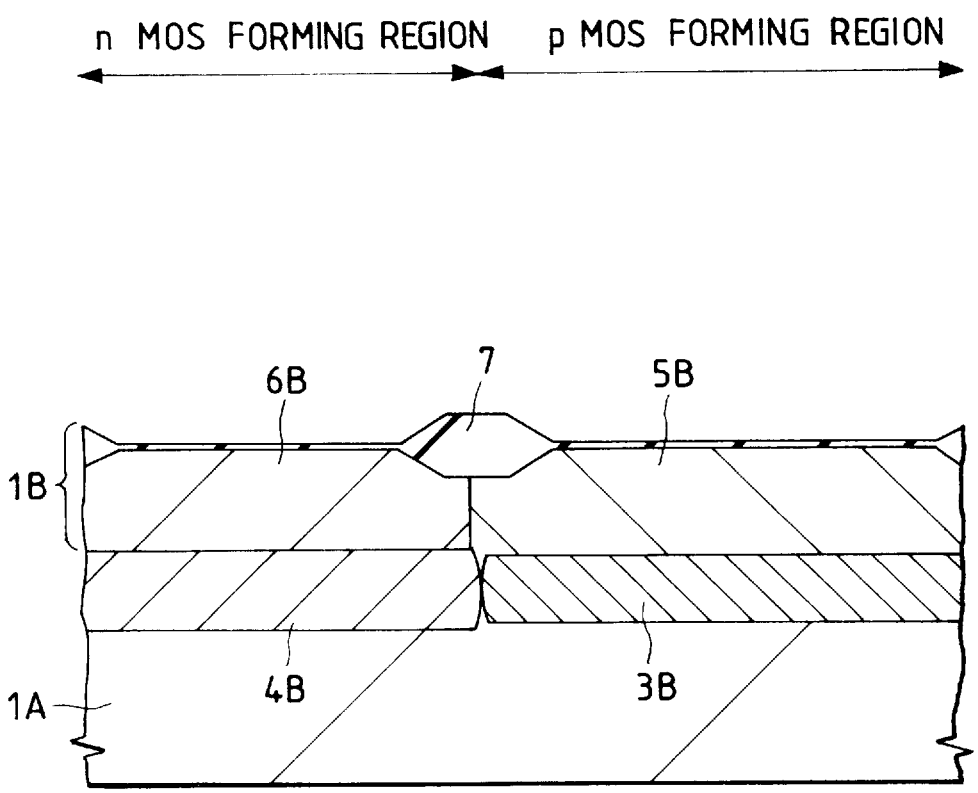
FIG. 10 is a section showing an essential portion for explaining a process for manufacturing the semiconductor integrated circuit device.

The manufacture steps up to this stage are shown in FIG. 9 (presenting a section of the essential portion) and FIG. 10 (presenting a section of an essential portion).

Next, the gate insulating film 10 is formed over the individual principal faces of the p-type well region 6A, the n-type well region 5A, the p-type well region 6B and the n-type well region 5B thus far described.

Next, the gate electrode 13 is formed over the individual principal faces of the gate insulating film 10, and a cap insulating film 14 is formed in the upper face of the gate electrode 13. This gate electrode 13 is composed of the first layer polycrystal silicon film 11 and the refractory metal film 12 stacked over the principal face of the former. The refractory metal film 12 is formed of a tungsten silicide (WSi$_2$) film, for example. The cap insulating film 14 is formed of a silicon oxide film which is deposited by the CVD method, for example. The first polycrystal silicon film 11 is set to a thickness of about 80 [nm], for example; the refractory metal film 12 is set to a thickness of about 80 [nm], for example; and the cap insulating film 14 is set to a thickness of about 100 [nm], for example. Incidentally, the cap insulating film 14, the refractory metal film 12 and the polycrystal silicon film 11 are individually worked by the common photoresist mask.

Next, in the principal face of the aforementioned n-type well region 5B, there are formed the paired n-type semiconductor regions (or n-pocket regions) 15 and the paired p-type semiconductor regions 16 for the source region and the drain region. These paired n-type semiconductor regions 15 and paired p-type semiconductor regions 16 are individually formed in self-alignment with the gate electrode 13.

Next, in the principal face of the drive MOS forming region of the aforementioned p-type well region 6A, there are formed the paired deep n-type semiconductor regions 17 for the source region and the drain region. These paired deep n-type semiconductor regions 17 are individually formed in self-alignment with the gate electrode 13 by introducing an n-type impurity (e.g., phosphor (P)). The deep n-type semiconductor regions 17 can increase both the mutual conductance gm of the drive MOSFETs and the overlap length of the drain region for the gate electrode 13 thereby to enhance the resistance to alpha rays. At this step, the drive MOSFETs Qd1 and Qd2 are individually completed to a substantial extent.

Figure 11:
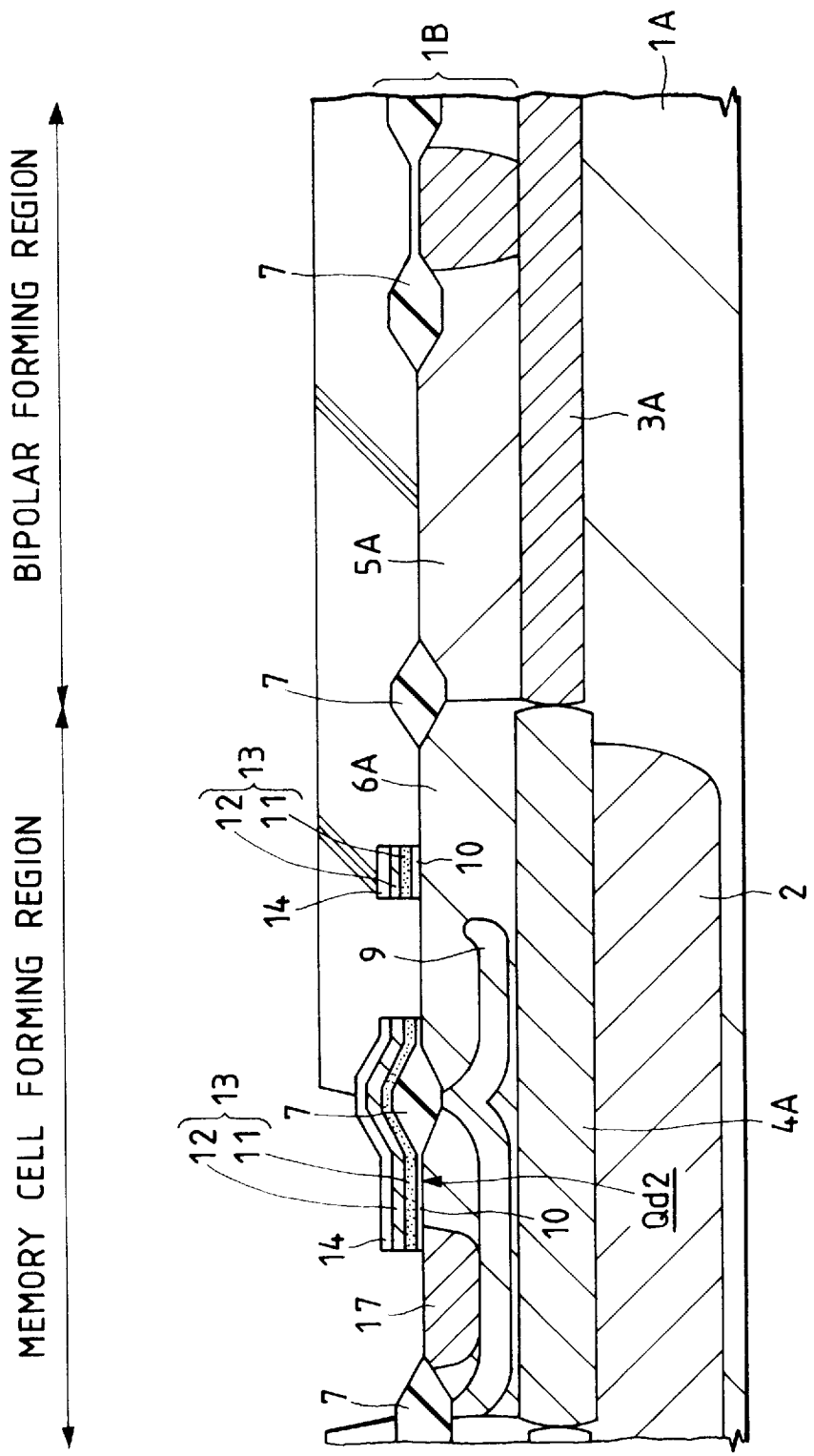
FIG. 11 is a section showing an essential portion for explaining a process for manufacturing the semiconductor integrated circuit device.
Figure 12:
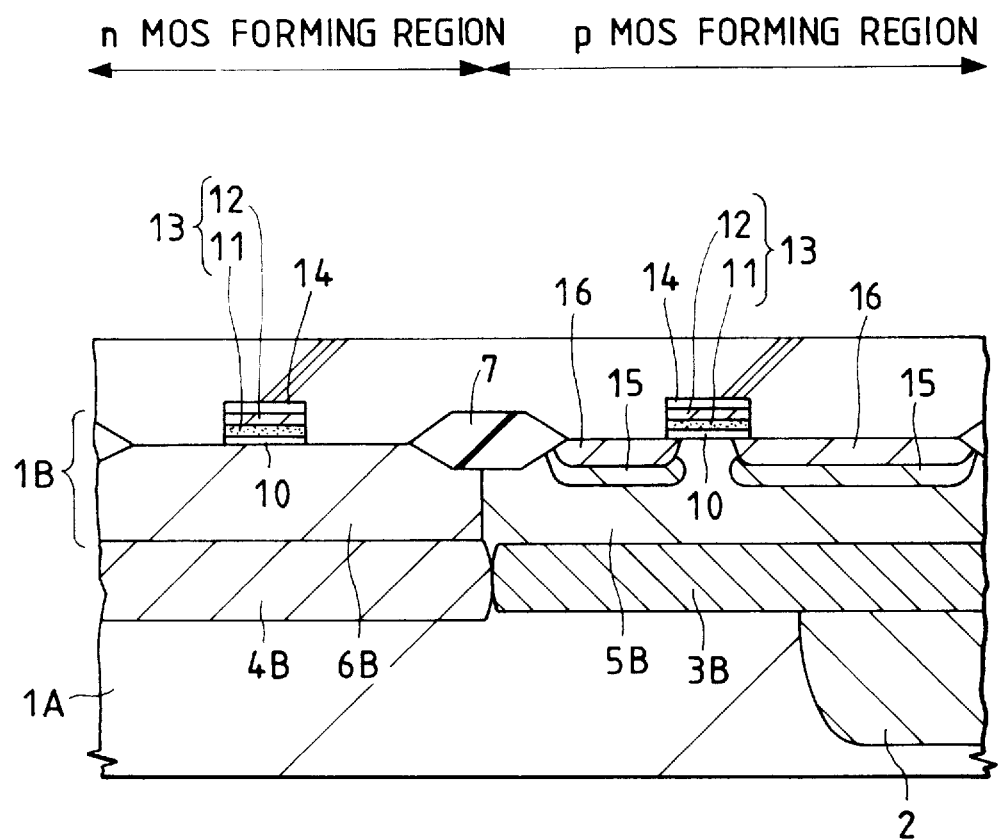
FIG. 12 is a section showing an essential portion for explaining a process for manufacturing the semiconductor integrated circuit device.

The manufacture steps up to this stage are shown in FIG. 11 (presenting a section of an essential portion) and FIG. 12 (presenting a section of an essential portion).

Next, the paired n-type semiconductor regions 18 for the source region and the drain region are formed in the principal face of the transfer MOS forming region of the aforementioned p-type well region 6A, and the paired n-type semiconductor regions 18 for the source region and the drain region are formed in the principal face of the p-type well region 6B. These paired n-type semiconductor regions 18 are formed in self-alignment with the gate electrode 13 by introducing an n-type impurity (e.g., P).

Figure 13:
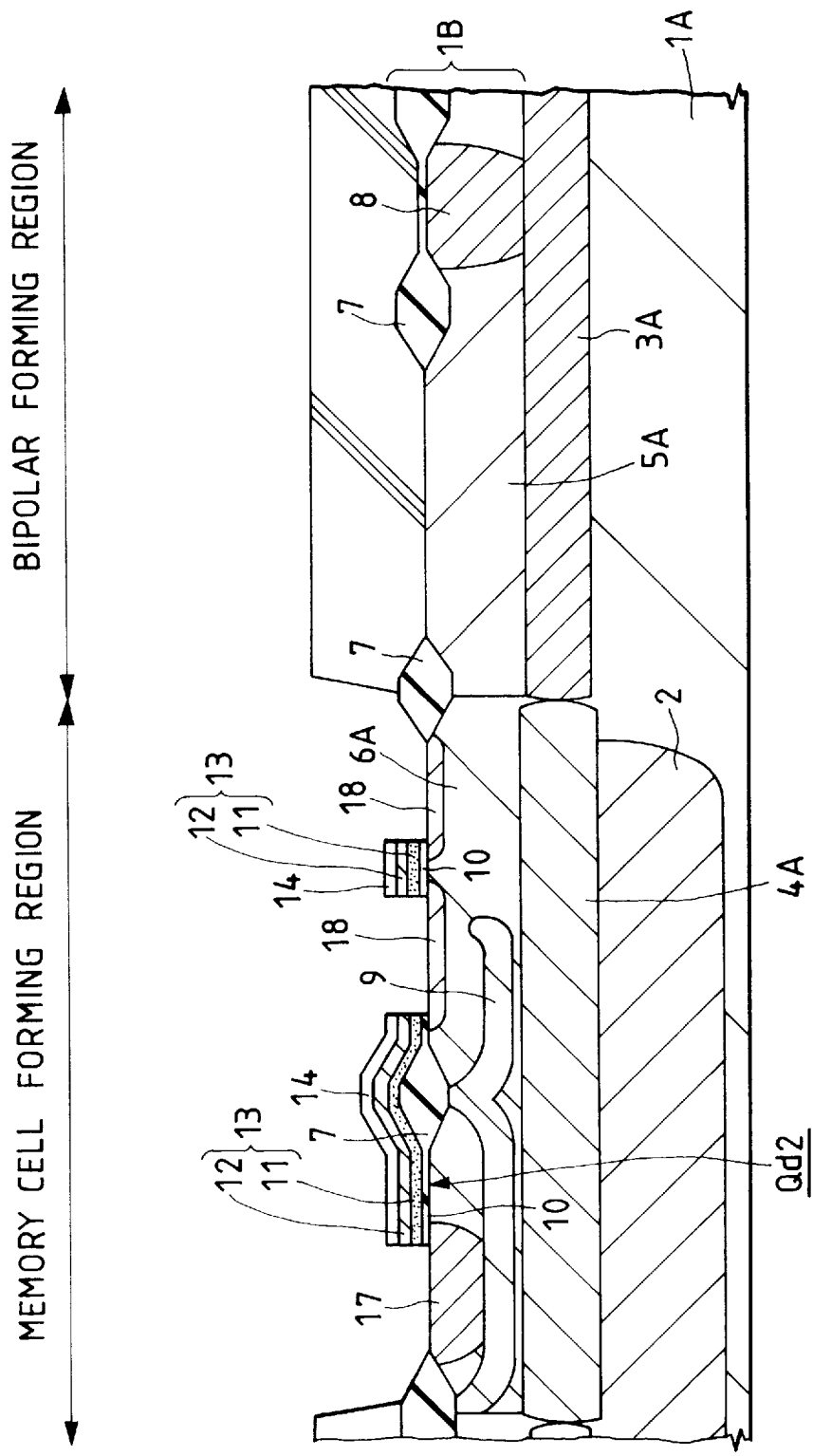
FIG. 13 is a section showing an essential portion for explaining a process for manufacturing the semiconductor integrated circuit device.
Figure 14:
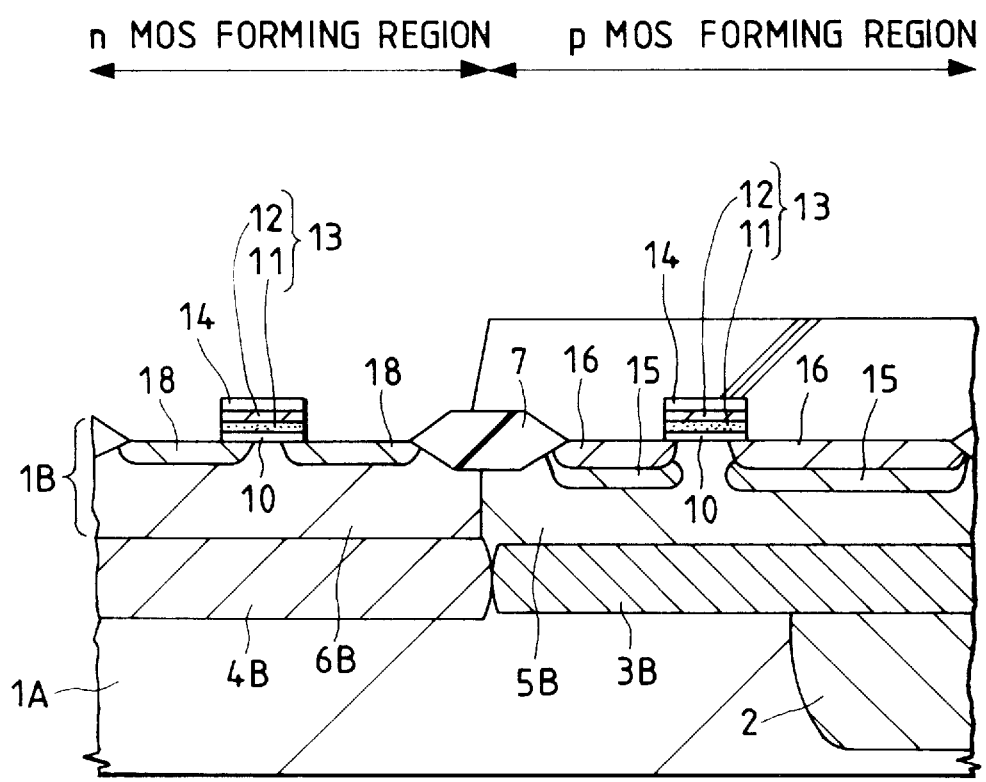
FIG. 14 is a section showing an essential portion for explaining a process for manufacturing the semiconductor integrated circuit device.

The manufacture steps up to this stage are shown in FIG. 13 (presenting a section of an essential portion) and FIG. 14 (presenting a section of an essential portion).

Next, a side wall spacer 19 is formed over the side wall faces of the aforementioned gate electrode 13. The side wall spacer 19 is formed by forming an insulating film made of a silicon oxide film, for example, all over the face of the epitaxial layer 1B including the gate electrode 13 and then by subjecting the insulating film to an anisotropic etching treatment.

Next, the paired n$^+$-type semiconductor regions 20 for the source region and the drain region are formed in the principal face of the transfer MOS forming region of the aforementioned p-type well region 6A, and the paired n$^+$-type semiconductor regions 20 for the source region and the drain region are formed in the principal face of the aforementioned p-type well region 6B. These paired n$^+$-type semiconductor regions 20 are individually formed in self-alignment with the side wall spacer 19 by introducing an n-type impurity (e.g., As). At this step, the n-channel MOSFET Qn and the transfer MOSFETs Qt1 and Qt2 are individually completed to a substantial extent.

Next, the paired p$^+$-type semiconductor regions 21 for the source region and the drain region are formed in the principal face of the aforementioned n-type well region 5B, and the p$^+$-type semiconductor region for the heavily doped base region is formed in the principal face of the aforementioned n-type well region 5A. The paired p$^+$-type semiconductor regions 21 are individually formed in self-alignment with the side wall spacer 19 by introducing a p-type impurity (e.g., B). The p$^+$-type semiconductor region 21 for the heavily doped base region is formed by introducing a p-type impurity selectively. At this step, the p-channel MOSFET Qp is substantially complete.

Next, there is formed in the principal face of the aforementioned n-type well region 5A the p-type semiconductor region 22 for the intrinsic base region. This p-type semiconductor region 22 is formed by introducing a p-type impurity (e.g., BF$_2$) selectively.

Figure 15:
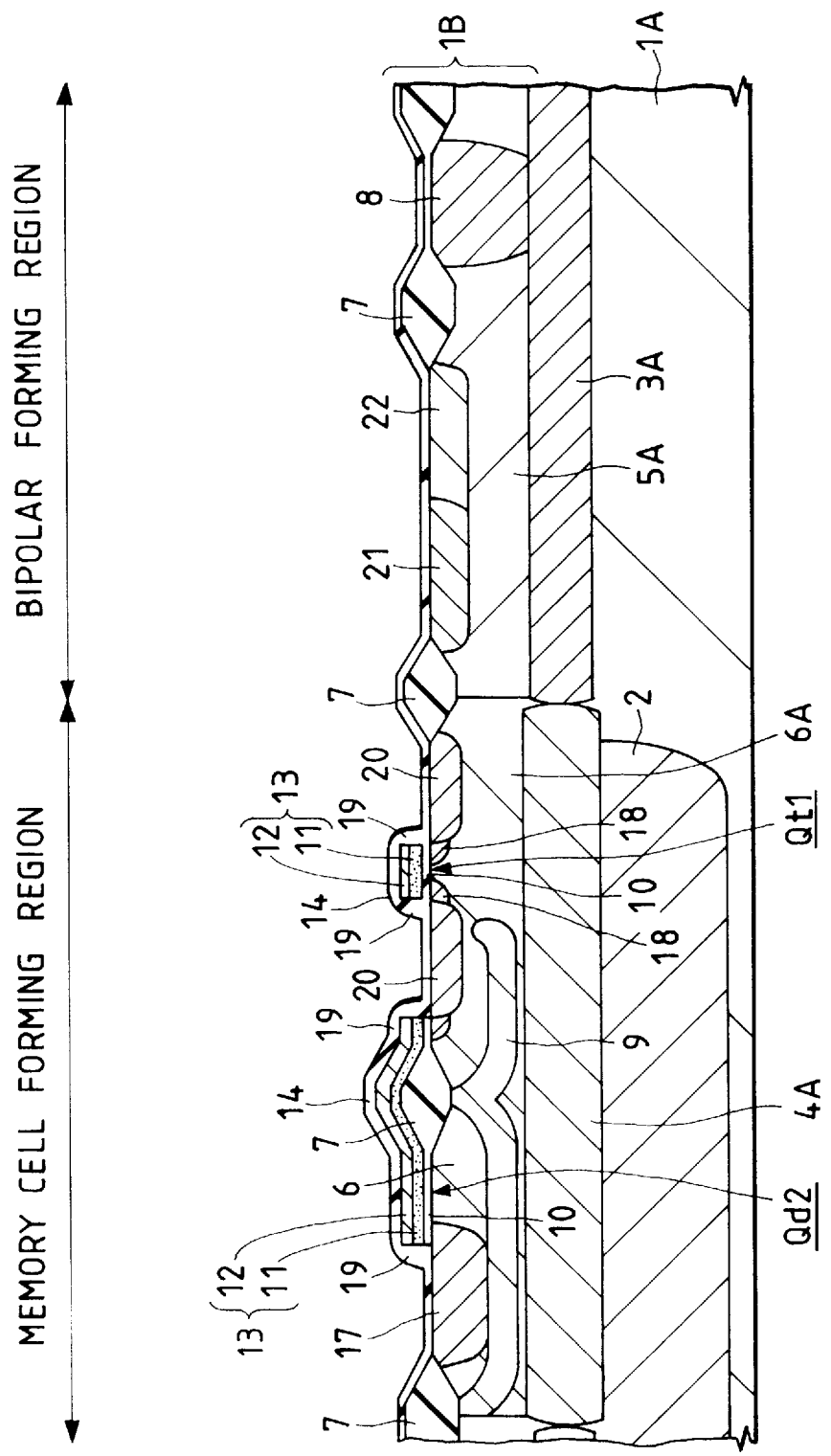
FIG. 15 is a section showing an essential portion for explaining a process for manufacturing the semiconductor integrated circuit device.
Figure 16:
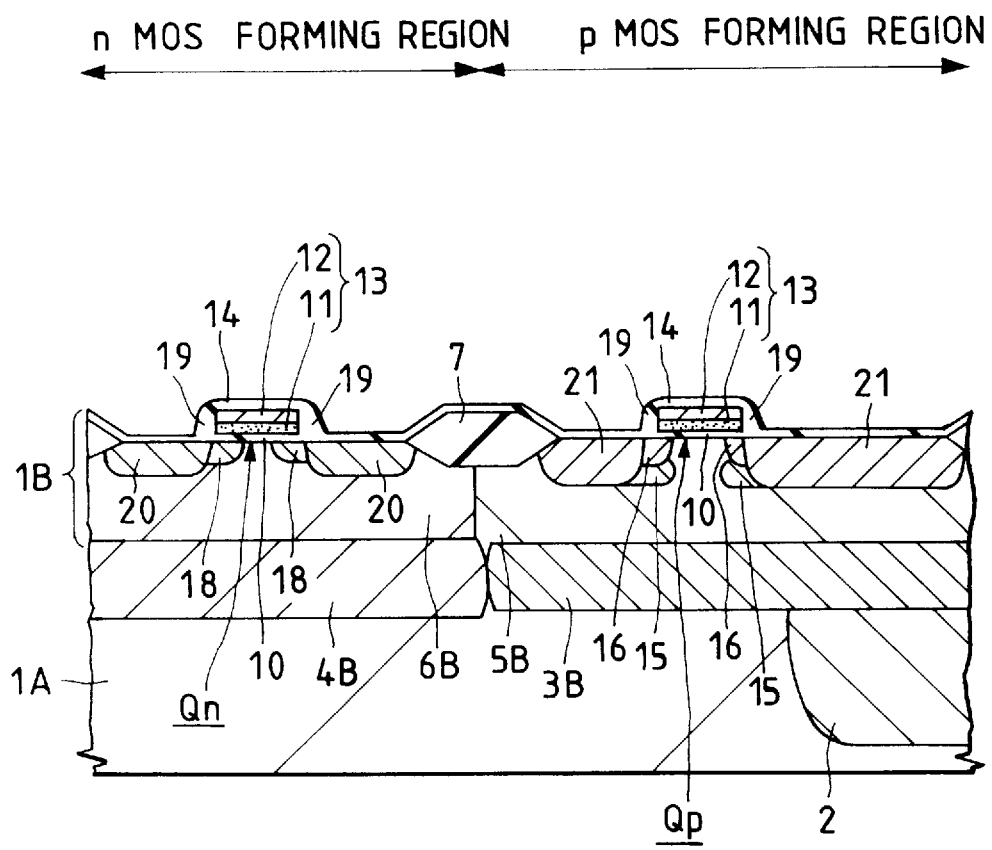
FIG. 16 is a section showing an essential portion for explaining a process for manufacturing the semiconductor integrated circuit device.

The manufacture steps up to this stage are shown in FIG. 15 (presenting a section of an essential portion) and FIG. 16 (presenting a section of an essential portion).

Next, the inter-layer insulating film 23 is formed all over the aforementioned epitaxial layer 1B. The inter-layer insulating film 23 is formed of a silicon oxide film which is set to a thickness of about 100 [nm], for example.

Next, in the inter-layer insulating film 23, there are formed the connection holes 24 for exposing the surface of a portion of the n$^+$-type semiconductor region 21 for the source region of the p-channel MOSFET Qp.

Next, the second layer polycrystal silicon film 25 is formed all over the surface of the inter-layer insulating film 23 over the connection holes 24. The second layer polycrystal silicon film 25 is set to a thickness of about 40 [nm], for example.

Next, the region of the polycrystal silicon film 25 around the TFT forming region is selectively doped with a p-type impurity (e.g., BF$_2$) by the ion implantation method.

Figure 17:
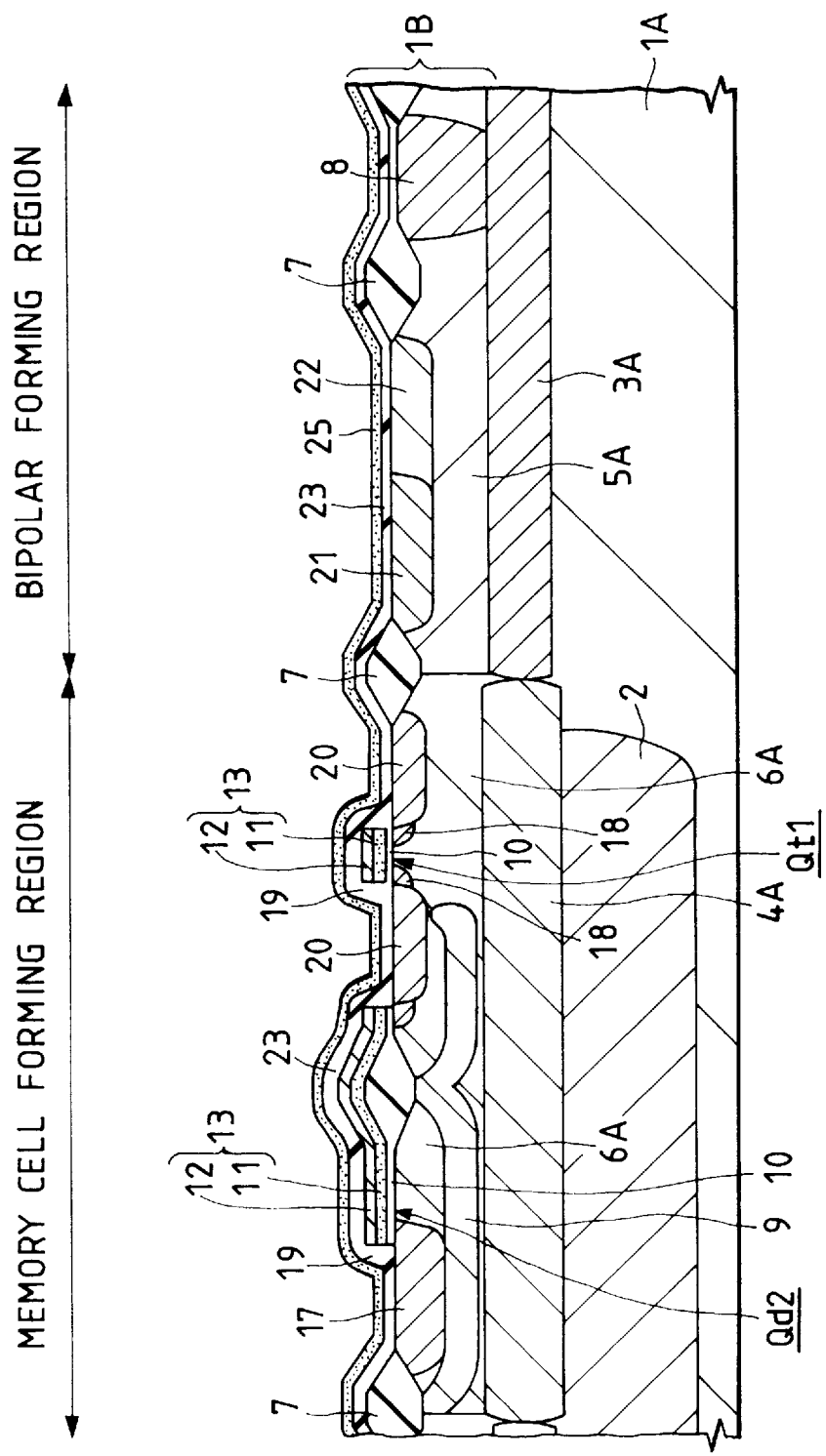
FIG. 17 is a section showing an essential portion for explaining a process for manufacturing the semiconductor integrated circuit device.
Figure 18:
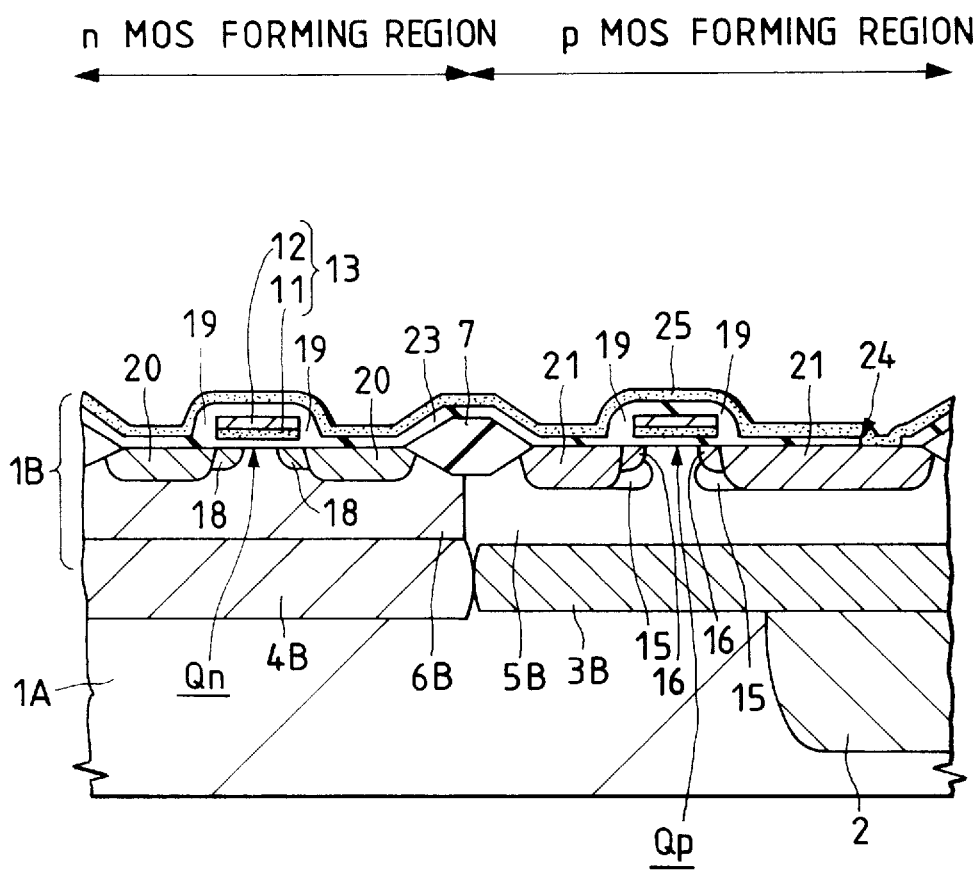
FIG. 18 is a section showing an essential portion for explaining a process for manufacturing the semiconductor integrated circuit device.

The manufacture steps up to this stage are shown in FIG. 17 (presenting a section of an essential portion) and FIG. 18 (presenting a section of an essential portion).

Next, the aforementioned polycrystal silicon film 25 is patterned to form the two polysilicon patterns 25. One polysilicon pattern 25 is used not only as the operating power supply line 25A but also as the channel forming region, the source region and the drain region of the load MOSFET Qf1. The other polysilicon pattern 25 is used not only as the operating power supply line 25B but also as the channel forming region, the source region and the drain region of the load MOSFET Qf2. Incidentally, the two polysilicon patterns 25 are shown in top plan layout in FIG. 5.

Next, the source region and the drain region of the TFT Qf1 are formed in one polysilicon pattern 25, and the source region and the drain region of the TFT Qf2 are formed in the other polysilicon pattern 25. These source regions and drain regions are formed by introducing a p-type impurity (e.g., $BF_2$) selectively by the ion implantation method.

Figure 19:
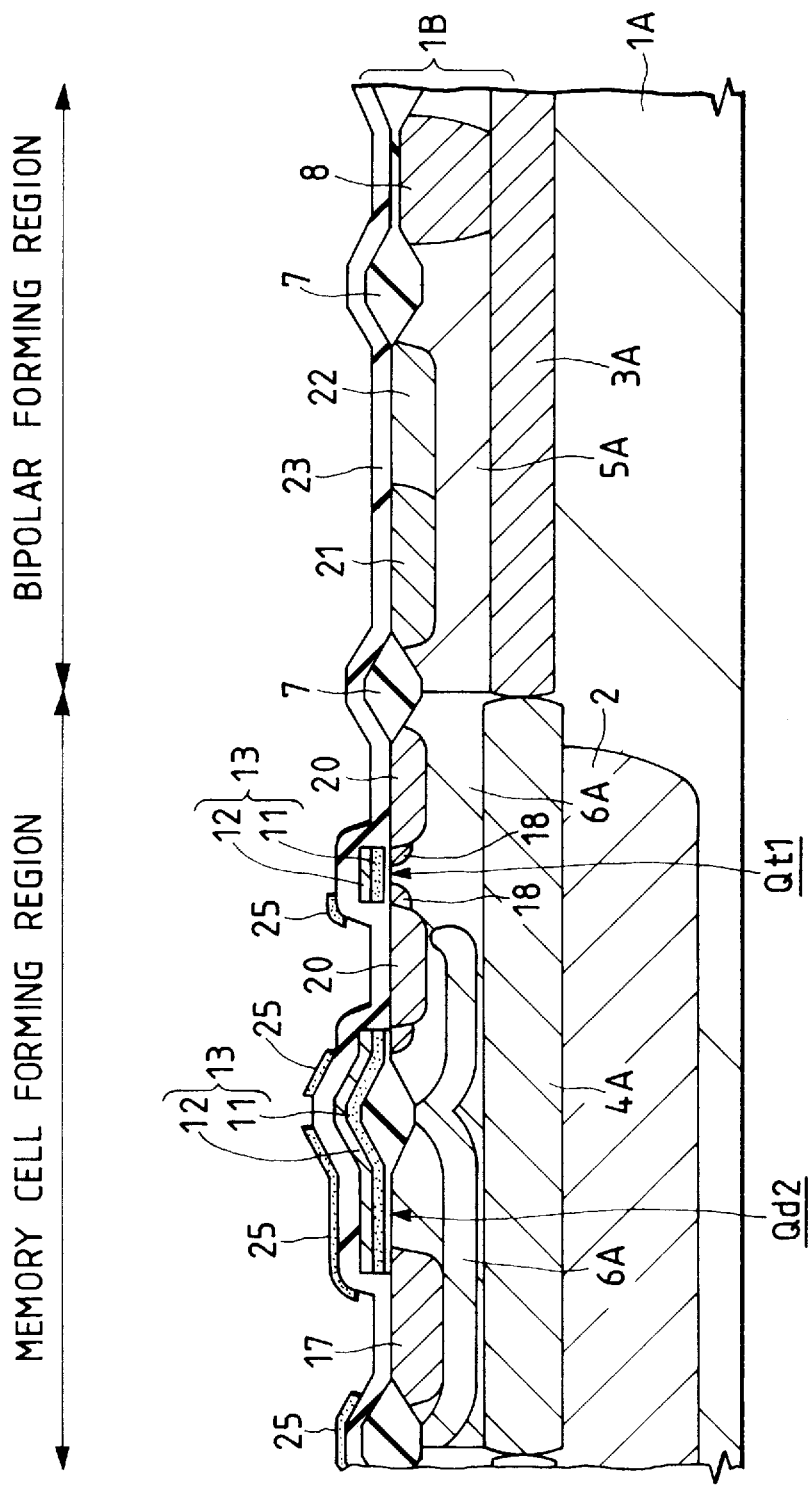
FIG. 19 is a section showing an essential portion for explaining a process for manufacturing the semiconductor integrated circuit device.
Figure 20:
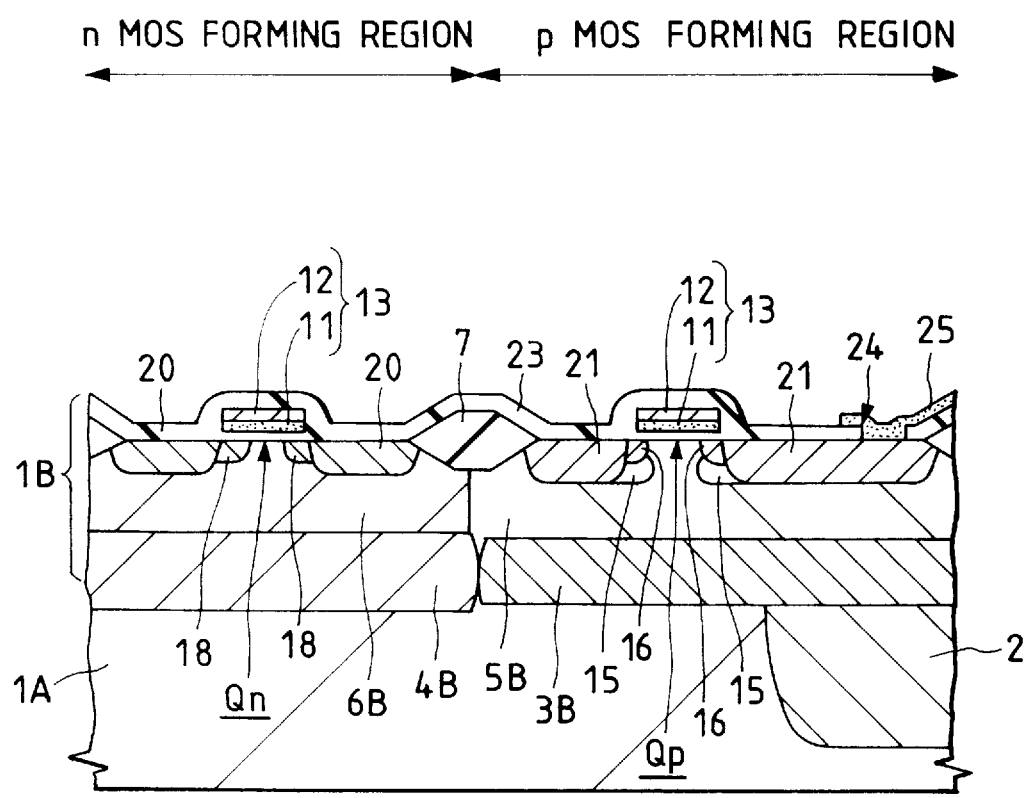
FIG. 20 is a section showing an essential portion for explaining a process for manufacturing the semiconductor integrated circuit device.

The manufacture steps up to this stage are shown in FIG. 19 (presenting a section of an essential portion) and FIG. 20 (presenting a section of an essential portion).

Next, the inter-layer insulating film 26 for the individual gate insulating films of the TFTs Qf1 and Qf2 is formed all over the epitaxial layer 1B over the aforementioned polysilicon pattern 25. The inter-layer insulating film 26 is formed of a silicon oxide film which is set to a thickness of about 40 [nm], for example.

Next, there are formed: the connection holes 27 for exposing the surfaces of the individual portions of the $n^+$-type semiconductor region 17 for the drain region of the one polysilicon pattern 25, the gate electrode 13 of the drive MOSFET Qt2 and the drain region of the drive MOSFET Qd1, and the one $n^+$-type semiconductor region 20 of the transfer MOSFET Qt1; and the $n^+$-type semiconductor region 17 for the drain region of the other polysilicon pattern 25, the gate electrode 13 of the drive MOSFET Qt1 and the drain region of the drive MOSFET Qd2, and the one $n^+$-type semiconductor region 20 of the transfer MOSFET Qt2.

Next, the third layer polycrystal silicon film 28 is formed all over the inter-layer insulating film 26 over the aforementioned connection holes 27. The polycrystal silicon film 28 is set to a thickness of about 50 [nm], for example.

Next, the polycrystal silicon film 28 is patterned to form both the polysilicon pattern 28 for the gate electrode of the transfer TFT Qf1 and the lower electrode of the capacity element C1, and the polysilicon pattern 28 for the gate electrode of the transfer TFT Qf2 and the lower electrode of the capacity element C2. At this step, the transfer TFTs Qf1 and Qf2 are individually completed to a substantial extent. Incidentally, the two polysilicon patterns 28 are shown in a top plan layout in FIG. 5.

Figure 21:
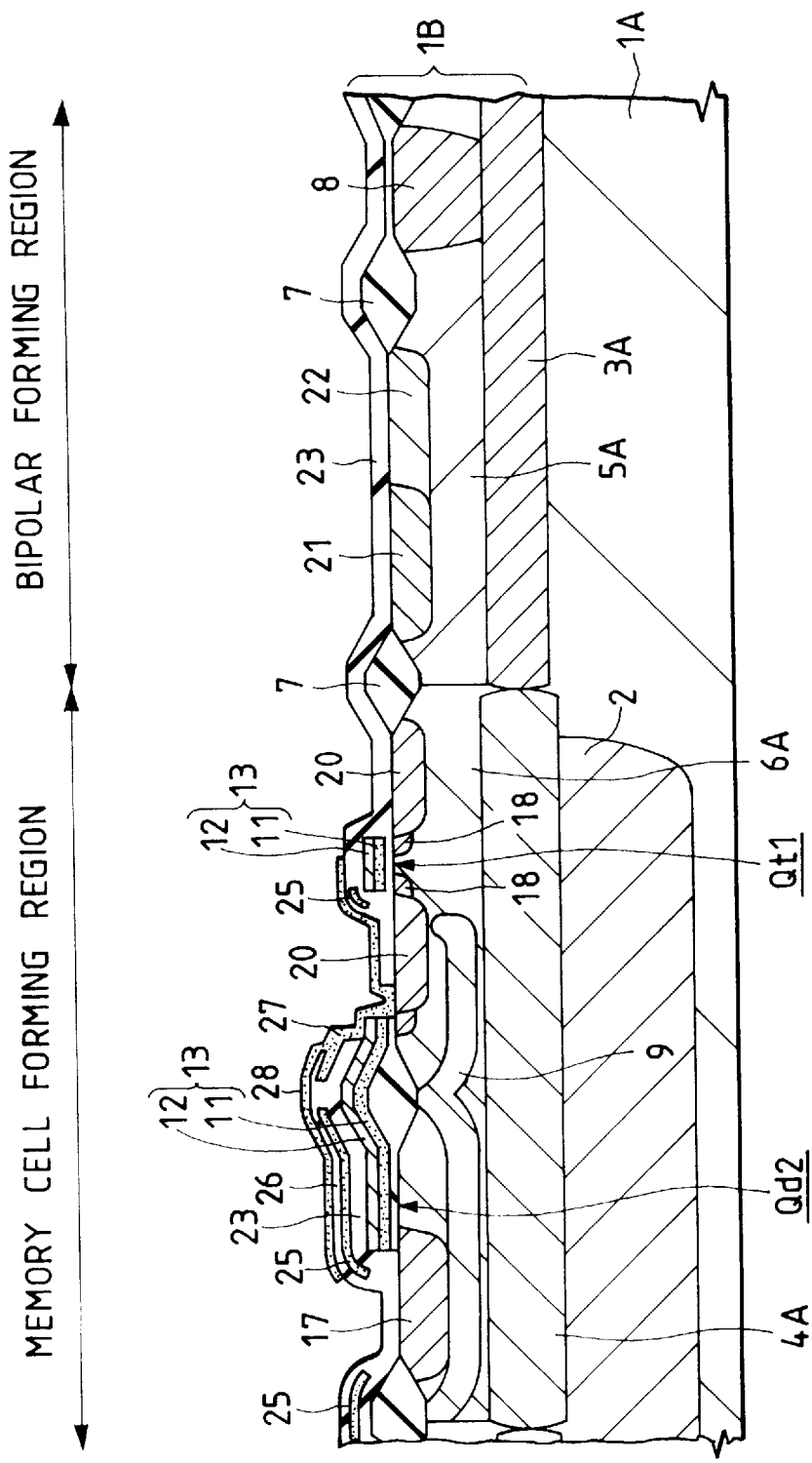
FIG. 21 is a section showing an essential portion for explaining a process for manufacturing the semiconductor integrated circuit device.
Figure 22:
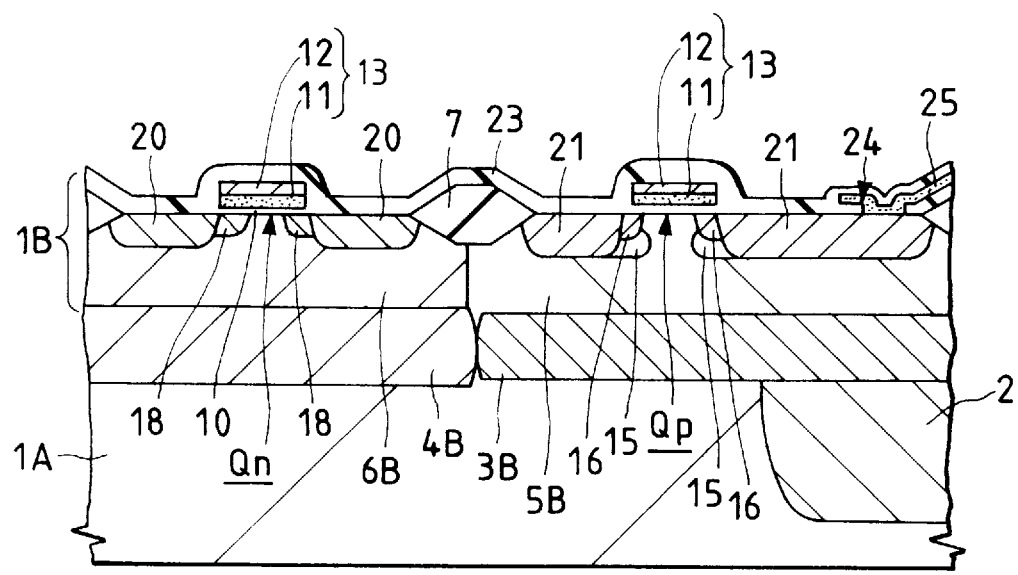
FIG. 22 is a section showing an essential portion for explaining a process for manufacturing the semiconductor integrated circuit device.

The manufacture steps up to this stage are shown in FIG. 21 (presenting a section of an essential portion) and FIG. 22 (presenting a section of an essential portion).

Next, all over the inter-layer insulating film 26 over the aforementioned polysilicon pattern 28, there is formed the inter-layer insulating film 29 for the individual dielectric films of the capacity elements C1 and C2. The inter-layer insulating film 29 is formed of a silicon oxide film which is set to a thickness of about 20 [nm], for example.

Next, there are formed: the connection hole 30A for exposing the surface of a portion of the $n^+$-type semiconductor region 17 for the source region of the aforementioned MOSFET Qd1; the connection hole 30A for exposing the surface of a portion of the $n^+$-type semiconductor region 17 for the source region of the aforementioned drive MOSFET Qd2; and the emitter opening 30B for exposing the surface of a portion of the p-type semiconductor region 22 for the intrinsic base region.

Next, the fourth layer polycrystal silicon film 31 is formed all over the inter-layer insulating film 29 over the aforementioned connection holes 30A and emitter opening 30B. This polycrystal silicon film 31 is set to a thickness of about 150 [nm], for example. This polycrystal silicon film 31 is doped with an n-type impurity (e.g., P) during the deposition or an n-type impurity (e.g., As) after the deposition with a view to reducing the resistance and forming the emitter region (or the $n^+$-type semiconductor region 32) of the bipolar transistor Tr.

Next, the aforementioned polycrystal silicon film 31 is patterned to form both the polysilicon pattern 31 for the individual upper electrodes of the capacity elements C1 and C2 and the reference power supply line (31A), and the emitter electrode 31B. The polysilicon pattern 31 covers the second layer polysilicon pattern 25 and the third layer polysilicon pattern 28 in the memory cell forming region. In the polysilicon pattern 31, moreover, there are formed the through holes 31C for causing the hydrogen released from the silicon nitride film formed thereover to penetrate into the underlying layer. Incidentally, the polysilicon pattern 31 is shown in a top plan layout in FIG. 6. Although described in Embodiment 3, on the other hand, the individual upper electrodes of the polysilicon pattern 31 and the capacity elements C1 and C2 and the reference power supply line (31A) need not be shunted at A1, if they are silicified except for the emitter electrode 31B, so that a high density can be achieved. Here, the reason why the silicification of the emitter electrode 31B is avoided is to prevent any increase in the base current.

Next, a thermal diffusion treatment is performed to diffuse the n-type impurity, as introduced into the aforementioned emitter electrode 31B, into the principal face of the p-type semiconductor region 22 for the intrinsic base region, so that the $n^+$-type semiconductor region 32 for the emitter region is formed is formed to have an emitter region depth of about 0.05 [$\mu$m]. At this step, the bipolar transistor Tr is substantially completed.

Figure 23:
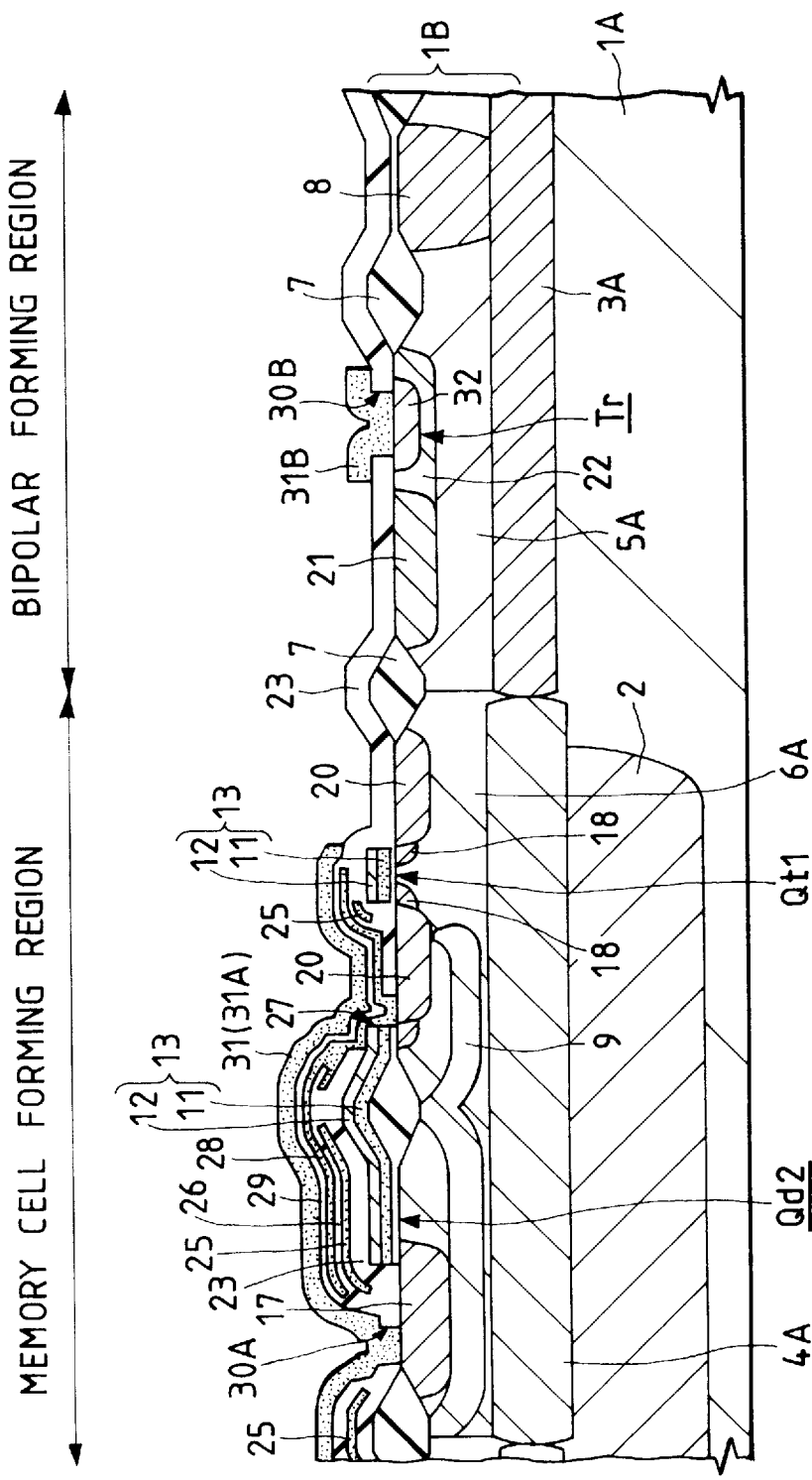
FIG. 23 is a section showing an essential portion for explaining a process for manufacturing the semiconductor integrated circuit device.
Figure 24:
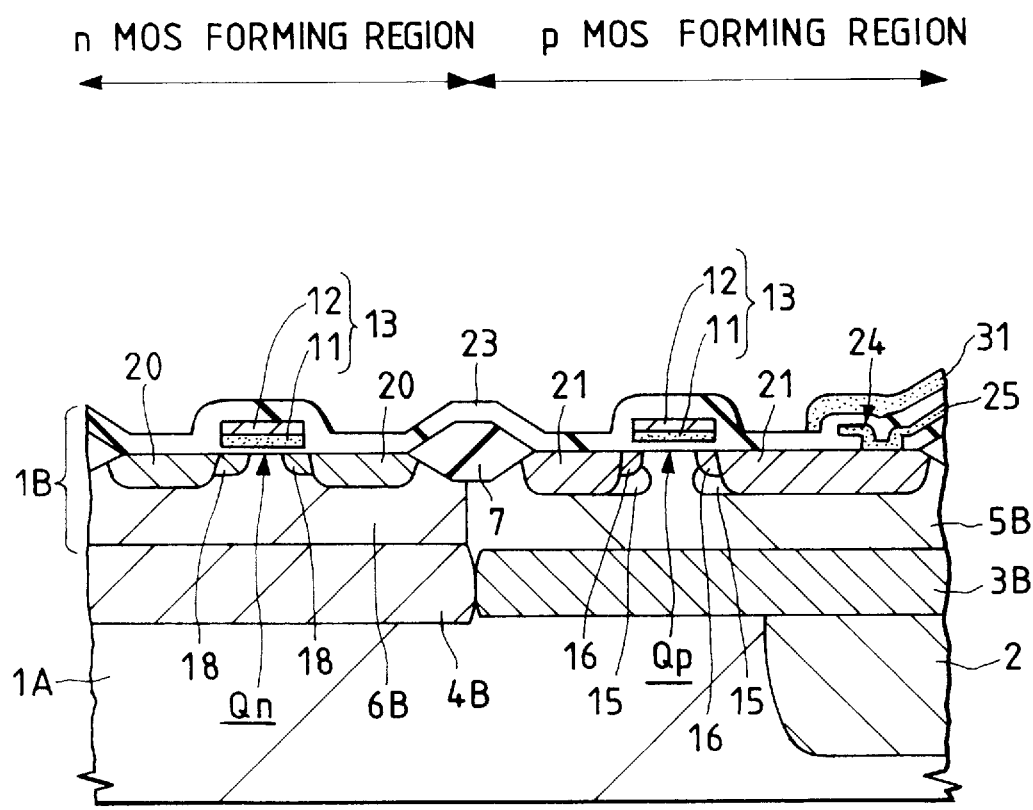
FIG. 24 is a section showing an essential portion for explaining a process for manufacturing the semiconductor integrated circuit device.

The manufacture steps up to this stage are shown in FIG. 23 (presenting a section of an essential portion) and FIG. 24 (presenting a section of an essential portion).

Next, the inter-layer insulating film 33 is formed all over the epitaxial layer 1B over the aforementioned polysilicon pattern 31 and emitter electrode 31B. The inter-layer insulating film 33 is formed of a silicon oxide film which is deposited by the CVD method, for example.

Next, there are formed: the connection hole 34 for exposing the surface of a portion of the polysilicon pattern 31; the connection hole 34 for exposing the surface of a portion of the other $n^+$-type semiconductor region 20 of the aforementioned transfer MOSFET Qt1; the connection hole 34 for exposing the surface of a portion of the $p^+$-type semiconductor region 21 for the aforementioned heavily doped base region; the connection hole 34 for exposing the surface of a portion of the aforementioned emitter electrode 31B; the connection hole 34 for exposing the surface of a portion of the $n^+$-type semiconductor region 8 for the collector contact region; the connection hole 34 for exposing the surface of a portion of one $n^+$-type semiconductor region 20 of the aforementioned n-channel MOSFET Qn; the connection hole for exposing the surface of a portion of the other $n^+$-type semiconductor region 20; the connection hole 34 for exposing the surface of a portion of one $p^+$-type semiconductor region 21 of the aforementioned p-channel MOSFET Qp; and the connection hole for exposing the surface of a portion of the other $p^+$-type semiconductor region 21.

Figure 25:
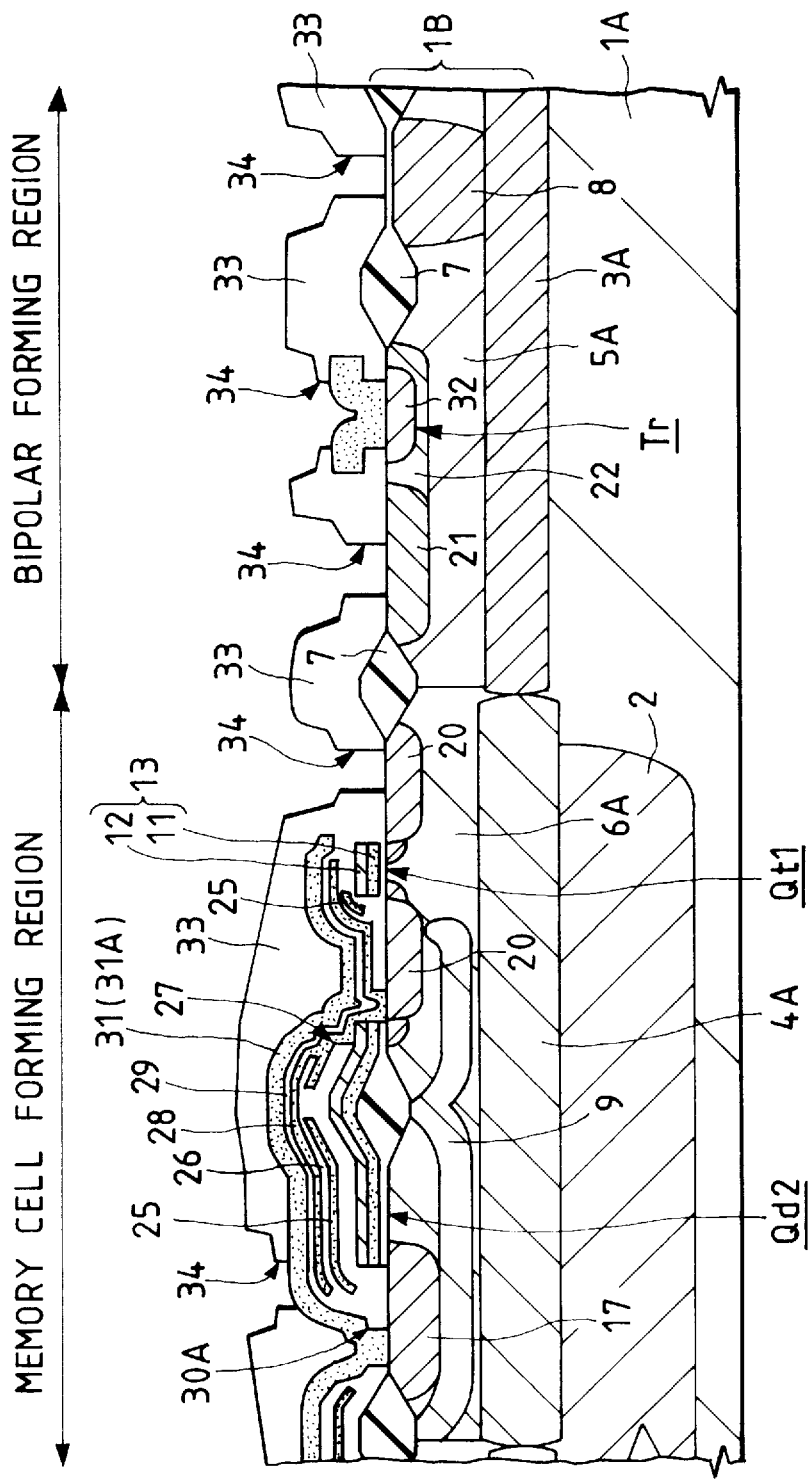
FIG. 25 is a section showing an essential portion for explaining a process for manufacturing the semiconductor integrated circuit device.
Figure 26:
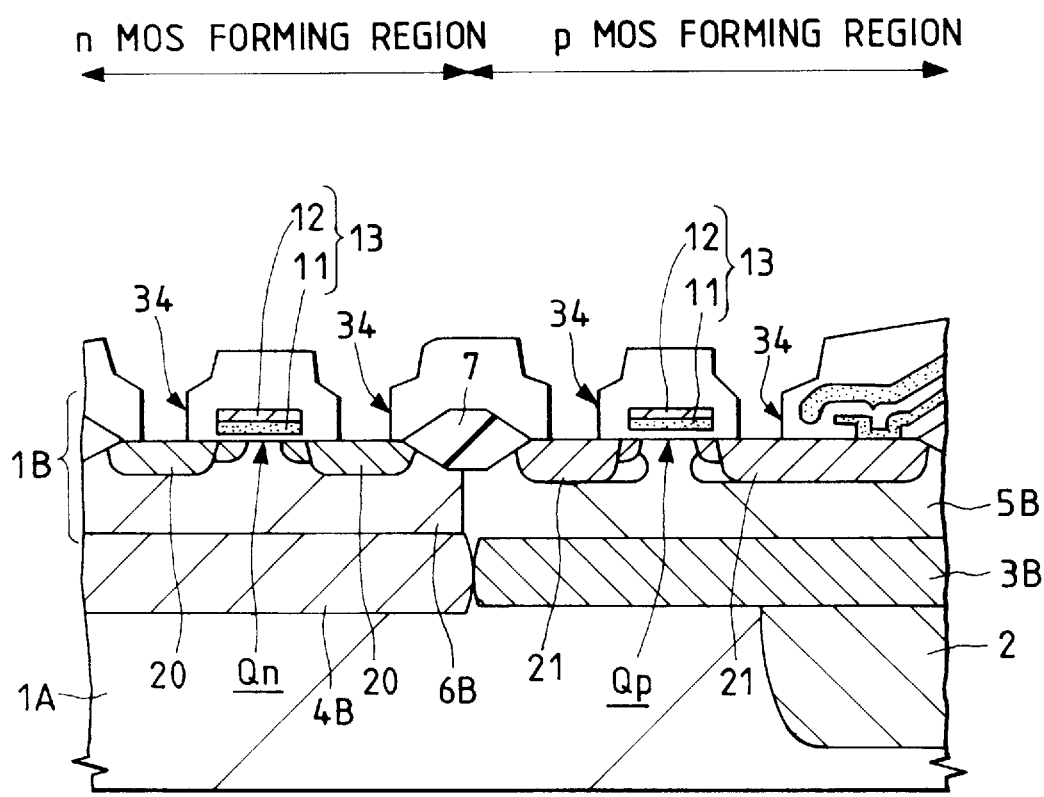
FIG. 26 is a section showing an essential portion for explaining a process for manufacturing the semiconductor integrated circuit device.

The manufacture steps up to this stage are shown in FIG. 25 (presenting a section of an essential portion) and FIG. 26 (presenting a section of an essential portion).

Next, the first layer metal line 35 is formed over the aforementioned inter-layer insulating film 33. At this step, the reference power supply line (or polysilicon pattern 31) 31A is backed for each memory cell M with the metal line 35 which is formed thereover.

Next, the inter-layer insulating film 36 is formed all over the inter-layer insulating film 33 over the aforementioned metal line 35.

Next, the data lines DL1 and DL2 or the second layer metal lines are individually formed over the aforementioned inter-layer insulating film 36.

Next, the final passivation film 37 is formed all over the inter-layer insulating film 36 over the aforementioned data lines DL1 and DL2 to substantially complete the semiconductor integrated circuit device, as shown in FIGS. 1 and 2. The final passivation film is formed of a silicon nitride film.

Incidentally, if arsenic (As) is used as the n-type impurity at the step of forming the aforementioned fourth layer polycrystal silicon film 31, the $n^+$-type semiconductor integrated circuit device 32 is shallowed by the subsequent heat treatment to have a steep density profile thereby to enhance the performance of the bipolar transistor Tr. If phosphor (P) is used as the n-type impurity, on the other hand, it can be uniformly distributed into the polycrystal silicon film 31 so that the connection resistance (or contact resistance) at the connection between the substrate and the polycrystal silicon film 31 can be reduced. As a result, the area to be occupied by the connection holes can be reduced to reduce the area to be occupied by the memory cells accordingly.

Thus, the following effects can be achieved according to the present embodiment.

Since the polycrystal silicon film 25, as located at the second layer from the uppermost one, for the channel forming region of the load TFT Qf1 (or Qf2) and for the operating power supply line 25A (or 25B) need not be thickened, the underlying step of the polycrystal silicon film 28, as located at the first layer from the uppermost one, can be drastically decreased to reduce the overetching at the time of working the first layer polycrystal silicon film 28. As a result, the inter-layer insulating film 26 between the first layer polycrystal silicon film 28 and the second layer polycrystal silicon film 25 can be thinned to enhance the performance of the load TFT Qf1 (or Qf2) employing the inter-layer insulating film 26 as the gate insulating film.

Moreover, since the intermediate polycrystal silicon films 25 and 28 are covered with the uppermost polycrystal silicon film 31, the inter-layer insulating film 29 between the uppermost polycrystal silicon film 31 and the first layer polycrystal silicon film 28 is not cut by the overetching at the time of working the uppermost polycrystal silicon film 31. As a result, the inter-layer insulating film 29 between the uppermost polycrystal silicon film 31 and the first layer polycrystal silicon film 28 can be thinned to enhance the performance of the capacity element C1 (or C2) using that inter-layer insulating film 29 as the dielectric film.

Still moreover, what is present below the portion of the uppermost polycrystal silicon film 31 to be etched is the step formed by the gate electrodes 13 of the bulk MOSFETs such as the drive MOSFETs Qd1 and Qd2 or the transfer MOSFETs Qt1 and Qt2 and the step formed by the field insulating film 7. As a result, a stable working can be achieved to retain the working margins of the memory cells.

Furthermore, since the reference power line (31A) is formed of the uppermost polycrystal silcon film 31, the connection holes 34 for connecting the reference power supply line (31A) and the overlying the metal line 35 can be arranged at arbitrary positions independently of the arrangements of the polysilicon pattern 25, the polysilicon pattern 28 or the active region pattern, which is formed of the intermediate polycrystal silicon films. As a result, the ground parasitic resistance of the memory cells M can be reduced without any increase in the area to be occupied by the memory cells M, thereby to stabilize the writing operations and reading operations of the memory cells M.

Furthermore, since the hydrogen to be released from the final passivation film 37 formed over the uppermost polycrystal silicon film 31 can be allowed to penetrate into the load TFTs Qf1 and Qf2 individually through the through holes 31C formed in the uppermost polycrystal silicon film 31, it is possible to enhance the individual On/Off characteristics of the load TFTs Qf1 and Qf2.

Furthermore: the lower electrode (or polysilicon pattern 28) of the capacity element C1, the gate electrode (or polysilicon pattern 28) of the load TFT Qf2, the gate electrode 13 of the drive MOSFET Qd2, the drain region (or polysilicon pattern 25) of the load TFT Qf1, the drain region of the drive MOSFET Qd1 and one $n^+$-type semiconductor region 20 of the transfer MOSFET Qt1 are electrically connected with one another through one connection hole 27; and the lower electrode (or polysilicon pattern 28) of the capacity element C2, the gate electrode (or polysilicon pattern 28) of the load TFT Qf1, the gate electrode of the drive MOSFET Qd1, the drain region (or polysilicon pattern 25) of the load TFT Qf2, the drain region of the drive MOSFET Qd2 and one $n^+$-type semiconductor region 20 of the transfer MOSFET Qt2 are electrically connected with one another through one connection hole 27. As a result, the number of connection holes for connecting the upper layer and the lower layer can be decreased to reduce the area (or cell size) to be occupied by the memory cells M accordingly. In addition, the lead lines (or in-cell lines) for connecting the individual elements electrically can be simplified to speed up the writing operations and reading operations of the memory cells.

[Embodiment 2]

Figure 27:
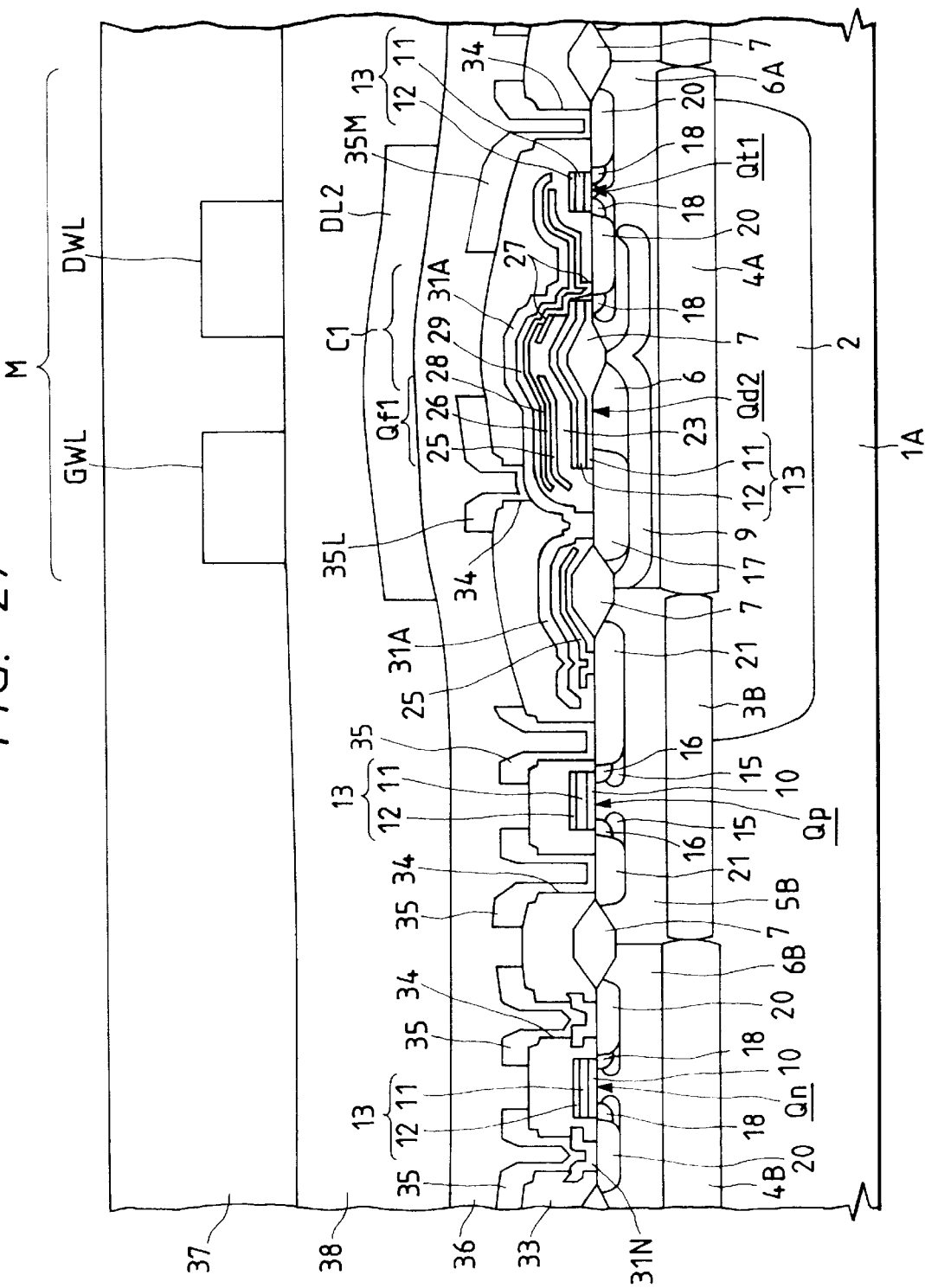
FIG. 27 is a section showing an essential portion of a semiconductor integrated circuit device according to Embodiment 2 of the present invention.
Figure 28:
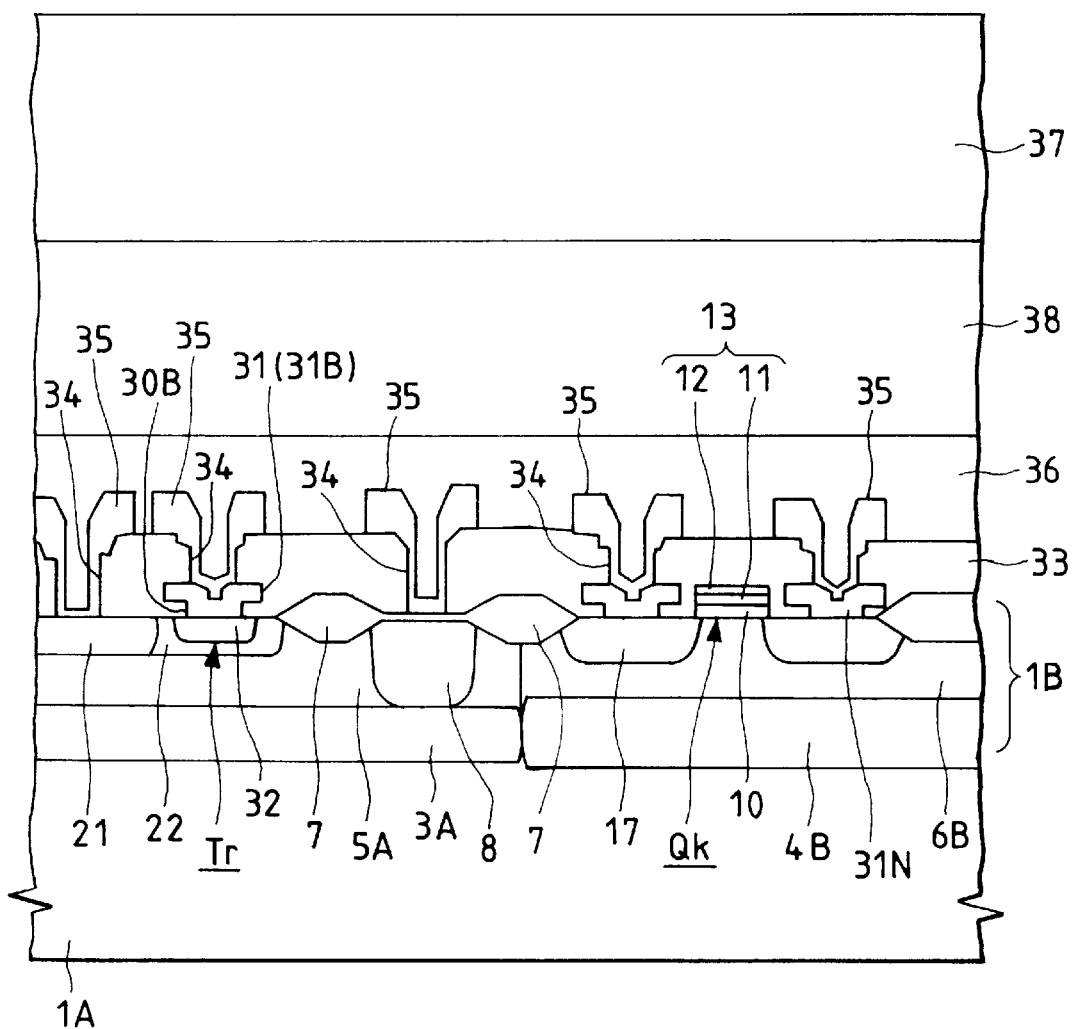
FIG. 28 is a section showing an essential portion of the semiconductor integrated circuit device.

A schematic construction of the semiconductor integrated circuit device according to Embodiment 2 of the present invention is shown in FIG. 27 (presenting a section of an essential portion) and FIG. 28 (presenting a section of an essential portion). Incidentally, the hatching (or parallel oblique lines) is omitted from the sections of FIGS. 27 and 28 for easy illustrations.

As shown in FIGS. 27 and 28, the semiconductor integrated circuit device is constructed mainly of the semiconductor substrate in which the epitaxial layer 1B is formed over the principal face of the $p^-$-type semiconductor substrate 1A, for example. The memory cell M is mounted on the memory cell forming region of the semiconductor substrate; the bipolar transistor Tr is mounted on the bipolar forming region; the n-channel MOSFET Qn is mounted on the nMOS forming region; and the p-channel MOSFET Qp is mounted on the pMOS forming region.

The aforementioned n-channel MOSFET Qn is formed, as shown in FIG. 27, in the principal face of the p-type well region 6B which is defined by the field insulating film 7. With the individual paired $n^+$-type semiconductor regions 20 for the source region and drain region of the n-channel MOSFET Qn, there is electrically connected an electrode 31N which is electrically connected with the lines 35 through the connection holes 34 formed in the inter-layer insulating film 33. The electrode 31N is formed of the fourth layer polycrystal silicon film. The lines 5 are formed of the first layer metal film. This first layer metal film is constructed, although not shown, of the three-layered structure in which are sequentially stacked a lower titanium tungsten (TiW) film (or titanium nitride (TiN) film), an intermediate aluminum alloy film and an upper TiW film (or TiN film), for example. The lower TiW film is formed with a main view of improving the electromigration resistance and the stress-migration resistance. The intermediate aluminum alloy film is formed, for example, by adding Cu to it with a view to improving the electromigration resistance and by adding Si to it with a view to reducing the mutual diffusion between aluminum particle and silicon particle. The upper TiW film is formed with a main view to preventing the aluminum hill lock, which might otherwise occur at the surface of the intermediate aluminum alloy film, and reducing the reflectivity of the surface of the intermediate aluminum alloy film.

The aforementioned p-channel MOSFET Qp is formed, as shown in FIG. 27, in the principal face of the n-type well region 5B which defined by the field insulating film 7. With the individual paired p$^+$-type semiconductor region 21 for the source region and the drain region of the p-channel MOSFET Qp, there is electrically connected the lines 35 of the first layer metal film through the connection holes 34 which are formed in the inter-layer insulating film 33. With the p$^+$-type semiconductor region 21 at the source side of the p-channel MOSFET Qp adjacent to the memory cell array, on the other hand, there is electrically connected the polysilicon pattern 25 of the second layer polycrystal silicon through the (not-shown) connection holes, to supply the voltage Vcc to the memory cells.

The individual gate electrodes 13 of the aforementioned n-channel MOSFET Qn and p-channel MOSFET Qp are formed of the first layer polycrystal silicon film 11 and the refractory metal film 12 formed over the principal face of the former. The refractory metal film 12 is made of a tungsten silicide (WSix) film, for example. The upper face of these gate electrodes is covered with the cap insulating film.

The aforementioned bipolar transistor Tr is formed, as shown in FIG. 28, in the principal face of the n-type well region 5A which is defined by the field insulating film 7. This bipolar transistor Tr is constructed of the npn type structure in which the n-type emitter region, the p-type base region and the n-type collector region are arrayed sequentially in the depthwise direction from the principal face of the n-type well region 5A (or epitaxial layer 1B).

With the n$^+$-type semiconductor region 8 or the collector contact region of the aforementioned n-type collector region, there are electrically connected the lines 35 of the first layer metal film through the connection holes 34 which are formed in the inter-layer insulating film 33.

With the p$^+$-type semiconductor region 21 or the heavily doped base region of the aforementioned p-type base region, there are electrically connected the wiring line of the first layer metal film through the connection holes 34 which are formed in the inter-layer insulating film 33.

With the n$^+$-type semiconductor region 32 or the aforementioned n-type emitter region, there is electrically connected the emitter electrode (31B) through the emitter opening 30B. The emitter electrode (31B) is formed of the fourth layer polycrystal silicon film 31. The fourth layer polycrystal silicon film 31 is doped with an n-type impurity (e.g., P) during the deposition or an n-type impurity (e.g., As) after the deposition with a view to reducing the resistance and forming the n$^+$-type semiconductor region 32. In other words, the n$^+$-type semiconductor region 32 or the emitter region is formed by diffusing the n-type impurity, as introduced into the emitter region 31B, into the principal face of the p-type semiconductor region 22. With the emitter electrode 31B, there are electrically connected the lines 35 of the first layer metal film through the connection holes 34 which are formed in the inter-layer insulating film 33.

The aforementioned memory cell M is constructed of a flip-flop circuit composed of two inverter circuits and two transfer MOSFETs Qt1 and Qt2, as shown in FIG. 3 (presenting an equivalent circuit diagram). One inverter circuit is composed of the drive MOSFET Qd1 and the load TFT Qf1. The other inverter circuit is composed of the drive MOSFET Qd2 and the load TFT Qf2.

The aforementioned transfer MOSFET Qt1 is arranged between the storage node (or memory node) portion A of the flip-flop circuit and the data line DL1 and is controlled in operation by the word line WL. On the other hand, the aforementioned transfer MOSFET Qt2 is connected between the storage node (or memory node) portion B of the flip-flop circuit and the data line DL2 and is controlled in operation by the word line WL. One semiconductor region of the transfer MOSFET Qt1 is connected with the storage node portion A whereas the other semiconductor region is connected with the data line DL1, and the gate line of the same is connected with the word line WL. One semiconductor region of the transfer MOSFET Qt2 is connected with the storage node portion B whereas the other semiconductor region is connected with the data line DL2, and the gate electrode of the same is connected with the word line WL.

The individual gate electrodes of the aforementioned drive MOSFET Qd1 and load TFT Qf1 are connected with the storage node portion B of the flip-flop circuit, and the individual gate electrodes of the drive MOSFET Qd2 and the load TFT Qf2 are connected with the storage node portion A of the flip-flop circuit.

With the source region of the aforementioned load TFT Qf1, there is electrically connected the operating power supply line 25A which is fixed at the operating potential (e.g., 3.3 [V]) Vcc. With the source region of the load TFT Qf2, on the other hand, there is electrically connected the operating power supply line 25B which is fixed at the operating potential Vcc.

With the individual source regions of the aforementioned drive MOSFETs Qd1 and Qd2, there are electrically connected the reference power supply line 31A which is fixed at the reference potential (e.g., 0 [V]) Vss.

The capacity element C1 is added to the storage node portion A of the aforementioned flip-flop circuit. Moreover, the capacity element C2 is added to the storage node portion B of the flip-flop circuit.

The aforementioned transfer MOSFET Qt1 is formed, as shown in FIG. 27, in the principal face of the p-type well region 6A which is defined by the field insulating film 7. The gate electrode 13 of the transfer MOSFET Qt1 is formed at the same step as that of the gate electrode 13 of the aforementioned n-channel MOSFET Qn. With the other n$^+$-type semiconductor region 20 of the transfer MOSFET Qt1, there is electrically connected a line 35N of a first layer metal film through the connection holes 34 which are formed in the inter-layer insulating film 33.

The aforementioned transfer MOSFET Qt2 is constructed like the transfer MOSFET Qt1, although not shown.

The aforementioned drive MOSFET Qd2 is formed, although not specifically shown, in the principal face of the p-type well region 6A which is defined by the field insulating film 7. The gate electrode 13 of this drive MOSFET Qd2 is formed at the same step as that of the gate electrode 13 of the aforementioned transfer MOSFET Qt1.

The aforementioned drive MOSFET Qd1 is constructed like the drive MOSFET Qd2, although not shown.

The aforementioned load TFT Qf1 is composed of the channel forming region, the gate insulating film, the gate electrode, the source region and the drain region. The gate electrode is formed of the polysilicon pattern 28 which is formed of the third layer polycrystal silicon film. The channel forming region, the source region and the drain region are formed of the polysilicon pattern 25 which is formed of the second layer polycrystal silicon film. The gate insulating film is formed of the inter-layer insulating film 26 which is formed between the second layer polysilicon pattern 25 and the third layer polysilicon pattern 28. Incidentally, the second layer polysilicon pattern 25 is electrically isolated from the gate electrode 13 by the inter-layer insulating film 23.

The aforementioned load TFT Qf2 is constructed like the load TFT Qf1, although not shown.

The aforementioned operating power supply line 25A is formed of the second layer polysilicon pattern 25. The operating power supply line 25A is electrically connected with the source region of the load TFT Qf1 which is formed in the second layer polysilicon pattern 25. On the other hand, the aforementioned operating power supply line 25B is formed of the second layer polysilicon pattern 25. The operating power supply line 25B is electrically connected with the source region of the load TFT Qf2 which is formed in the second layer polysilicon pattern 25.

The aforementioned capacity element C1 is constructed to have the STC (Stacked Capacitor) structure in which the lower electrode, the dielectric film and the upper electrode are sequentially stacked. The lower electrode is formed of the polysilicon pattern 28 of a third layer polycrystal silicon film and is also used as the gate electrode of the load TFT Qf2. The upper electrode is formed of the polysilicon pattern 31 of a fourth layer polycrystal silicon film and is also used as the reference power supply line (31A). The dielectric film is formed of the inter-layer insulating film 29 which is formed between the third layer polysilicon pattern 28 and the fourth layer polysilicon pattern 31. The inter-layer insulating film 29 is formed of a silicon oxide film, for example.

The aforementioned capacity element C2 is constructed to have the STC (Stacked Capacitor) structure in which the lower electrode, the dielectric film and the upper electrode are sequentially stacked. The lower electrode is formed of the polysilicon pattern 28 and is also used as the gate electrode of the load TFT Qf1. The upper electrode is formed of the polysilicon pattern 31 and is also used as the reference power supply line (31A). The dielectric film is formed of the inter-layer insulating film 29 which is formed between the third layer polysilicon pattern 28 and the fourth layer polysilicon pattern 31.

The aforementioned second layer polycrystal silicon film (or polysilicon pattern 25) is set to a thickness of about 40 [nm], for example. The aforementioned third layer polycrystal silicon film (or polysilicon pattern 28) is set to a thickness of about 50 [nm], for example. The aforementioned fourth layer polycrystal silicon film (or polysilicon pattern 31) is set to a thickness of about 150 [nm] (i.e., 0.15 [μm]), for example. In other words, the semiconductor integrated circuit device of the present embodiment is constructed to have the four-layer polysilicon structure, in which the individual thicknesses of the intermediate layers or the second layer polycrystal silicon film 25 and the third layer polycrystal silicon film 28 between the uppermost or fourth layer polycrystal silicon film 31 and the first layer polycrystal silicon film 11 are set to one half or less of the thickness of the uppermost or fourth layer polycrystal silicon film 31.

Figure 30:
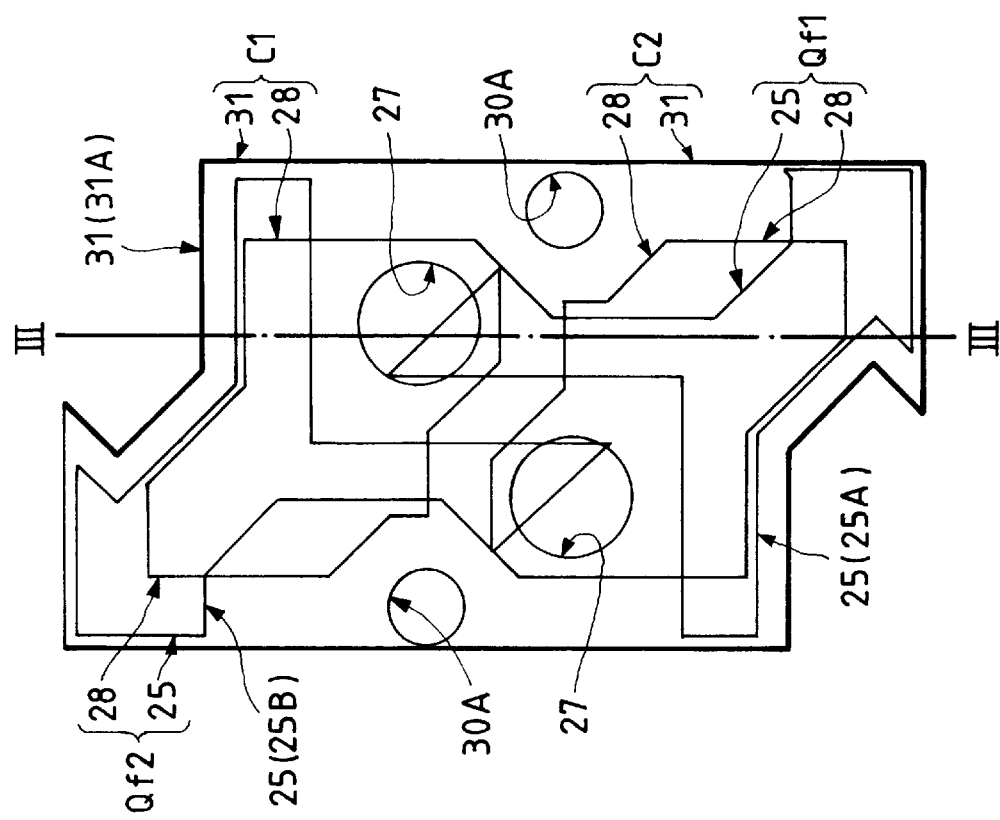
FIG. 30 is a top plan view showing a layout of the memory cell.
Figure 29:
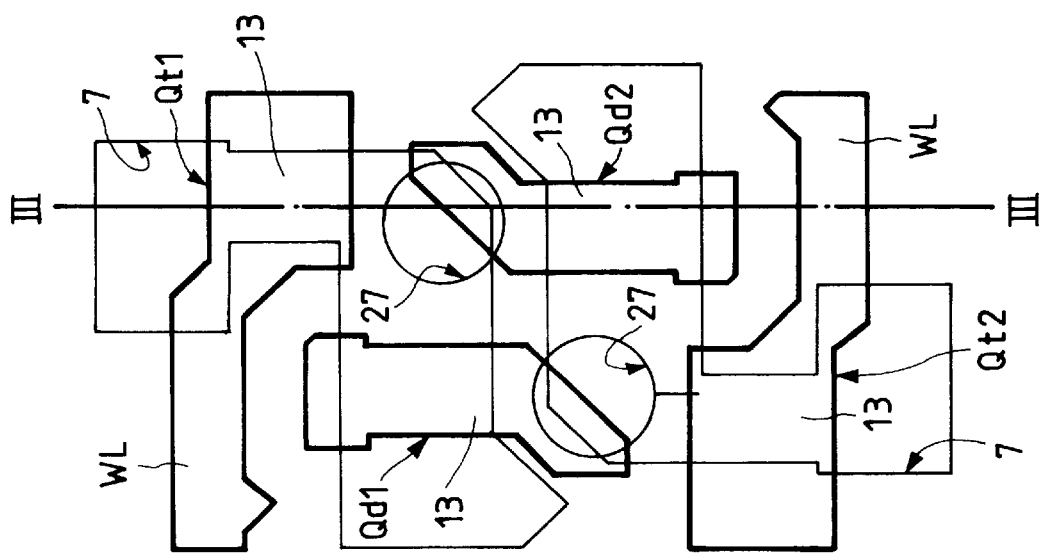
FIG. 29 is a top plan view showing a layout of a memory cell to be mounted on the semiconductor integrated circuit device.
Figure 31:
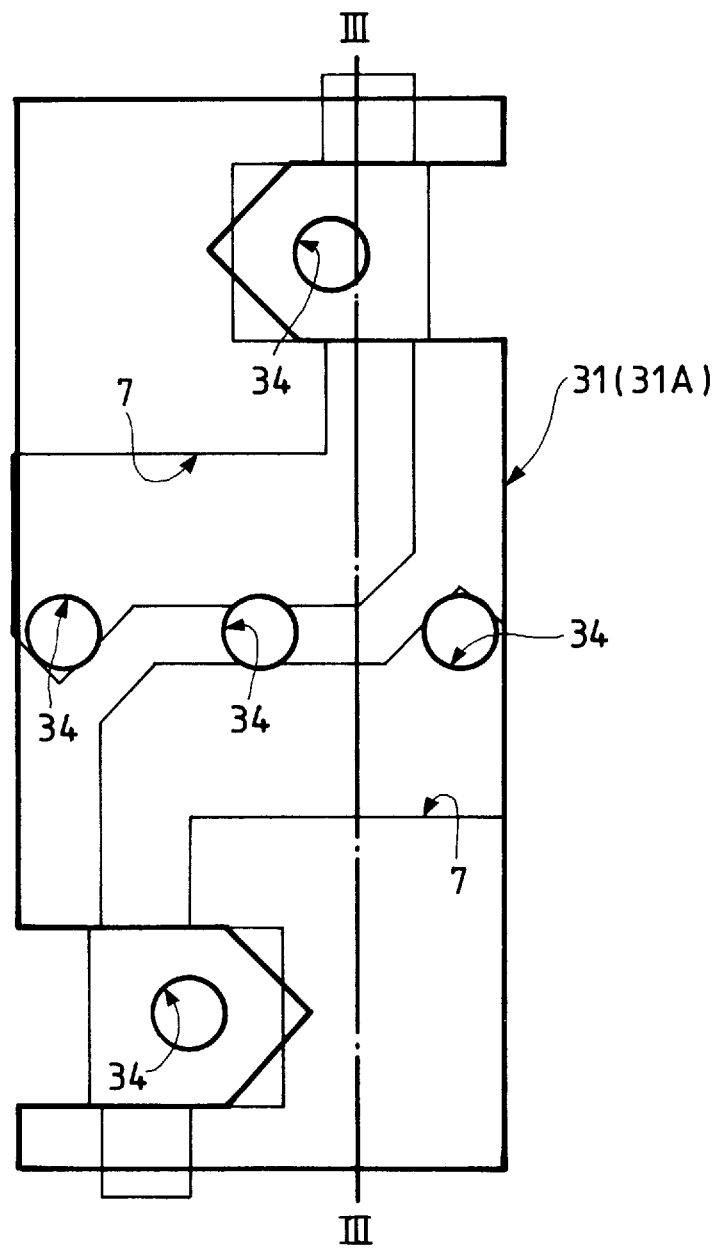
FIG. 31 is a top plan view showing a layout of the memory cell.

The aforementioned transfer MOSFETs Qt1 and Qt2 and drive MOSFETs Qd1 and Qd2 are individually arranged, as shown in FIG. 29 (presenting a top plan layout diagram), and the aforementioned load TFTs Qf1 and Qf2, operating power supply lines 25A and 25B, capacity elements C1 and C2 and reference power supply line 31A are individually arranged, as shown in FIGS. 30 and 31 (presenting top plan layout diagrams). Incidentally, lines III—III appearing in FIGS. 29 to 31 correspond to the section of the memory cell forming region of FIG. 27.

The aforementioned third layer one polysilicon pattern 28 is electrically connected with the second layer one polysilicon pattern 25 for the drain region of the TFT Qf1, the n⁺-type semiconductor region 17 for the gate electrode 13 of the drive MOSFET Qd2 and the drain region of the drive MOSFET Qd1, and one n⁺-type semiconductor region 20 of the transfer MOSFET Qt1 through the connection hole 27, as shown in FIG. 27 and FIGS. 29 and 30 (presenting top plan layout diagrams). In other words, the lower electrode (or polysilicon pattern 28) of the capacity element C1, the gate electrode (or polysilicon pattern 28) of the load TFT Qf2, the gate electrode 13 of the drive MOSFET Qd2, the drain region (or polysilicon pattern 25) of the load TFT Qf1, the drain region of the drive MOSFET Qd1 and one n⁺-type semiconductor region 20 of the transfer MOSFET Qt1 are electrically connected with one another through one connection hole 27.

The aforementioned third layer other polysilicon pattern 28 is electrically connected through the connection hole 27, as shown in FIGS. 29 and 30, with the second layer other polysilicon pattern 25 for the drain region of the load TFT Qf2, the n⁺-type semiconductor region 17 for the gate electrode 13 of the drive MOSFET Qd1 and the drain region of the drive MOSFET Qd2, and one n⁺-type semiconductor region 20 of the transfer MOSFET Qt2. In other words, the lower electrode (or polysilicon pattern 28) of the capacity element C2, the gate electrode (or polysilicon pattern 28) of the load TFT Qf1, the gate electrode 13 of the drive MOSFET Qd1, the drain region (or polysilicon pattern 25) of the load TFT Qf2, the drain region of the drive MOSFET Qd2 and one n⁺-type semiconductor region 20 of the transfer MOSFET Qt2 are electrically connected with one another through one connection hole 27.

The aforementioned fourth layer polysilicon pattern 31 covers the second layer polysilicon pattern 25 and the third layer polysilicon pattern 28, as shown in FIGS. 27 and 30. In other words, the second layer polycrystal silicon film 25 and the third layer polycrystal silicon film 28 are individually covered with the fourth layer polycrystal silicon film 31 in the memory cell forming region.

With the aforementioned fourth layer polysilicon pattern 31, as shown in FIG. 27, there are electrically connected lines 35L of a first layer metal film through the connection holes 34 which are formed in the inter-layer insulating film 33. In other words, the reference power supply line (or polysilicon pattern 31) 31A is backed for each memory cell with the lines 35L which are formed thereover.

Figure 32:
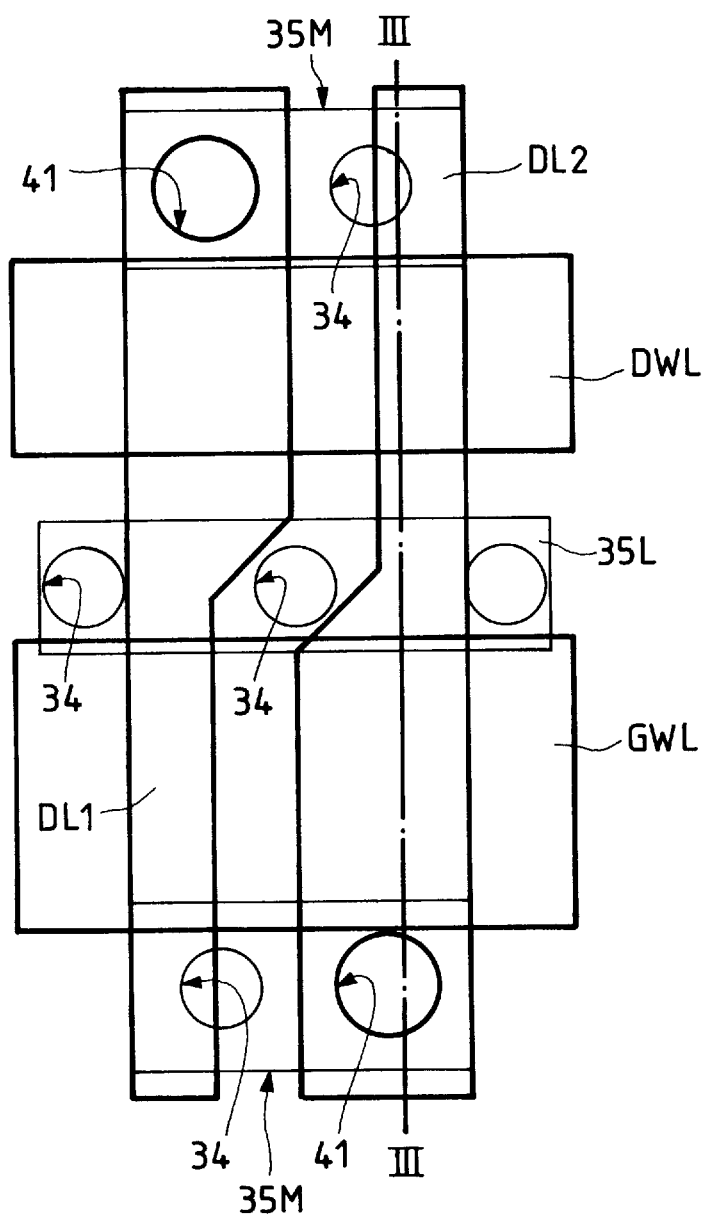
FIG. 32 is a top plan view showing a layout of the memory cell.

Over the aforementioned firs t layer lines 35L, as shown in FIG. 27, there is formed the inter-layer insulating film 36. Over this inter-layer insulating film 36, as shown in FIG. 27 and FIG. 32 (presenting a top plan layout diagram), there are individually formed the data lines DL1 and DL2 which are made of the second layer metal film. This second layer metal film is constructed like the aforementioned first layer metal film to have the three-layer structure in which the lower TiW film (or TiN film), the intermediate aluminum alloy film and the upper TiW film (or TiN film) are sequentially stacked.

Incidentally, line III—III appearing in FIG. 32 corresponds to a section of FIG. 27 in the memory cell forming region.

The afore mentioned second layer data lines DL1 and DL2 are individually formed thereover an inter-layer insulating film 38, as shown in FIG. 27. This inter-layer insulating film 38 is provided with a divided word line DWL (Divided Word Line) and a main word line GWL (Global Word Line) formed of the third layer metal film, as shown in FIGS. 27 and 32. The divided word line DWL is electrically connected with the word line WL, which is integrated into the individual gate electrodes 13 of the aforementioned transfer MOSFETs Qt1 and Qt2, although not shown, and is also used as the backing line of the word line WL. The third layer metal film is constructed like the aforementioned first layer metal film to have the three-layer structure, in which the lower TiW (or TiN film), the intermediate aluminum alloy film and the upper TiW film (or TiN film) are sequentially stacked.

The aforementioned third layer divided word line DWL and main word line GWL are individually covered with the final passivation film 37 formed of a silicon nitride film, for example. In short, the semiconductor integrated circuit device of the present embodiment is constructed of the three-layer metal line structure.

With the aforementioned second layer data line DL2, as shown in FIG. 32, there is electrically connected one line 35M through a connection hole 41 which is formed in the inter-layer insulating film 36. The one line 35M is electrically connected with one $n^+$-type semiconductor region 20 of the transfer MOSFET Qt1. With the second layer data line DL1, on the other hand, as shown in FIG. 32, there is electrically connected the other line 35M through the connection hole 41 which is formed in the inter-layer insulating film 36. The other line 35M is electrically connected with one $n^+$-type semiconductor region 20 of the transfer MOSFET Qt2.

The aforementioned inter-layer insulating films 36 and 38 are individually constructed, although not shown, to have the three-layer structure in which the lower silicon oxide film, the intermediate silicon oxide film and the upper silicon oxide film are sequentially stacked, for example. The lower silicon oxide film is formed, for example, by the plasma CVD method using tetraethoxysilane (TEOS) gas (or organic silane) as the major component of the source gas. This plasma CVD method using the TEOS gas can form a silicon oxide film having a dense and excellent film quality. The intermediate silicon oxide film is applied, for example, by the SOG (Spin On Glass) method, i.e., the rotary application method with a main view to flattening the inter-layer insulating film and is then subjected to the baking treatment and the overall etching-back treatment. The upper silicon oxide film is formed like the lower silicon oxide film by the plasma CVD method using the TEOS gas. The aforementioned inter-layer insulating film 33 is formed, for example, by stacking the CVD silicon oxide film and the BPSG (Boron Phospho Silicate Glass) film sequentially.

Figure 33:
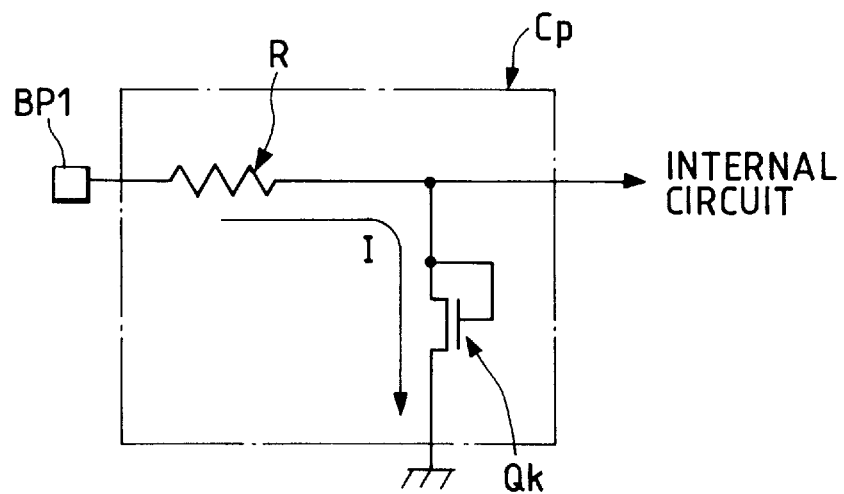
FIG. 33 is an equivalent circuit diagram showing an electrostatic breakdown preventing circuit to be mounted on the semiconductor integrated circuit device.
Figure 34:
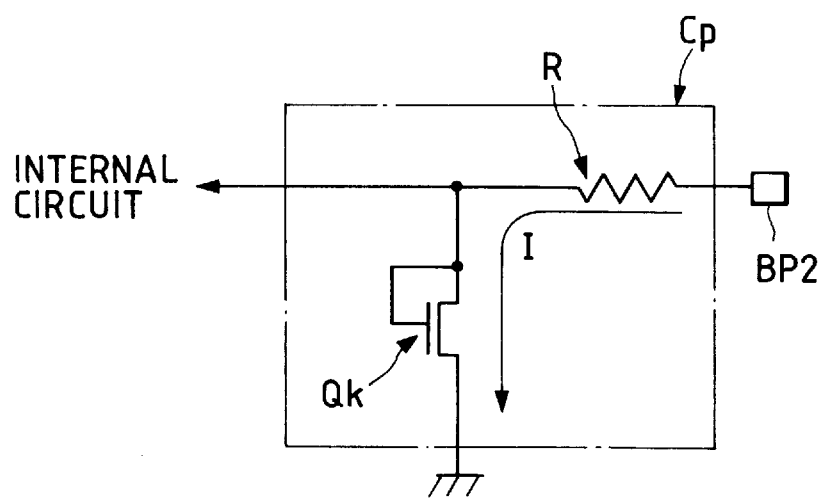
FIG. 34 is an equivalent circuit diagram showing an electrostatic breakdown preventing circuit to be mounted on the semiconductor integrated circuit device.

In the aforementioned semiconductor integrated circuit device, as shown in FIG. 33 (presenting an equivalent circuit diagram), an electrostatic breakdown preventing circuit Cp is arranged at the connection path between an inputting external terminal BP1 and an internal circuit. In the semiconductor integrated circuit device, moreover, as shown in FIG. 34 (presenting an equivalent circuit diagram), the electrostatic breakdown preventing circuit Cp is arranged at the connection path between an internal circuit and an outputting external terminal BP2. This electrostatic breakdown circuit Cp is arranged to prevent the so-called "electrostatic breakdown" in which the excessive static electricity, as charged in the human body, the package or the device during the manual handling or the assembling process, might otherwise flow as the surge current to the internal circuit through the inputting external terminal BP1 and the outputting external terminal BP2. The electrostatic breakdown preventing circuit Cp is generally composed of a protective resistance element R for reducing the surge current and a MOSFET Qk for extracting the surge current to the substrate.

The MOSFET Qk is formed, as shown in FIG. 28, in the principal face of the p-type well region 6B which is defined by the field insulating film 7. This MOSFET Qk is formed mainly of the channel forming region (or p-type well region 6B), the gate insulating film 10, and the paired n-type semiconductor regions 17 for the source region and the drain region. In short, the MOSFET Qk is constructed like the aforementioned MOSFET Qd2 to have the n-channel conduction type single drain structure. The MOSFET Qk of this single drain structure can set a lower punch-through withstand voltage between the source region and the drain region than that of the MOSFET of the LDD structure thereby to extract the surge current easily to the substrate.

Figure 35:
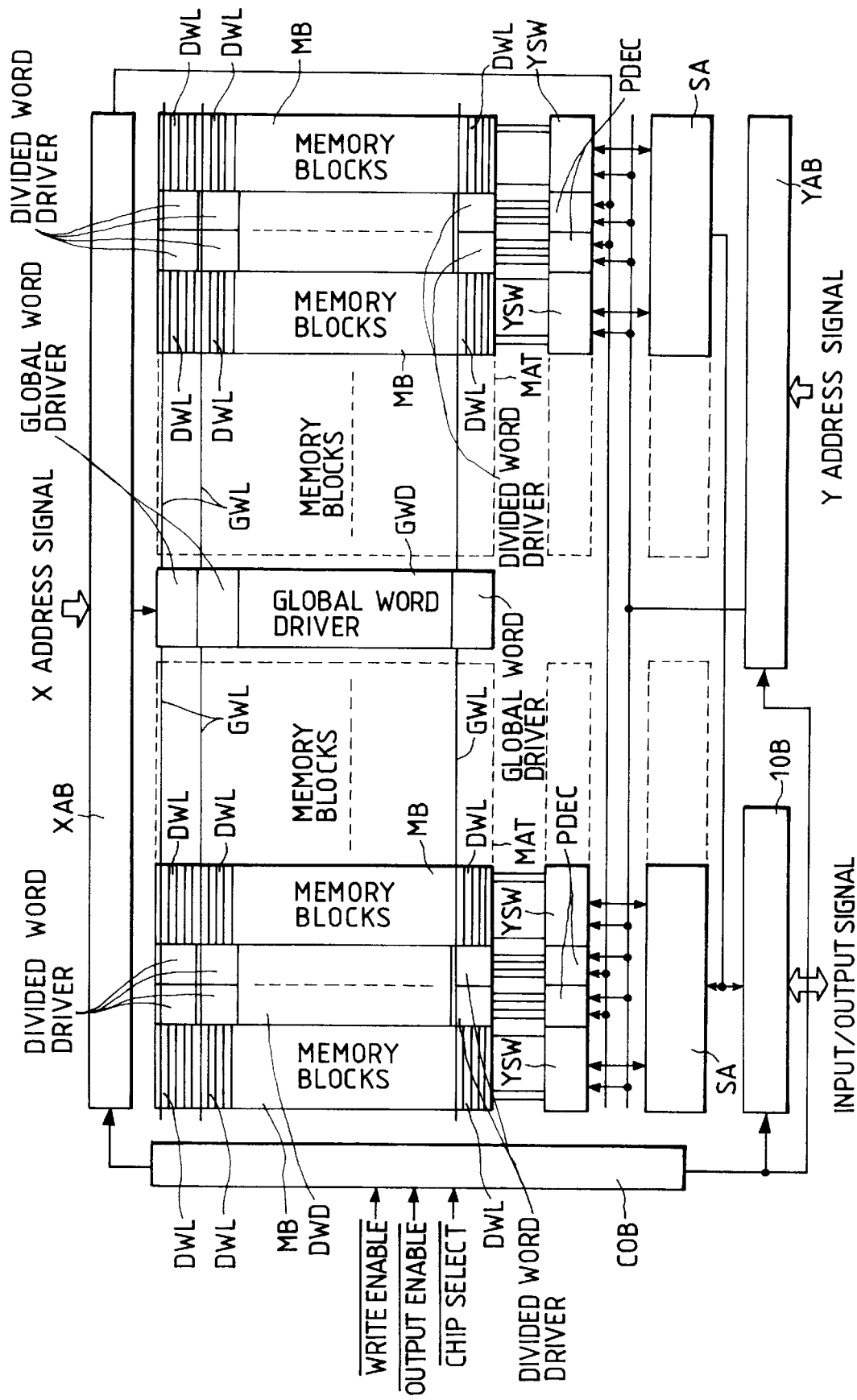
FIG. 35 is a block diagram showing the semiconductor integrated circuit device.

The aforementioned semiconductor integrated circuit device is constructed, as shown in FIG. 35 (presenting a block diagram), of a control buffer circuit unit COB, an X-address buffer circuit unit XAB, an input/output buffer circuit unit IOB, a Y-address buffer circuit unit YAB, a Y-switch circuit unit YSW, a predecoder circuit unit PDEC, a sense amplifier circuit unit SA, and two memory mats MAT. A main word driver circuit unit (Global Word Driver) GWD is arranged between the two memory mats MAT.

To the aforementioned control buffer circuit unit COB, there are inputted through external terminals a write enable signal, an output enable signal and a chip select signal. To the aforementioned X-address buffer circuit unit XAB, there is inputted through an external terminal an X-address signal. To the aforementioned input/output buffer circuit unit IOB, there is inputted through an external terminal an input/output signal. To the aforementioned Y-address buffer circuit unit YAB, there is inputted through an external terminal a Y-address signal.

Figure 36:
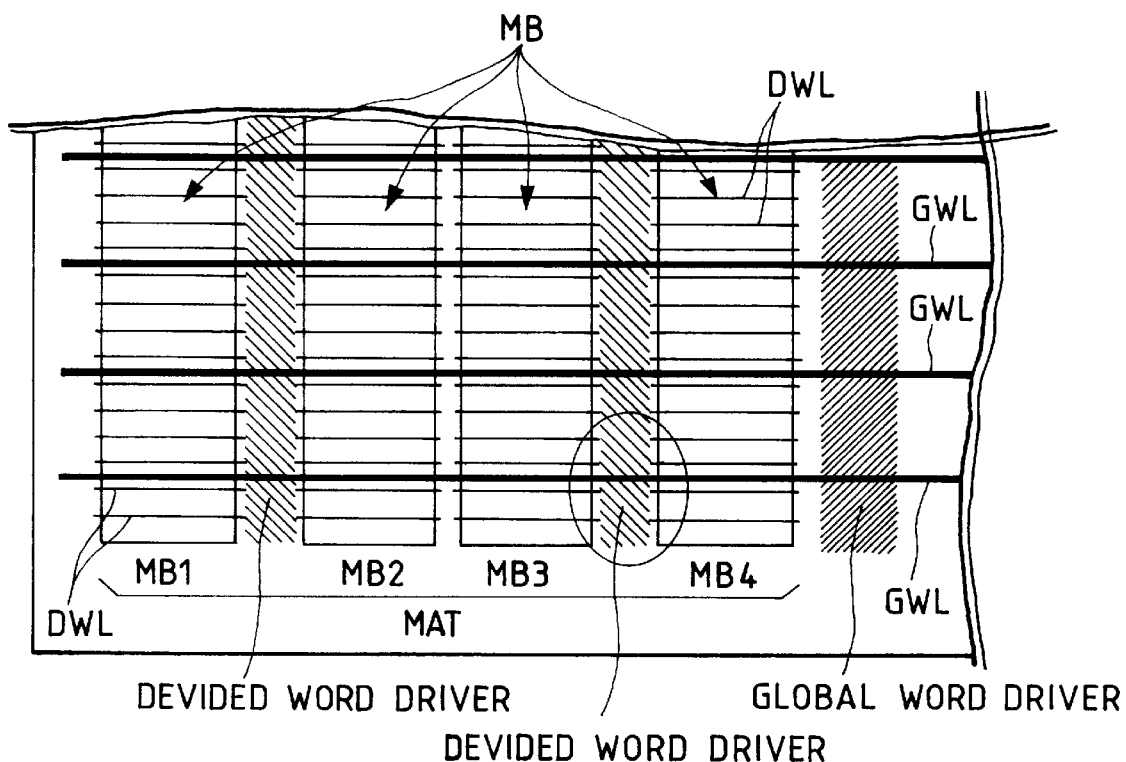
FIG. 36 is an enlarged block diagram showing an essential portion of FIG. 35.

Each of the aforementioned two memory mats MAT is constructed of four memory blocks MB, as shown in FIG. 35 and FIG. 36 (presenting an expanded block diagram of an essential portion of FIG. 35). A DWD (Divided Word Driver) circuit unit is arranged between memory blocks MB1 and MB2 of those four memory blocks MB, and a divided word driver circuit unit DWD is arranged between a memory block MB3 and a memory bLock MB4.

Each of a plurality of the aforementioned memory blocks MB is provided with a plurality of the aforementioned memory cells M. Moreover, each of the memory blocks MB is equipped with a plurality of the aforementioned divided word lines DWL. These divided word lines DWL are individually extended in the X-direction. On the other hand, each of the memory blocks MB is equipped with a plurality of the aforementioned main word lines GWL. These main word lines GWL are individually extended across the individual memory blocks MB in the X-direction. Moreover, each of the memory blocks MB is equipped with pluralities of the aforementioned data lines DL1 and DL2, although not shown. These data lines DL1 and DL2 are individually extended in the Y-direction.

Figure 37:
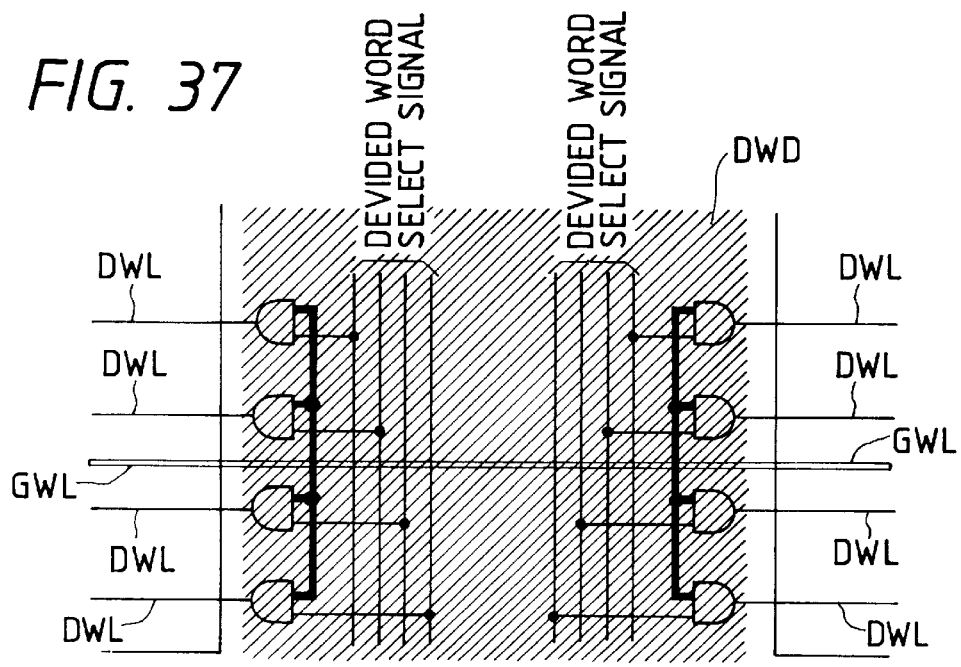
FIG. 37 is an enlarged block diagram showing an essential portion of FIG. 35.

Here will be described the operations of the aforementioned semiconductor integrated circuit device with reference to FIG. 35, FIG. 36 and FIG. 37 (presenting an enlarged block diagram of an essential portion of FIG. 36).

When the data (or information) stored in the memory cell M are to be read out, a logic of the output of the X-address buffer circuit unit XAB is taken by the main word driver circuit unit GWD to select the main word line GWL. The logic of the selected main word line GWL and the select signal of the X-address buffer circuit XAB, as having passed through the predecoder circuit unit PDEC, is taken by the divided word driver circuit unit DWD to select the individual divided word lines DWL. By the Y-address buffer circuit unit YAB, on the other hand, a column to be read out is selected into a read state so that the memory cell M is selected. The data of the memory cell M, as read out, are amplified through the data lines by the sense amplifier unit AS and are turned into an output signal through the input/output buffer circuit unit IOB. Incidentally, the description of the writing operation of the data is omitted.

Thus, effects similar to those of the foregoing Embodiment 1 can be achieved according to the present Embodiment 2.

[Embodiment 3]

Figure 38:
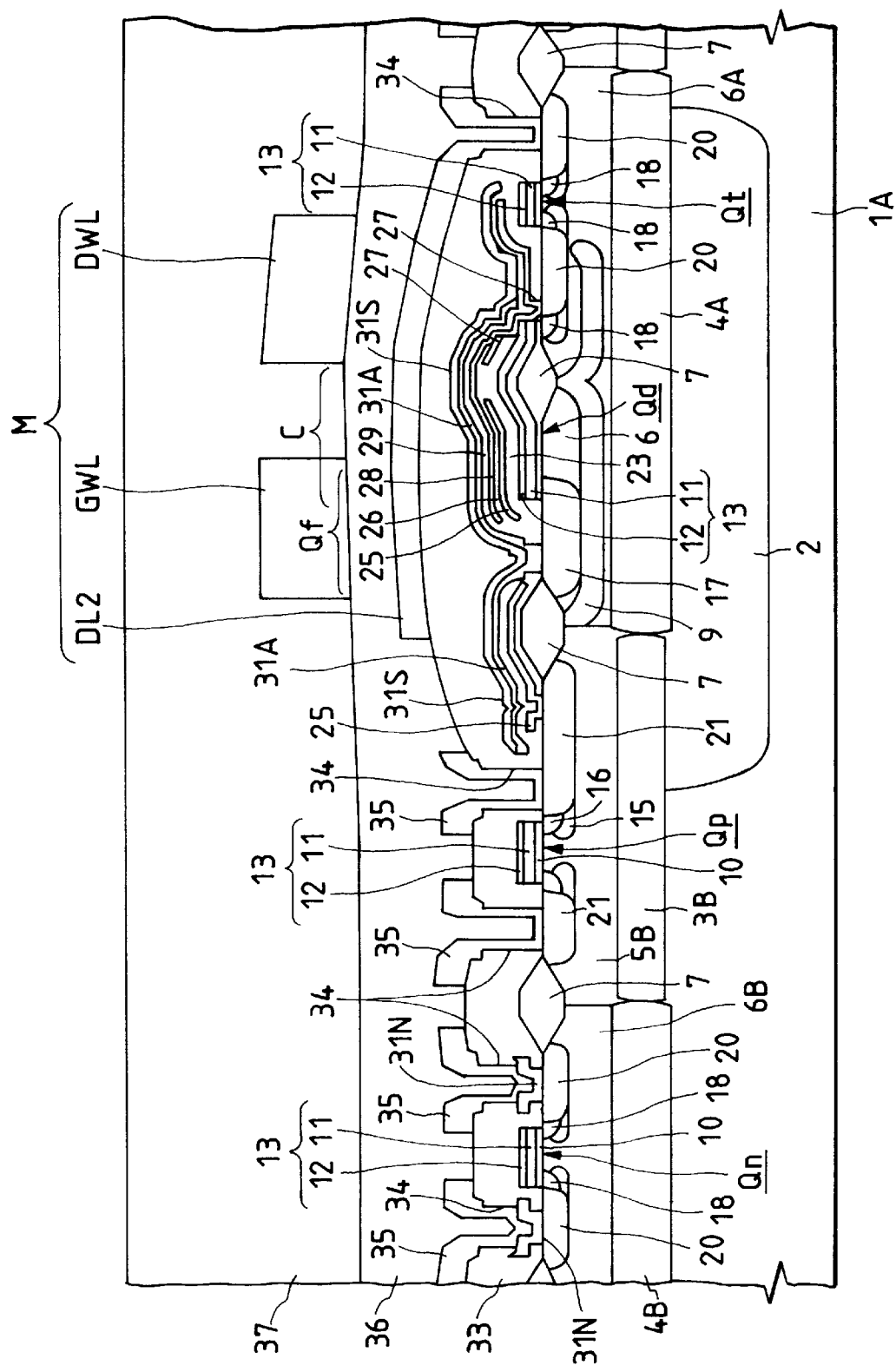
FIG. 38 is a section showing an essential portion of a semiconductor integrated circuit device according to Embodiment 3 of the present invention.
Figure 39:
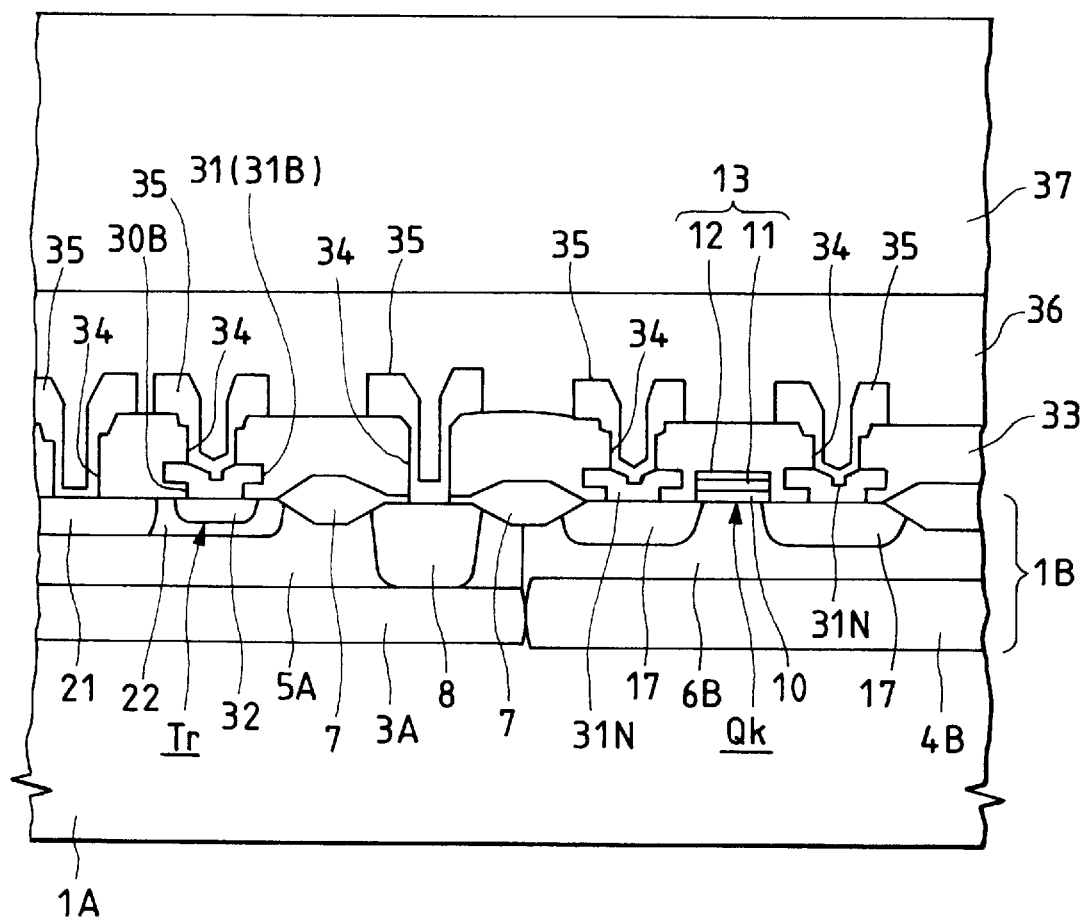
FIG. 39 is a section showing an essential portion of the semiconductor integrated circuit device.

A schematic construction of the semiconductor integrated circuit device according to Embodiment 3 of the present invention is shown in FIG. 38 (presenting a section of an essential portion) and in FIG. 39 (presenting a section of an essential portion). Incidentally, the hatching (or parallel oblique lines) is omitted from the sections of FIGS. 38 and 39 for easy illustrations.

Figure 40:
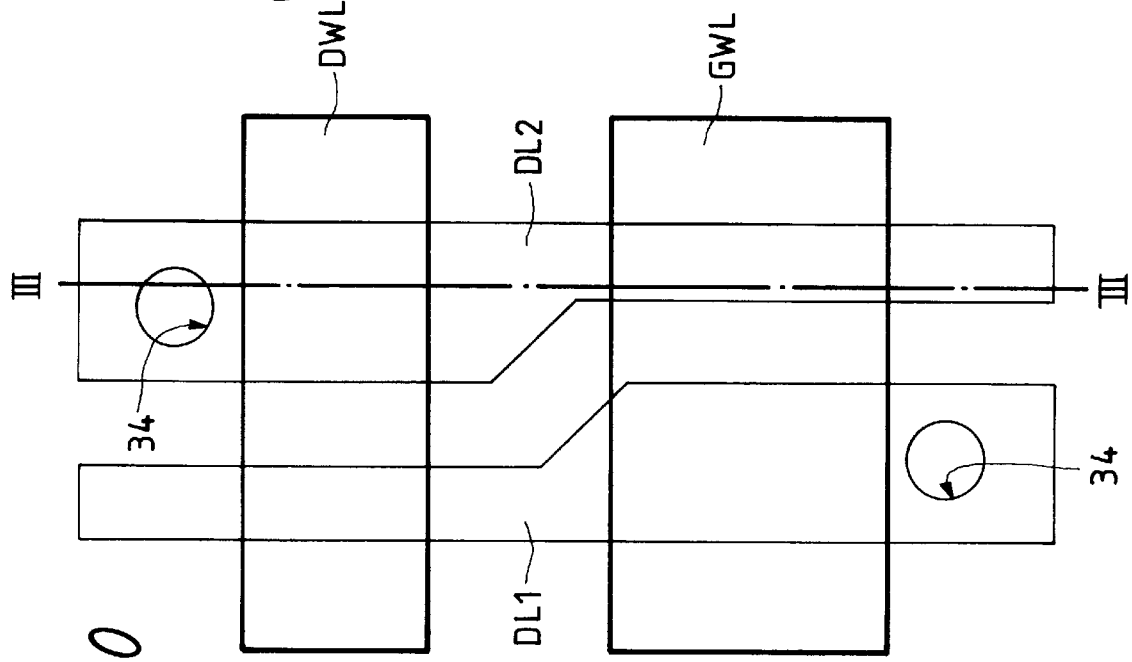
FIG. 40 is a top plan view showing a layout of a memory cell to be mounted on the semiconductor integrated circuit device.

As shown in FIGS. 38 and 39, the semiconductor integrated circuit device of the present embodiment is constructed to have a two-layer metal line structure. The lines 35 are formed of a first layer metal film. Moreover, the data lines DL1 and DL2, as shown in FIG. 38 and FIG. 40 (presenting a top plan layout diagram), are individually formed of the first layer metal film. On the other hand, the divided word line DWL and the main word line GWL are individually formed of a second layer metal film.

Figure 41:
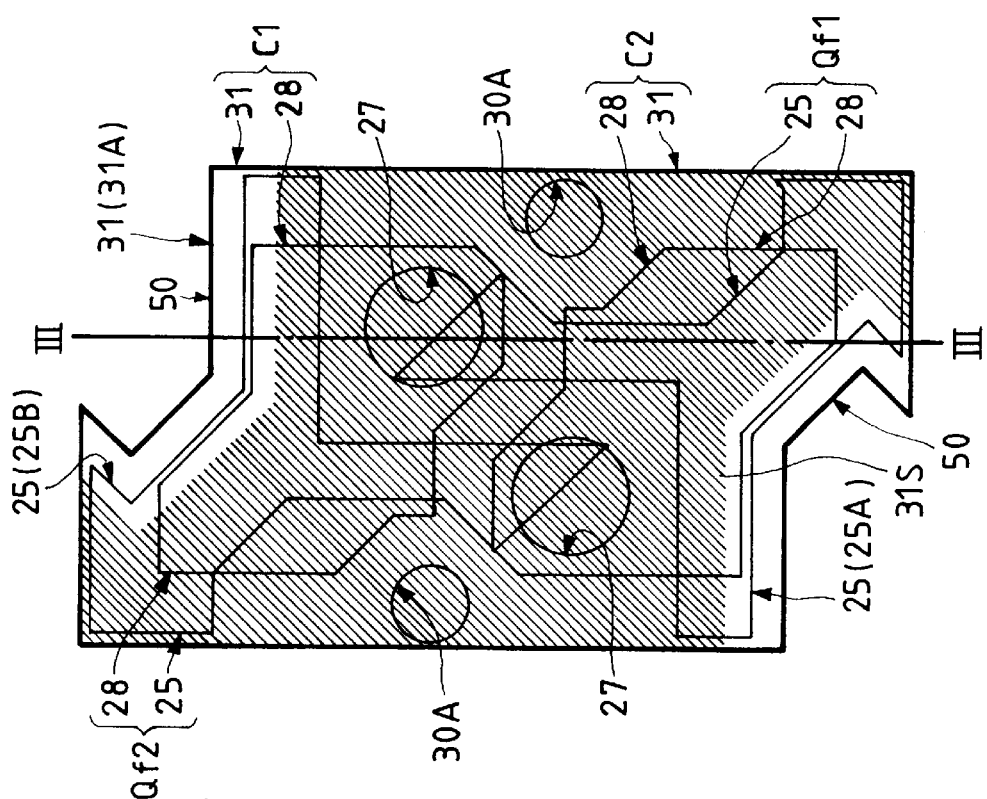
FIG. 41 is a top plan view showing a layout of the memory cell.

In the memory cell forming region of the aforementioned semiconductor integrated circuit device, as shown in FIG. 38 and FIG. 41 (presenting a top plan layout diagram), the silicide layer 31S is formed over the surface of the reference power supply line 31A. In other words, this reference power supply line 31A is formed of the fourth layer polycrystal silicon film 31 and the silicide layer 31S formed over the surface of the former. On the other hand, the individual upper electrodes of the capacity elements C1 and C2 are formed of the fourth layer polycrystal silicon film 31 and the silicide layer 31 formed over the surface of the former. Incidentally, the silicide layer 31S is not formed over the surface of the emitter electrode 31B of the bipolar transistor Tr.

Figure 42:
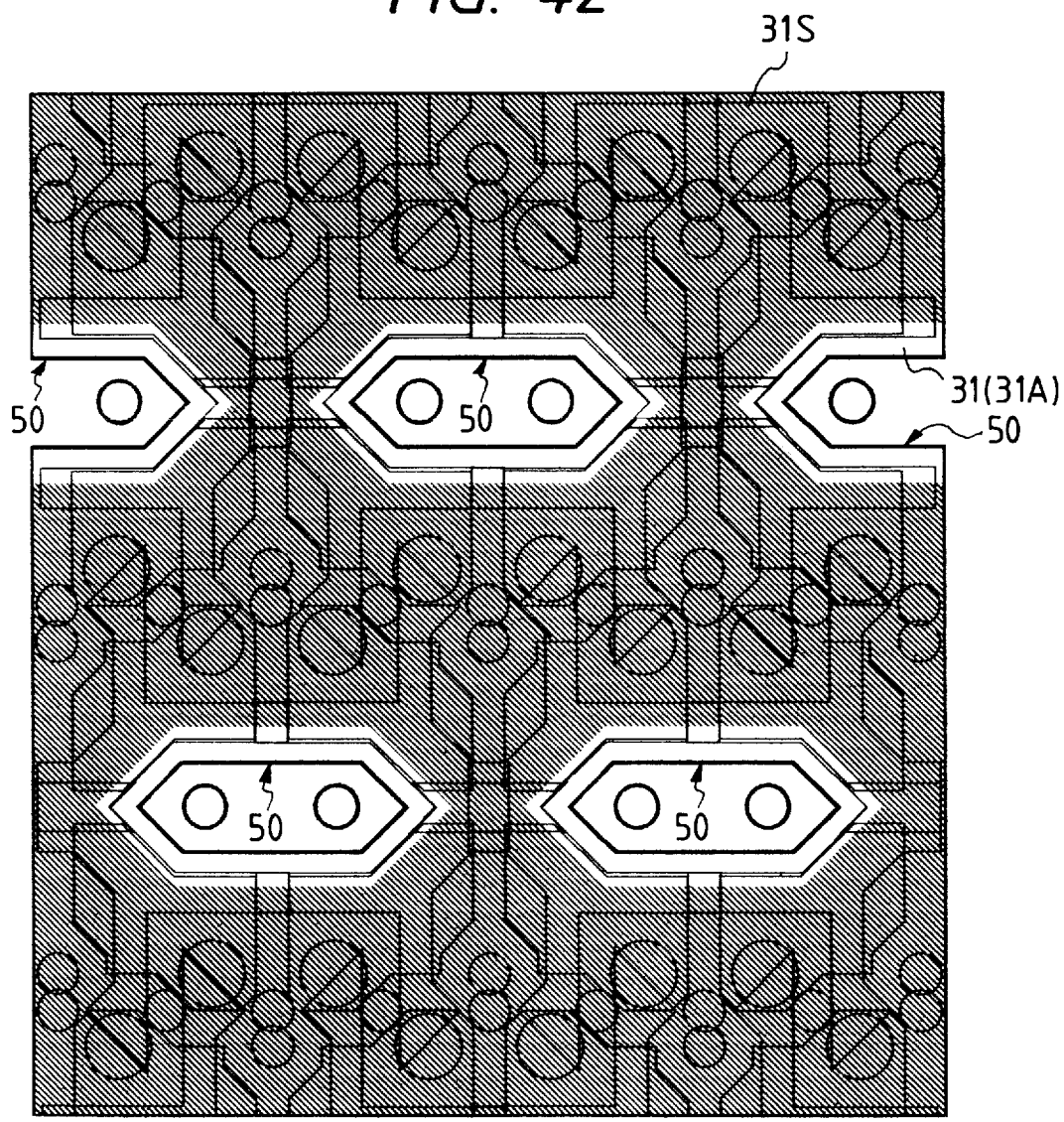
FIG. 42 is a top plan view showing reference power supply lines to be mounted on the semiconductor integrated circuit device.

The aforementioned reference power supply line 31A is formed, as shown in FIG. 42 (presenting a top plan pattern diagram), all over the memory block MB and is provided with slits 50 for connecting the other semiconductor region of the transfer MOSFET and the data lines electrically.

The aforementioned silicide layer 31S is formed, as shown in FIG. 41, all over the (hatched) area except for the edges (i.e., the regions in the neighborhood of the slits 50) of the reference power supply lines 31A.

Next, the process for manufacturing the aforementioned semiconductor integrated circuit device will be described with reference to FIGS. 43 to 48 (presenting sections of essential portions). Incidentally, the hatching (or parallel oblique lines) is omitted from the sections of FIGS. 43 to 48 for easy illustrations.

Figure 43:
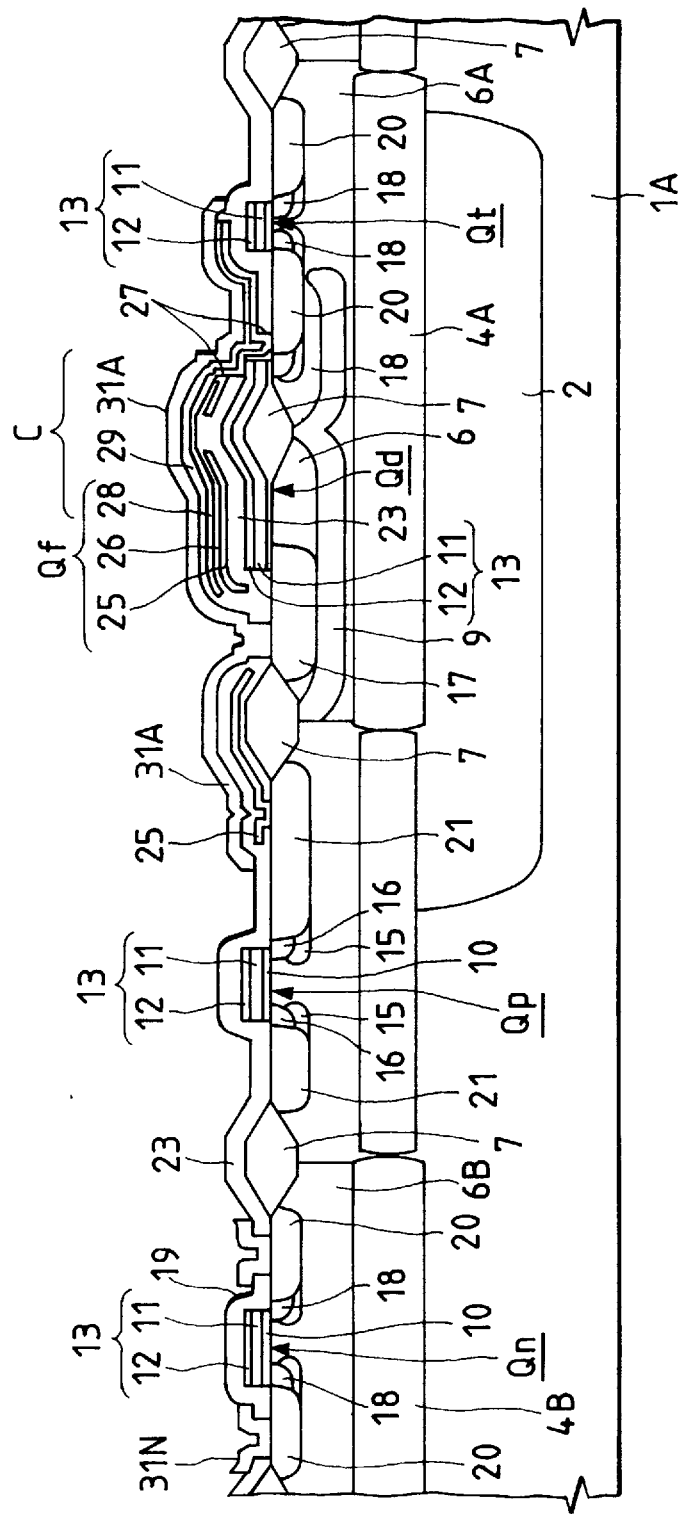
FIG. 43 is a section showing an essential portion for explaining a process for manufacturing the semiconductor integrated circuit device.
Figure 44:
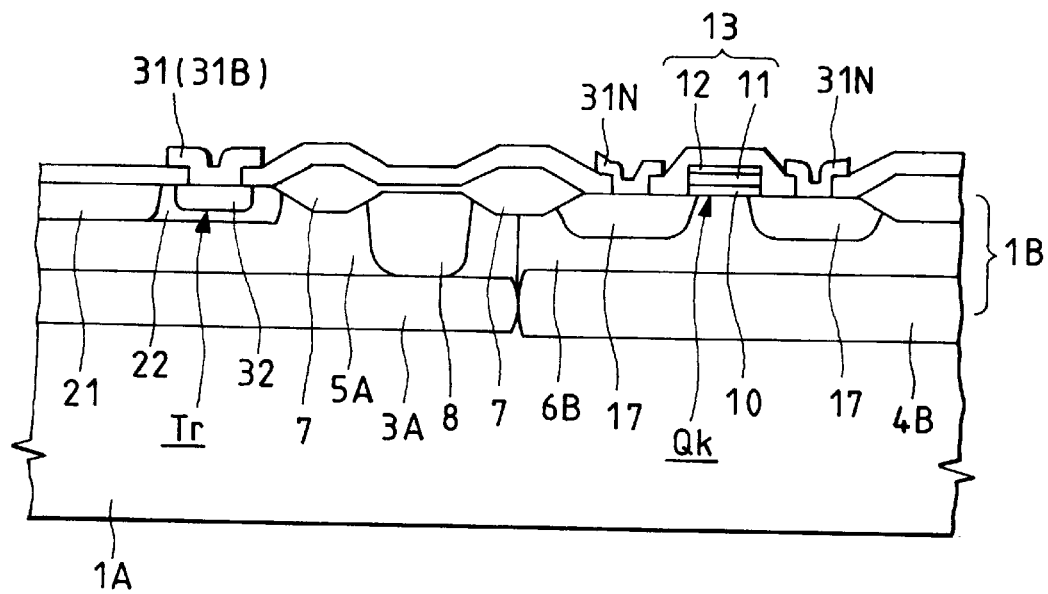
FIG. 44 is a section showing an essential portion for explaining a process for manufacturing the semiconductor integrated circuit device.

First of all, by a manufacture process similar to that of the foregoing Embodiment 1, there are formed over the principal face of the p$^-$-type semiconductor substrate 1A the n-channel MOSFET Qn, the p-channel MOSFET Qp, the transfer MOSFETs Qt1 and Qt2, the drive MOSFETs Qd1 and Qd2, the reference power supply lines 31A, the load TFTs Qf1 and Qf2, the capacity elements C1 and C2, the bipolar transistor Tr, and the MOSFET Qk of the electrostatic breakdown preventing circuit. The manufacture steps up to this step are shown in FIGS. 43 and 44.

Next, a thin insulating film (or the dielectric film of a capacity element C) 39 is formed all over the substrate over the surfaces of the aforementioned reference power supply lines 31A and the emitter electrode 31B of the bipolar transistor Tr. The insulating film 39 is formed of a silicon oxide film, for example.

Next, there is formed a mask 40 which has openings in the region of the aforementioned reference power supply lines 31A. The mask 40 is formed of a photo resist film, for example. This mask 40 covers the edges (in the neighborhood of the slits) of the reference power supply lines 31A.

Figure 46:
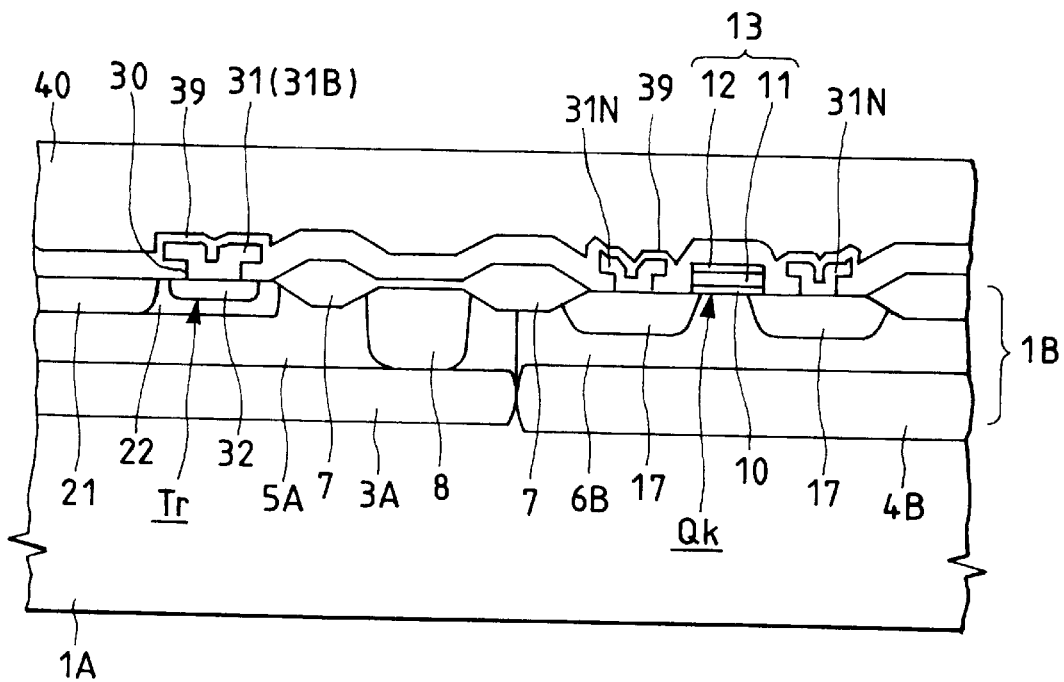
FIG. 46 is a section showing an essential portion for explaining a process for manufacturing the semiconductor integrated circuit device.
Figure 45:
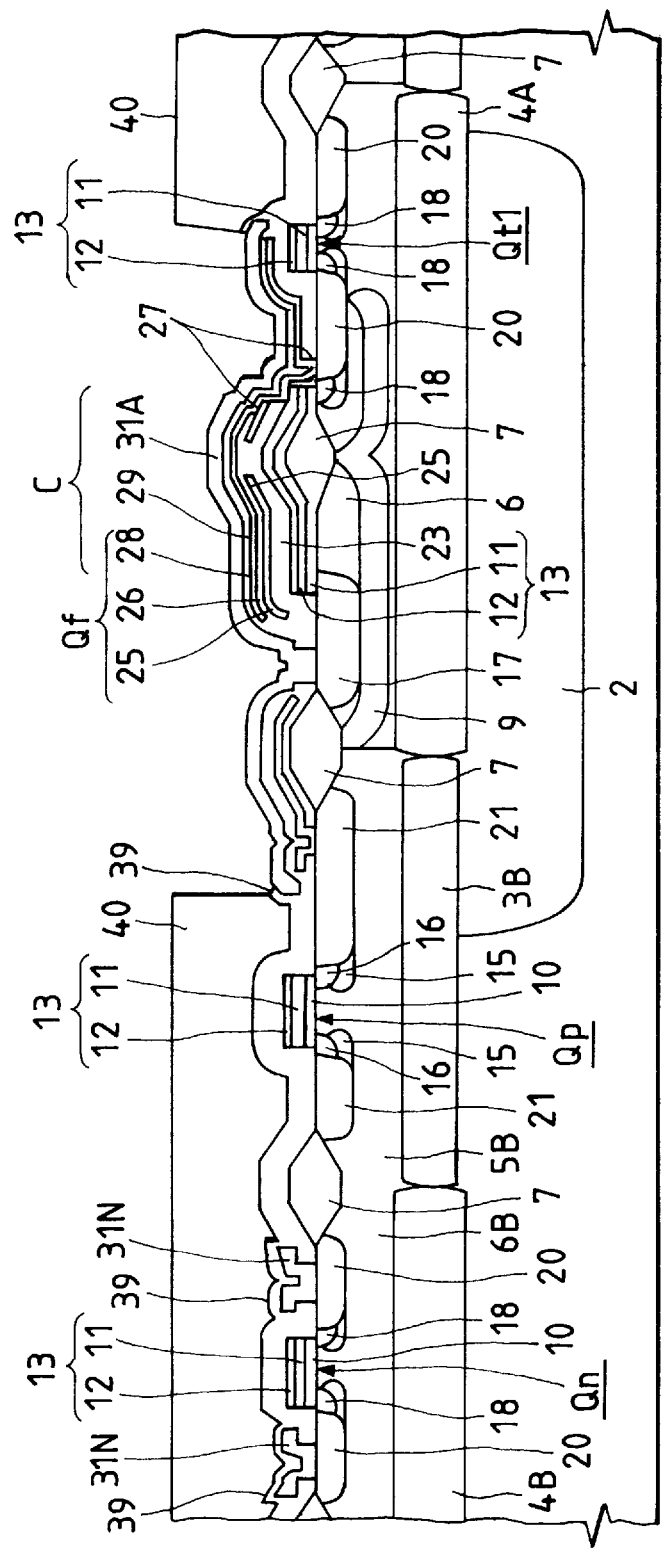
FIG. 45 is a section showing an essential portion for explaining a process for manufacturing the semiconductor integrated circuit device.

Next, the mask 40 is used as the etching mask to pattern the aforementioned insulating film 39 thereby to remove the insulating film 39 from the reference power supply lines 31A. At this step, the edges of the reference power supply lines 31A are covered with the insulating film 39. The surface of the emitter electrode 31B of the bipolar transistor Tr is also covered with the insulating film 39. Moreover, the surfaces of the individual electrodes 31N of the n-channel MOSFET Qn and MOSFET Qk are covered with the insulating film 39. The steps up to this one are shown in FIGS. 45 and 46.

Next, the aforementioned mask 40 is removed.

Next, refractory metal films including a titanium (Ti) film, a tungsten (W) film and a molybdenum (Mo) film are formed all over the surface of the substrate over the aforementioned reference power supply lines 31A. In the present embodiment, the refractory metal film to be used is exemplified by the Ti film and is deposited by the sputtering method.

Next, a low-temperature heat treatment at about 500° to 600 [° C.] is performed in the nitrogen atmosphere to cause a reaction between the Si of the reference power supply lines 31A and the Ti of the refractory metal film thereby to form the silicide film 31S over the surfaces of the reference power supply lines 31A. At this step, the edges of the reference power supply lines 31A are covered with the insulating film 39 so that the silicide layer 31S is not formed at the edges of the reference power supply lines 31A. Moreover, the surface of the emitter electrode 1B of the bipolar transistor Tr is covered with the insulating film 39 so that the silicide layer 31S is not formed over the surface of the emitter electrode 31B. In short, the silicide layer 31S is formed in self-alignment with the insulating film 39. Moreover, the Ti film over the insulating film 39 is turned into the TiNx film by the low-temperature heat treatment in the nitrogen atmosphere at this time.

Next, the TiNx film over the aforementioned insulating film 39 is selectively removed by the wet etching method, for example.

Figure 47:
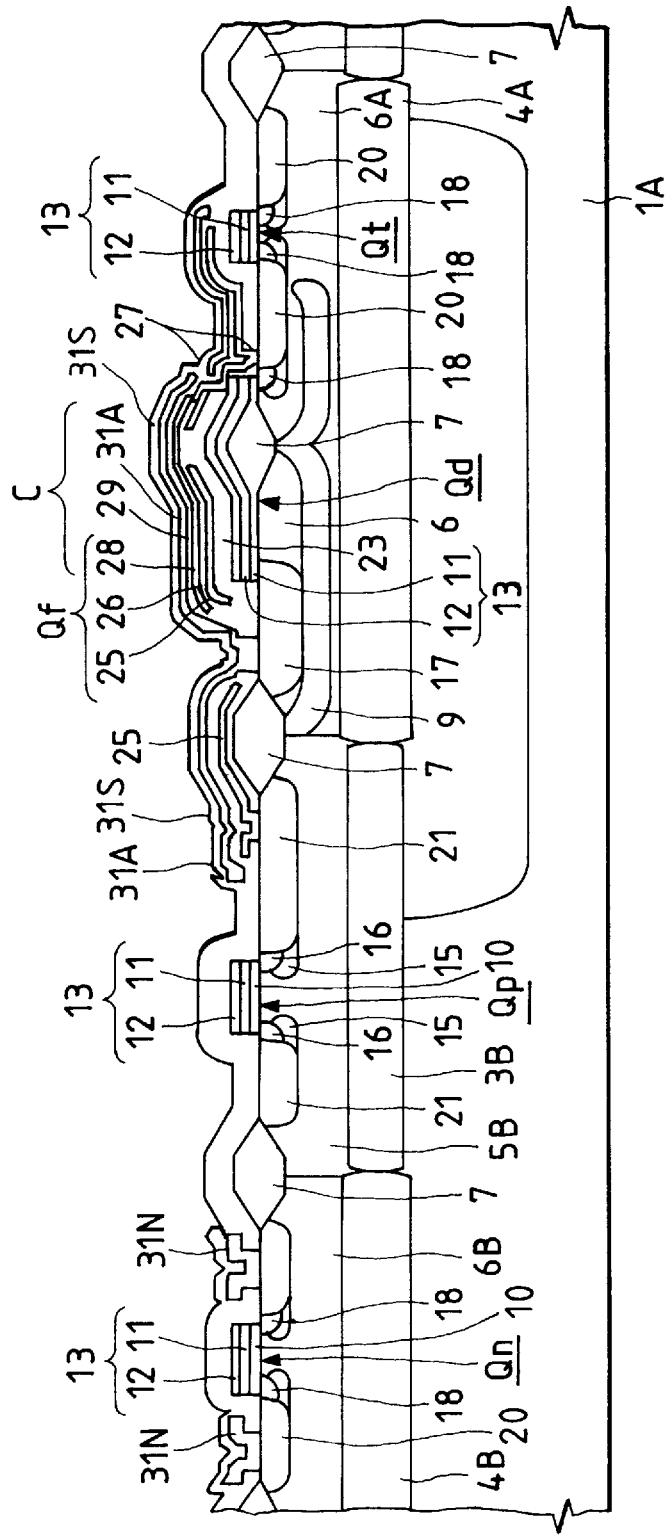
FIG. 47 is a section showing an essential portion for explaining a process for manufacturing the semiconductor integrated circuit device.
Figure 48:
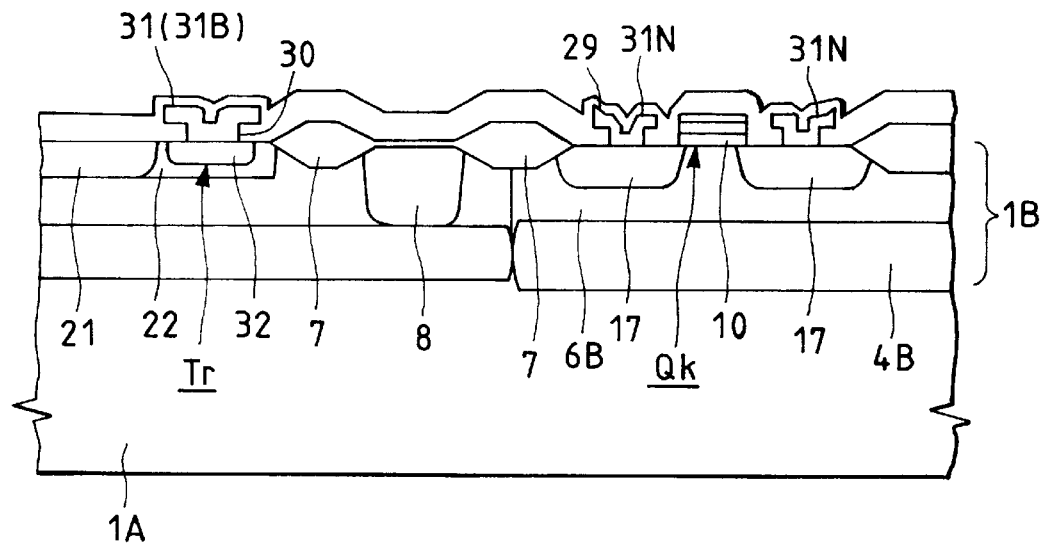
FIG. 48 is a section showing an essential portion for explaining a process for manufacturing the semiconductor integrated circuit device.

Next, a high-temperature treatment of about 900° to 1,000 [° C.] is performed to promote the reaction of the silicide layer 31S thereby to reduce the resistance of the same. Incidentally, the silicide layer 31S has a sheet resistance of about 5 Ω/□, and the doped polycrystal silicon film 31 has a sheet resistance of about 200 Ω/□. At this silicifying step, the fourth layer polycrystal silicon film 31 is not silicified throughout its thickness but leaves itself below the silicide layer 31S. In other words, the silicide layer 31S is left over the surface of the fourth layer polycrystal silicon film 31. If the fourth layer polycrystal silicon film 31 is silicified throughout its thickness, the quality of the dielectric film 29 of the underlying capacity element may be deteriorated by contaminations or the like. By thus forming the silicide layer 31S over the fourth layer polycrystal silicon film 31, however, the deterioration of the dielectric film 29, as might otherwise be caused by the silicification, can be prevented. The steps up to this one are shown in FIGS. 47 and 48.

Next, the semiconductor integrated circuit device of the present embodiment, as shown in FIGS. 38 and 39, is substantially completed by forming the inter-layer insulating film 33, the connection holes 34, the wiring lines 35 of the first layer metal film, the data lines DL1 and DL2 of the first layer metal film, the inter-layer insulating film 36, the divided word line DWL, the main word line GWL and the final passivation film 37.

Thus, effects similar to those of the foregoing Embodiment 1 can be achieved according to the present Embodiment 3.

Moreover, the resistance of the reference power supply lines 31A can be reduced by forming the silicide layer 31S over the surfaces of the same. As a result, the reference power supply lines 31A need not be backed unlike the foregoing Embodiment 2 with the lines 35 of the second layer metal film so that these backing lines 35 can be eliminated. Thus, The word lines DL1 and DL2 can be formed of the first layer metal film whereas the divided word line DWL and the main word line GWL can be formed of the second layer metal film, so that the semiconductor integrated circuit device can be constructed of the two-layer metal line structure. As a result, the number of manufacture steps can be reduced, as compared with the three-layer metal line structure, to an extent corresponding to one inter-layer insulating film (of the three-layer structure) and one metal film (of the three-layer structure), so that the production yield of the semiconductor integrated circuit device can be enhanced.

A process for manufacturing the semiconductor integrated circuit device including the memory cell M, in which the capacity element C is added to the storage node portion of the inverter circuit composed of the drive MOSFET Qd and the load TFT Qf, and the bipolar transistor Tr, comprises: the step of forming the uppermost layer polycrystal silicon film 31 into the reference power supply line 31A, which is connected with the source region (or $n^+$-type semiconductor region 17) of the drive MOSFET Qd and acts as the upper electrode of the capacity element C, and the emitter electrode 31B which is connected with the emitter region (or $n^+$-type semiconductor region 32) of the bipolar transistor Tr; the step of forming the insulating film 39 to cover the edge of the reference power supply line 31A and the surface of the emitter electrode 31B; and the step of forming the silicide layer 31S over the surface of the reference power supply line 31A in self-alignment with the insulating film 39. As a result, the surface of the emitter electrode 31B is covered with the insulating film 39 so that the silicide layer 31S is not formed over the surface of the emitter electrode 31B. Since the silicide layer 31S is formed by the reaction between the Si of the polycrystal silicon film and the metal atoms of the refractory metal film, the substantial film thickness of the emitter electrode 31B is reduced, if the silicide layer 31S is formed over the surface of the emitter electrode 31B, so that the total emitter depth of the depth of the emitter region and the film thickness of the emitter electrode 31B is shorter than the diffusion length of the positive holes. Since, however, the silicide layer 31S is not formed over the surface of the emitter electrode 31B, as described above, the total emitter depth can be made longer by two times than the diffusion length of the positive holes thereby to retain the current amplification factor of the bipolar transistor Tr.

Moreover, the edges of the reference power supply line 31A are covered with the insulating film 39 so that the silicide layer 31S is not formed at the edges of the reference power supply line 31A. As a result, the dielectric film between the upper electrode and the lower electrode of the capacity element C can be prevented from being contaminated by the silicide layer 31S thereby to enhance the reliability of the capacity element C.

[Embodiment 4]

Figure 50:
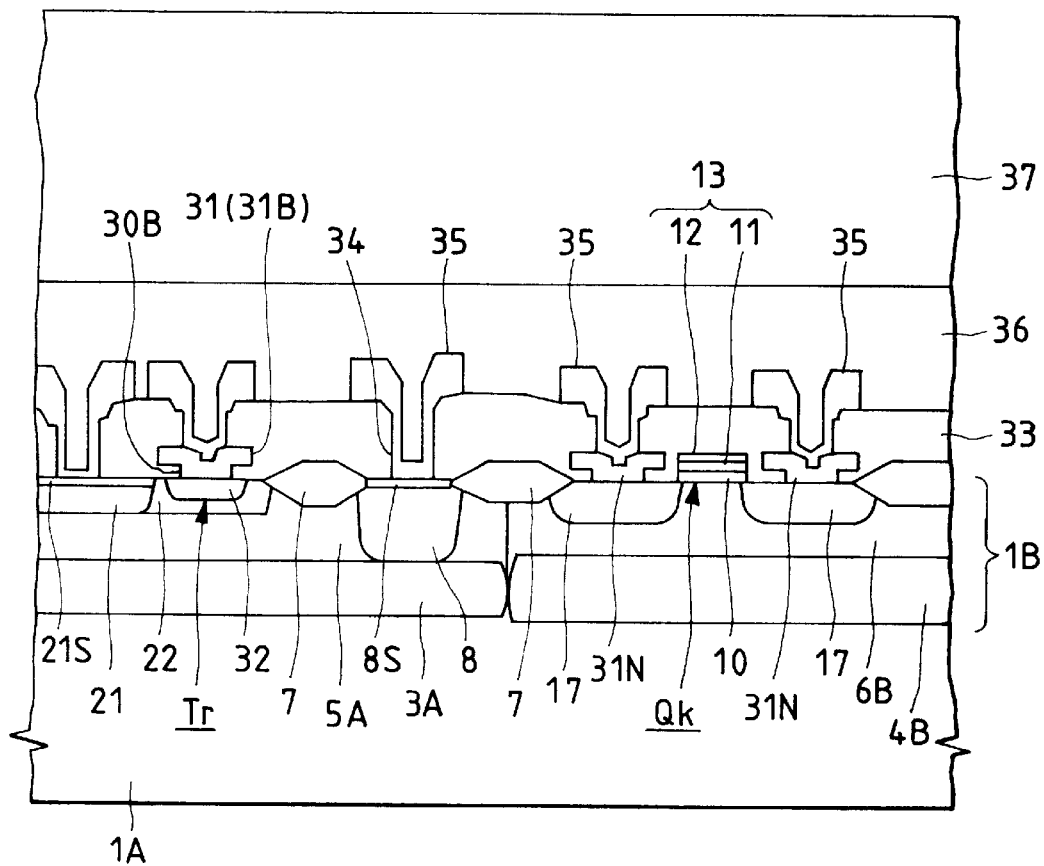
FIG. 50 is a section showing an essential portion of the semiconductor integrated circuit device.
Figure 49:
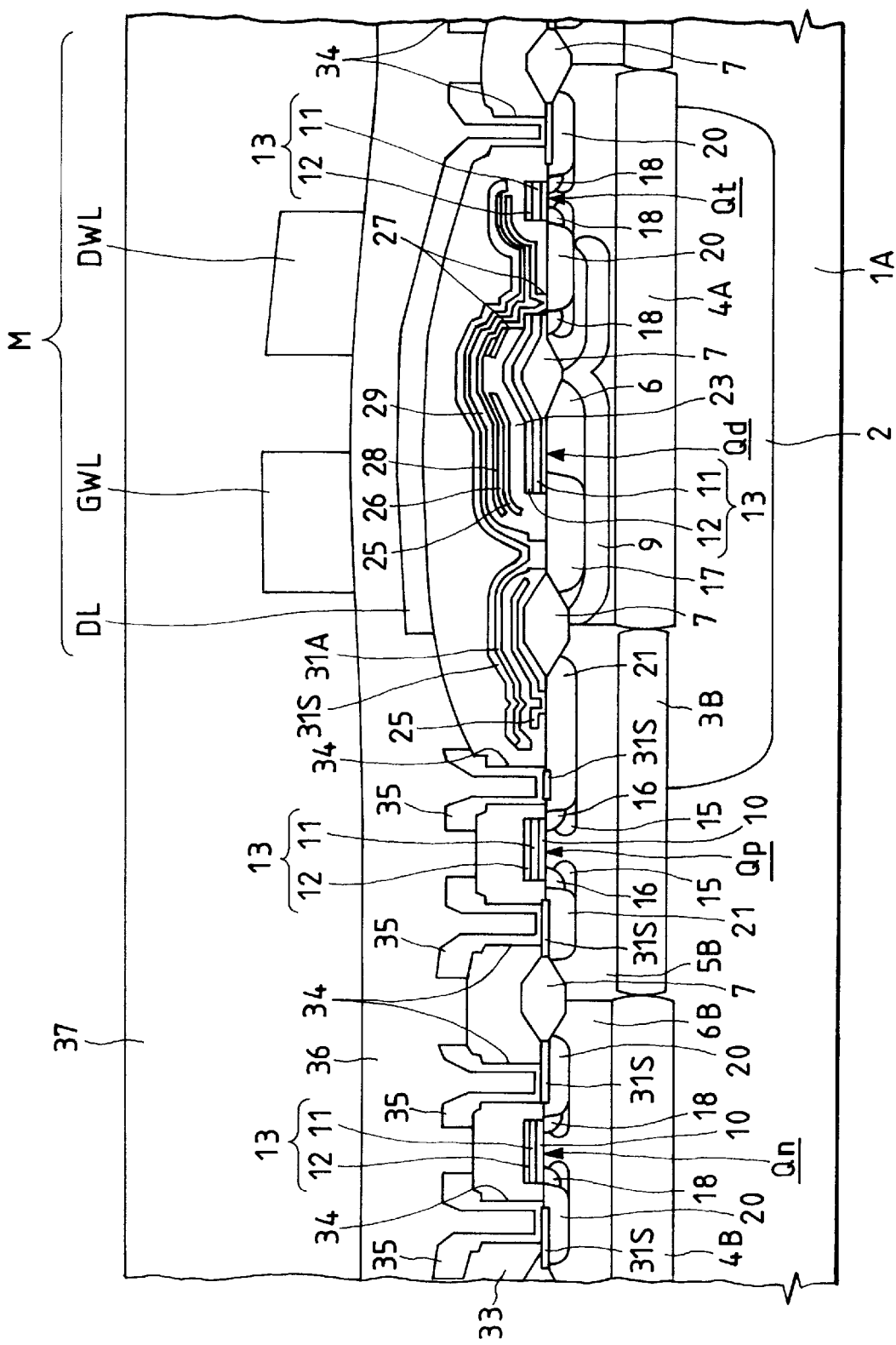
FIG. 49 is a section showing an essential portion showing a semiconductor integrated circuit device according to Embodiment 4 of the present invention.

A schematic construction of the semiconductor integrated circuit device according to Embodiment 4 of the present invention is shown in FIG. 49 (presenting a section of an essential portion) and FIG. 50 (presenting a section of an essential portion). Incidentally, the hatching (or parallel oblique lines) is omitted from the sections of FIGS. 49 and 50 for easy illustrations.

As shown in FIGS. 49 and 50, the semiconductor integrated circuit device of the present embodiment is constructed to have the two-layer metal line structure. The lines 35 and the data line DL are formed of the first layer metal film. On the other hand, the divided word line DWL and the main word line GWL are individually formed of the second layer metal film.

The silicide layer 31S is formed over the surface of the reference power supply line 31A. This silicide layer 31S is also formed over the surfaces of the paired $n^+$-type semiconductor regions 20 for the source region and the drain region of the n-channel MOSFET Qn. The silicide layer 31S is further formed over the surfaces of the paired $p^+$-type semiconductor regions 21 for the source region and the drain region of the p-channel MOSFET Qp. The silicide layer 31S is further formed over the surface of the other $n^+$-type semiconductor region 20 of the transfer MOSFET Qt. The silicide layer 31S is further formed over the surface of the $p^+$-type semiconductor region 21 for the heavily doped base region of the bipolar transistor Tr and over the surface of the $n^+$-type semiconductor region 8 for the collector contact region. Incidentally, the silicide layer 31S is not formed over the surface of the emitter region 31B of the bipolar transistor Tr. Nor is formed the silicide layer 31S over the surfaces of the paired n-type semiconductor regions 17 for the source region and the drain region of the MOSFET Qk of the electrostatic breakdown preventing circuit.

Here will be described a process for manufacturing the aforementioned semiconductor integrated circuit device with reference to FIGS. 51 to 54 (presenting sections of essential portions). Incidentally, the hatching (or parallel oblique lines) is omitted from the sections of FIGS. 51 to 54 for easy illustrations.

First of all, by a manufacture process like that of the foregoing Embodiment 1, the n-channel MOSFET Qn, the p-channel MOSFET Qp, the transfer MOSFET Qt, the drive MOSFET Qd, the reference power supply line 31A, the load TFT Qf, the capacity element C, the bipolar transistor Tr, and the MOSFET Qk of the electrostatic breakdown preventing circuit are formed over the principal face of the $p^-$-type semiconductor region 1A.

Next, the thin insulating film 39 is formed all over the substrate over the aforementioned reference power supply line 31A and over the emitter electrode 31B of the bipolar transistor Tr. The insulating film 39 is formed of a silicon oxide film, for example.

Next, the mask 40 is formed over the emitter electrode 31B of the aforementioned bipolar transistor Tr, over the MOSFET Qk and over the edges of the reference power supply line 31A.

Figure 51:
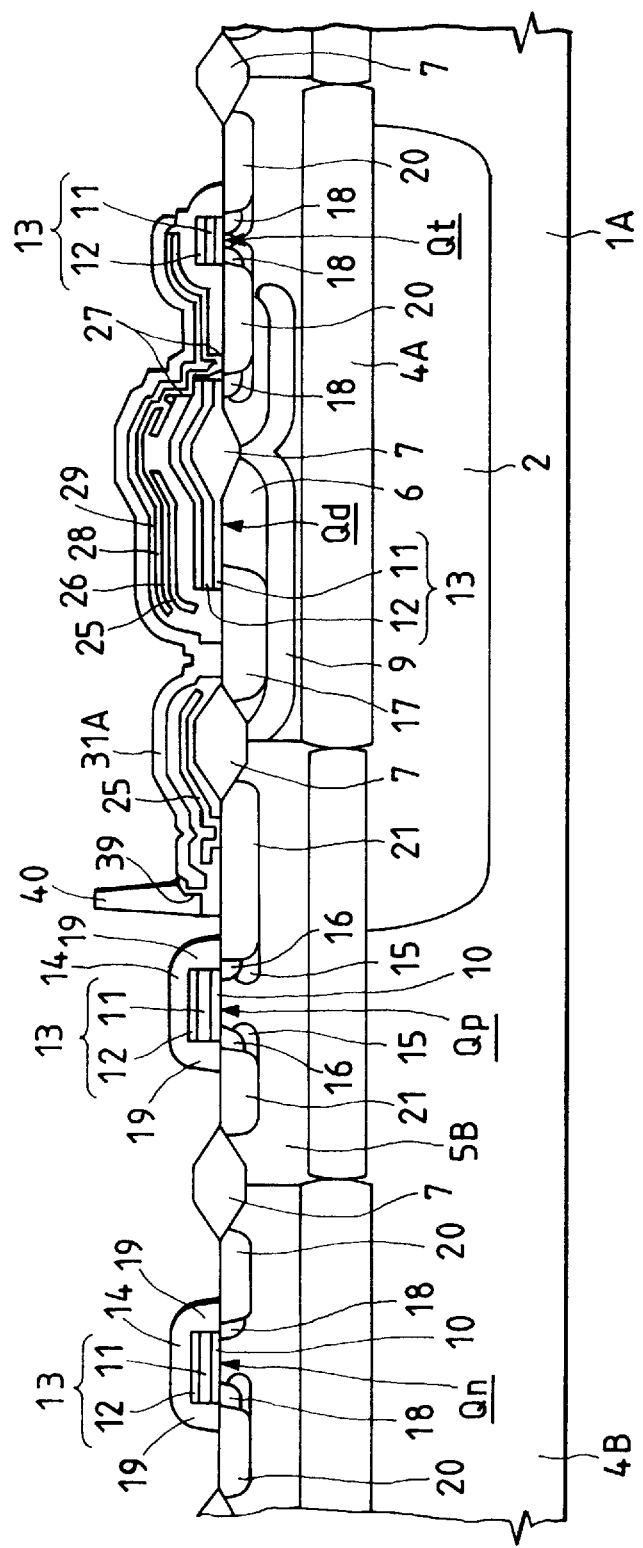
FIG. 51 is a section showing an essential portion for explaining a process for manufacturing the semiconductor integrated circuit device.
Figure 52:
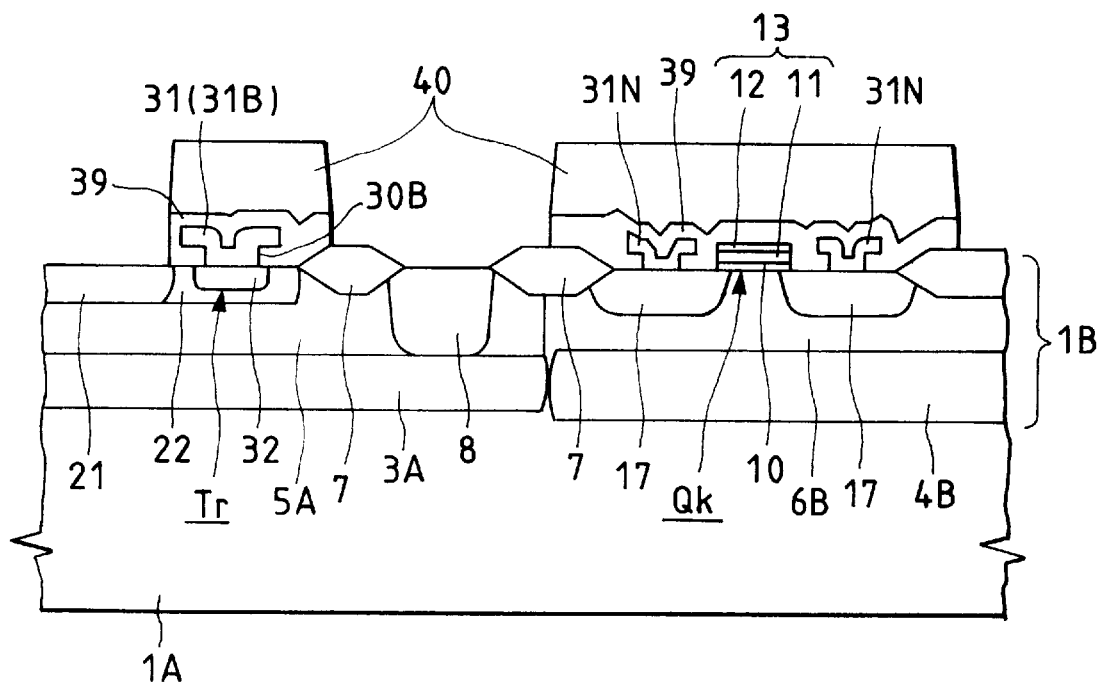
FIG. 52 is a section showing an essential portion for explaining a process for manufacturing the semiconductor integrated circuit device.

Next, the mask 40 is used as the etching mask to pattern and expose the surface of the n$^+$-type semiconductor region 20, the surface of the p$^+$-type semiconductor region 21, the surface of the n$^+$-type semiconductor region 20, the surface of the n$^+$-type semiconductor region 8 and the surface of the reference power supply line 31A. At this step, there is exposed neither the surface of the emitter electrode 31B of the bipolar transistor Tr nor the surfaces of the paired n-type semiconductor regions 17 for the source region and the drain region of the MOSFET Qk of the electrostatic breakdown preventing circuit. The steps up to this one are shown in FIGS. 51 and 52.

Next, the aforementioned mask 40 is removed.

Next, the refractory metal film is formed all over the surface of the substrate, as including the surface of the n$^+$-type semiconductor region 20, the surface of the p$^+$-type semiconductor region 21, the surface of the n$^+$-type semiconductor region 20, the surface of the n$^+$-type semiconductor region 8 and the surface of the reference power supply line 31A.

Next, a low-temperature heat treatment at about 500° to 600 [° C.] is performed in the nitrogen atmosphere to form the silicide layer 31S over the surface of each semiconductor region and the surface of the reference power supply line 31A. At this step, the edges of the reference power supply line 31A are covered with the insulating film 39 so that the silicide layer 31S is not formed at the edges of the reference power supply line 31A. Since, moreover, the surface of the emitter electrode 31B of the bipolar transistor Tr is covered with the insulating film 39, the silicide film 31S is not formed over the surface of the emitter electrode 31B. Since, moreover, the surface of the n-type semiconductor region 17 of the MOSFET Qk is covered with the insulating film 39, the silicide layer 31S is not formed over the surface of the n-type semiconductor region 17 of the MOSFET Qk. In short, the silicide layer 31S is formed in self-alignment with the insulating film 39. By this low-temperature heat treatment in the nitrogen atmosphere, moreover, the refractory metal film over the insulating film 39 is turned into a metal nitride film.

Next, the metal nitride film over the insulating film 39 is selectively removed by the wet etching method, for example.

Figure 54:
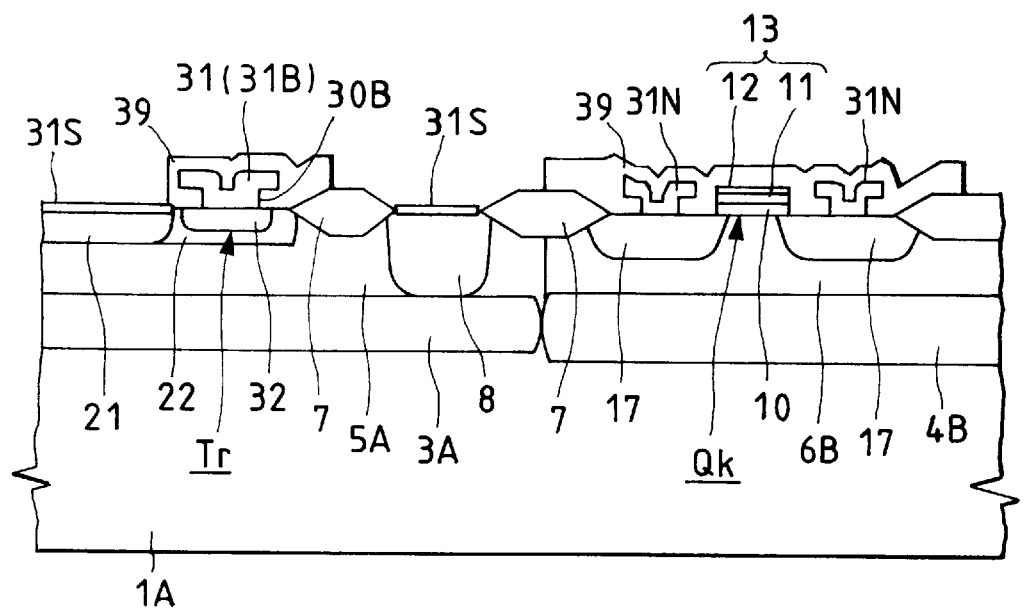
FIG. 54 is a section showing an essential portion for explaining a process for manufacturing the semiconductor integrated circuit device.
Figure 53:
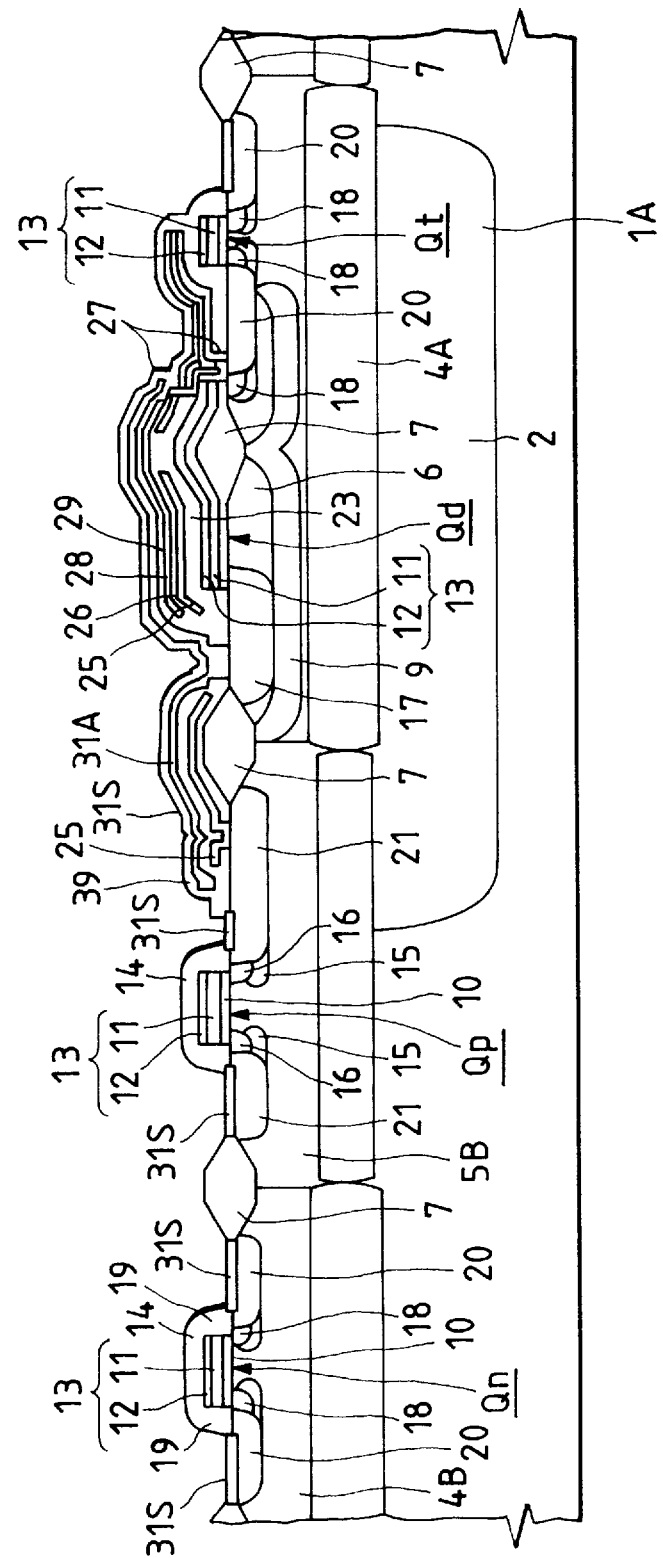
FIG. 53 is a section showing an essential portion for explaining a process for manufacturing the semiconductor integrated circuit device.
Figure 55:
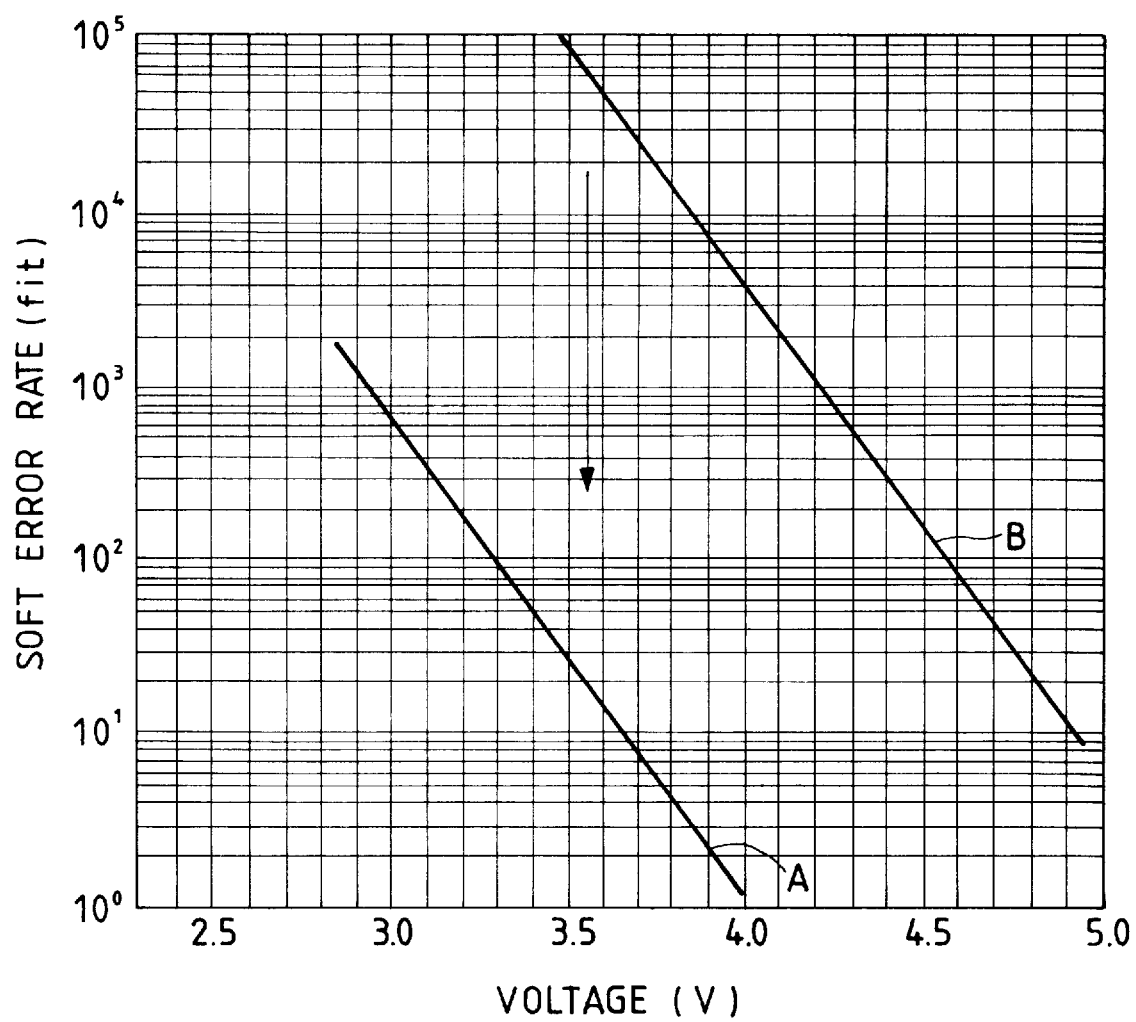
FIG. 55 is a correlation diagram plotting relations between the supply voltage and the soft error rate when the storage capacity of the memory cell to be mounted on the semiconductor integrated circuit device is used as a parameter.

Next, a high-temperature heat treatment at about 900° to 1,000 [° C.] is performed to promote the reaction of the silicide layer 31S thereby to reduce the resistance of the silicide layer 31S. The steps up to this one are shown in FIGS. 53 and 54.

Next, the semiconductor integrated circuit device of the present embodiment, as shown in FIGS. 49 and 50, is substantially completed by forming the inter-layer insulating film 33, the connection holes 34, the lines 35 of the first layer metal film, the data line DL of the first layer metal film, the inter-layer insulating film 36, the divided word line DWL, the main word line GWL and the final passivation film 37.

Thus, effects similar to those of the foregoing Embodiment 3 can be achieved according to the present Embodiment 4.

Moreover, the silicide layer 31S is formed over the surfaces of the paired n$^+$-type semiconductor regions 20 for the source region and the drain region of the n-channel MOSFET Qn, the surfaces of the paired p$^+$-type semiconductor regions 21 for the source region and the drain region of the p-channel MOSFET Qp, the surface of the other n$^+$-type semiconductor region 20 of the transfer MOSFET Qt, the surface of the p$^+$-type semiconductor region 21 for the heavily doped base region of the bipolar transistor Tr, and the surface of the n$^+$-type semiconductor region 8 for the collector contact region, so that the sheet resistances and the contact resistances of the various diffusion layers can be reduced to accelerate the operating speed of the semiconductor integrated circuit device.

Moreover, the surface of the n-type semiconductor region 17 of the MOSFET Qk is covered with the insulating film 39 so that the silicide layer 31S is not formed over that the n-type semiconductor region 17 of the MOSFET Qk. As a result, the resistances of the source region and the drain region of the MOSFET Qk can be prevented from being lowered, to prevent such a damage of the MOSFET Qk as might otherwise be caused by the concentration of the surge current.

Although our invention has been specifically described in connection with the foregoing embodiments, it should not be limited thereto but can naturally be modified in various manners without departing from the gist thereof.

The effects to be obtained by a representative one of the invention, as disclosed herein, will be briefly described in the following.

In the semiconductor integrated circuit device including the memory cell, in which the capacity element is added to the storage node portion of the inverter circuit composed of the drive MOSFET and the load TFT, and the bipolar transistor, it is possible to retain the working margin of the memory cell.

Moreover, it is possible to enhance the performances of the load TFT and the capacity element which are mounted on the semiconductor integrated circuit device.

Still moreover, it is possible to stabilize the writing operation and the reading operation of the memory cell which is mounted on the semiconductor integrated circuit device.

What is claimed is:

1. A semiconductor integrated circuit device comprising:
    a memory cell having an inverter circuit including a drive MISFET and a load TFT; and
    a bipolar transistor,
    wherein a source region of said drive MISFET and an emitter region of said bipolar transistor are formed in a semiconductor substrate, and
    wherein the semiconductor integrated circuit device is formed as a multi-layer structure which includes a plurality of polycrystal silicon films, and a reference power supply line coupled to the source region of said MISFET and an emitter electrode coupled to the emitter region of said bipolar transistor are formed of an uppermost one of said plurality of polycrystal silicon films.

2. A semiconductor integrated circuit device according to claim 1,
    wherein a total emitter depth including the film thickness of said emitter electrode and the depth of said emitter region, as formed in said semiconductor substrate, is no less than 0.2 $\mu$m.

3. A semiconductor integrated circuit device according to claim 1,
    wherein a total emitter depth including the film thickness of said emitter electrode and the depth of said emitter region, as formed in said semiconductor substrate, is no less than substantially two times as large as the diffusion length of minority carriers in said emitter region and said emitter electrode.

4. A semiconductor integrated circuit device according to claim 2 or 3, wherein said plurality of polycrystal silicon films include a first polycrystal silicon film adjacent to the semiconductor substrate and an intermediate polycrystal silicon film between the first and uppermost polycrystal silicon films, and wherein the thickness of the intermediate polycrystal silicon film between said uppermost polycrystal silicon film and the first layer polycrystal silicon film is no more than one half as large as the thickness of said uppermost polycrystal silicon film.

5. A semiconductor integrated circuit device according to claim 4, wherein said intermediate polycrystal silicon film is covered in a memory cell forming region with said uppermost polycrystal silicon film.

6. A semiconductor integrated circuit device according to claim 5, wherein said reference power supply line is backed for each memory cell with a metal line which is formed over said reference power supply line.

7. A semiconductor integrated circuit device according to claim 2 or 3, wherein a silicide layer is formed over the surface of said reference power supply line.

8. A semiconductor integrated circuit device according to claim 7, wherein said silicide layer is formed in self-alignment with an insulating film covering the edges of said reference power supply line.

9. A semiconductor integrated circuit device according to claim 7, wherein a source region of said load TFT is connected with an operating power supply line which is formed of a polycrystal silicon film forming the same layer as that of said source region.

10. A semiconductor integrated circuit device according to claim 1, wherein said reference power supply line has through holes for allowing hydrogen released from a silicon nitride film formed over said reference power supply line to penetrate into a layer underlying said reference power supply line.

11. A semiconductor memory device comprising:

a substrate having a main surface;

a memory cell formed at a first region of said main surface and including a driver MISFET and a load MISFET;

a wiring line coupled to said memory cell; and a bipolar transistor formed at a second region of said main surface and having an emitter region and an emitter electrode, wherein said emitter region is formed in said substrate, wherein said emitter electrode is formed on said main surface and contacts said emitter region, wherein said driver MISFET has a source and a drain region formed in said substrate, and a gate electrode over said main surface, wherein a conductive strip located where a source and a drain region of said load MISFET is formed extends over said driver MISFET, wherein a gate electrode of said load MISFET extends over said driver MISFET, wherein said wiring layer extends over said conductive strip and said gate electrode of said load MISFET, and wherein said wiring layer is comprised of the same level layer as said emitter electrode.

12. A semiconductor memory device according to claim 11, wherein silicide is formed in a portion of said wiring layer.

13. A semiconductor memory device according to claim 11, wherein said wiring layer has a film thickness greater than a film thickness of said conductive film and said gate electrode of said load MISFET.

14. A semiconductor memory device according to claim 13, wherein silicide is formed in a portion of said wiring layer.

15. A semiconductor memory device according to claim 13, wherein said wiring layer covers said gate electrode of said load MISFET and said conductive film in said first region.

16. A semiconductor memory device according to claim 11, wherein said wiring layer covers said gate electrode of said load MISFET and said conductive film in said first region.

17. A semiconductor memory device according to claim 13, wherein total emitter depth including a film thickness of said emitter electrode and a depth of said emitter region is no less than 0.2 $\mu$m.

18. A semiconductor memory device according to claim 17, wherein said driver MISFET is n channel MISFET, wherein said source and drain regions of said load MISFET are of p type conductivity, and wherein said emitter electrode and said emitter region are of n type conductivity.

19. A semiconductor memory device according to claim 11, wherein total emitter depth including a film thickness of said emitter electrode and a depth of said emitter region is no less than 0.2 $\mu$m.

20. A semiconductor memory device according to claim 19, wherein said driver MISFET is an n-channel MISFET, wherein said source and drain regions of said load MISFET are of p type conductivity, and wherein said emitter electrode and said emitter region are of n type conductivity.

21. A semiconductor memory device according to claim 11, wherein said wiring layer is electrically connected to said source region of said driver MISFET and supplies a first potential to said memory cell, wherein said drain region of said driver MISFET is electrically connected to said drain region of said load MISFET, wherein a second potential greater than said first potential is supplied to said source region of said load MISFET, and wherein said gate electrode of said driver MISFET is electrically connected to said gate electrode of said load MISFET.

* * * * *